United States Patent
Kodama et al.

(10) Patent No.: US 7,094,515 B2
(45) Date of Patent: Aug. 22, 2006

(54) STIMULUS SENSITIVE COMPOUND AND STIMULUS SENSITIVE COMPOSITION CONTAINING THE SAME

(75) Inventors: Kunihiko Kodama, Shizuoka (JP); Hyou Takahashi, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 17 days.

(21) Appl. No.: 10/799,864

(22) Filed: Mar. 15, 2004

(65) Prior Publication Data
US 2004/0185378 A1    Sep. 23, 2004

(30) Foreign Application Priority Data
Mar. 13, 2003   (JP) .......................... P.2003-068447

(51) Int. Cl.
  G03C 1/73   (2006.01)
  G03F 7/039  (2006.01)
  G03F 7/038  (2006.01)
  C07D 333/04 (2006.01)
  C07D 327/06 (2006.01)

(52) U.S. Cl. ................... 430/270.1; 430/921; 430/922; 430/905; 430/907; 430/910; 549/14; 549/29; 568/75; 568/77

(58) Field of Classification Search ............. 430/270.1, 430/905, 907, 910, 921, 922; 549/14, 29; 568/75, 77
See application file for complete search history.

(56) References Cited

U.S. PATENT DOCUMENTS 5,837,420 A * 11/1998 Aoai et al. ............... 430/270.1
6,291,130 B1 * 9/2001 Kodama et al. .......... 430/270.1
2003/0194650 A1 * 10/2003 Kanna et al. ............. 430/285.1
2003/0207201 A1 * 11/2003 Hatakeyama et al. .... 430/270.1
2003/0224288 A1 * 12/2003 Kodama .................. 430/270.1
2004/0072097 A1 *  4/2004 Kodama .................. 430/270.1
2004/0185373 A1 *  9/2004 Kodama .................. 430/270.1

FOREIGN PATENT DOCUMENTS

| EP | 1 113 334 A1 | 7/2001 |
| JP | 10-73919 A | 3/1998 |
| JP | 10-133371 A | 5/1998 |
| JP | 2001-187780 A | 7/2001 |
| JP | 2002-116546 A | 4/2002 |

\* cited by examiner

*Primary Examiner*—Sin Lee
(74) *Attorney, Agent, or Firm*—Sughrue Mion, PLLC

(57) ABSTRACT

A stimulus sensitive composition containing a compound capable of generating an acid or a radical on receipt of an external stimulus, the compound being represented by the following formula (I):

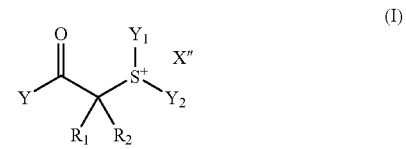

wherein Y represents a group having a bridged cyclic structure; $R_1$ and $R_2$ each independently represent a hydrogen atom, an alkyl group or an aryl group; $R_1$ and $R_2$ may be taken together to form a ring; $Y_1$ and $Y_2$ each independently represent an alkyl group or an aryl group; $Y_1$ and $Y_2$ may be taken together to form a ring; and $X^-$ represents a non-nucleophilic anion.

15 Claims, No Drawings

STIMULUS SENSITIVE COMPOUND AND STIMULUS SENSITIVE COMPOSITION CONTAINING THE SAME

FIELD OF THE INVENTION

This invention relates to a stimulus sensitive compound and a stimulus sensitive composition containing the same useful as an acid curing composition or a radical curing composition that finds applications in the fabrication of semiconductor devices (e.g., ICs) or printed circuit boards for liquid crystal displays or thermal heads, lithographic printing plate imaging, and other photofabrication processes.

BACKGROUND OF THE INVENTION

A stimulus sensitive composition generates an acid or a radical on receipt of an external stimulus, such as active light rays, radiations or heat, and undergoes chemical reaction by the action of the generated acid or radical thereby changing its physical properties in the stimulated area. Preferably, it is a pattern forming material that changes its solubility in a developer between an irradiated or heated area and a non-irradiated or non-heated area to provide a pattern on a substrate.

A variety of acid generators capable of generating an acid when irradiated with active light rays or radiations have been proposed for use in such stimulus sensitive compositions. For example, sulfonium salts having an oxoalkyl group or a cyclic oxoalkyl group are disclosed in JP-A-2002-116546, JP-A-2001-187780, EP 1113334A, JP-A-10-133371, and JP-A-10-73919. The following compounds are among them.

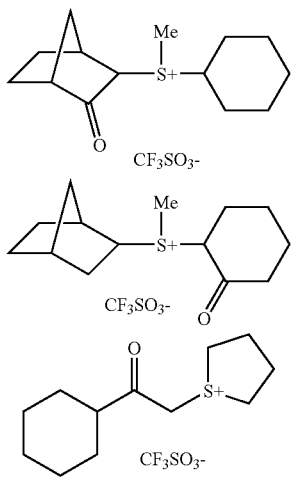

However, these known acid generating compounds are unstable to heat, liable to deterioration with time, or excessively hydrophilic. Pattern formation using resist compositions containing them results in tapered profiles or rounded top profiles.

SUMMARY OF THE INVENTION

An object of the present invention is to provide a stimulus sensitive composition capable of forming a pattern with a satisfactory profile at high sensitivity.

Another object of the invention is to provide a photosensitive composition capable of forming a pattern with a satisfactory profile at high sensitivity at an exposure wavelength of 200 nm or shorter, particularly the emission wavelength of an ArF excimer laser (193 nm) or an $F_2$ excimer laser (157 nm).

Still another object of the invention is to provide a novel compound that generates an acid or a radical on receipt of an external stimulus and therefore provides the stimulus sensitive compositions.

The objects of the present invention are accomplished by a compound represented by formula (I):

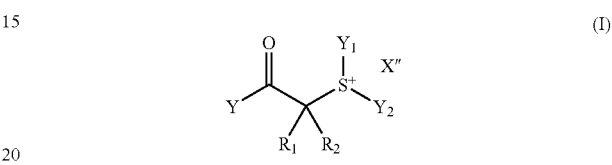

wherein Y represents a group having a bridged cyclic structure, preferably an adamantane structure; $R_1$ and $R_2$ each represent a hydrogen atom, an alkyl group or an aryl group; $R_1$ and $R_2$ may be taken together to form a ring; $Y_1$ and $Y_2$ each represent an alkyl group or an aryl group; $Y_1$ and $Y_2$ may be taken together to form a ring; and $X^-$ represents a non-nucleophilic anion, and a stimulus sensitive composition containing the compound.

The present invention includes in the scope thereof the following embodiments.

(1) The stimulus sensitive composition is a positive stimulus sensitive composition comprising (A) a compound of formula (I) capable of generating an acid on being irradiated with active light rays or a radiation and (B) a resin decomposing by the action of an acid to increase its solubility in an alkaline developer.

(2) The resin (B) has a fluorine atom in the main chain or the side chain thereof.

(3) The resin (B) has a hexafluoro-2-propanol structure.

(4) The resin (B) has a hydroxystyrene structure.

(5) The resin (B) has a monocyclic or polycyclic alicyclic hydrocarbon structure.

(6) The resin (B) of the embodiment (5) further has a repeating unit having a lactone structure.

(7) The positive stimulus sensitive composition further comprises (C) a dissolution inhibitor having a molecular weight of 3000 or less. The dissolution inhibitor decomposes by the action of an acid to increase its solubility in an alkaline developer.

(8) The stimulus sensitive composition is a positive stimulus sensitive composition comprising (A) a compound of formula (I) capable of generating an acid on being irradiated with active light rays or a radiation, (D) a resin soluble in an alkaline developer, and (C) a dissolution inhibitor having a molecular weight of 3000 or less. The dissolution inhibitor decomposes by the action of an acid to increase its solubility in an alkaline developer.

(9) The stimulus sensitive composition is a negative stimulus sensitive composition comprising (A) a compound of formula (I) capable of generating an acid on being irradiated with active light rays or a radiation, (D) a resin soluble in an alkaline developer, and (E) a crosslinking agent capable of crosslinking with the resin (D) by the action of an acid.

(10) The stimulus sensitive composition further contains (F) a basic compound and/or (G) a fluorine-containing surface active agent and/or a silicon-containing surface active agent.
(11) The basic compound (F) is (f1) a compound having a structure selected from an imidazole structure, a diazabicyclo structure, an onium hydroxide structure, an onium carboxylate structure, a trialkylamine structure, an aniline structure, and a pyridine structure, (f2) an alkylamine derivative having a hydroxyl group and/or an ether bond or (f3) an aniline derivative having a hydroxyl group and/or an ether bond.

DETAILED DESCRIPTION OF THE INVENTION

The stimulus sensitive composition according to the present invention contains as component (A) a compound of formula (I) that generates an acid or a radical on receipt of an external stimulus (hereinafter referred to as a compound (A)).

The stimulus sensitive composition of the invention preferably includes a photosensitive composition and a heat sensitive composition, which are either positive or negative.

The positive photosensitive or heat sensitive composition of the invention, which is preferably a positive resist composition, includes a composition comprising (A) a compound (A) capable of generating an acid when irradiated with active light rays or a radiation and (B) a resin that decomposes by the action of an acid to increases its solubility in an alkaline developer (hereinafter, resin (B)) and optionally containing (C) a dissolution inhibitor having a molecular weight ox 3000 or less and decomposing by the action of an acid to increase its solubility in an alkaline developer (hereinafter dissolution inhibitor (C)); and a composition comprising (A) a compound (A), (D) a resin soluble in an alkaline developer, and (C) a dissolution inhibitor (C).

The negative photosensitive or heat sensitive composition of the invention, which is preferably a negative resist composition, comprises (A) a compound (A), (D) a resin soluble in an alkaline developer, and (E) a crosslinking agent that crosslinks with the resin (D) by the action of an acid.

The compound (A) represented by formula (I) generates an acid or a radical on receipt of an external stimulus. The term "external stimulus" as used herein is intended to include active light rays, such as infrared light, visible light, ultraviolet light, far ultraviolet light, X-rays, and electron beams, radiations, heat, and ultrasonic waves.

In formula (I), Y represents a group having a bridged cyclic structure; $R_1$ and $R_2$ each represent a hydrogen atom, an alkyl group or an aryl group; $R_1$ and $R_2$ may be taken together to form a ring; $Y_1$ and $Y_2$ each represent an alkyl group or an aryl group; $Y_1$ and $Y_2$ may be taken together to form a ring; and $X^-$ represents a non-nucleophilic anion.

The bridged cyclic structure in the group represented by Y includes bridged monocyclic, bicyclic, tricylic or tetracyclic structures containing 5 or more carbon atoms, preferably 6 to 30 carbon atoms, still preferably 7 to 25 carbon atoms. The bridged cyclic structure may have a substituent(s). Examples of the bridged cyclic structures are shown below.

(1)

(2)

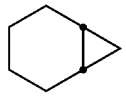
(3)

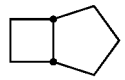
(4)

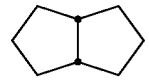
(5)

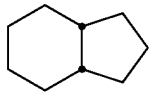
(6)

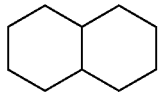
(7)

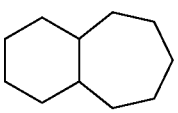
(8)

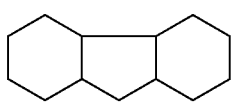
(9)

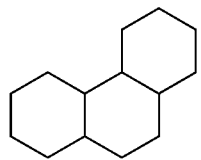
(10)

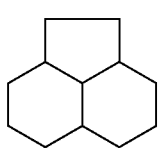
(11)

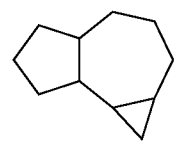
(12)

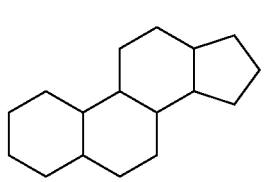
(13)

-continued
(14)
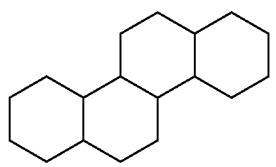
(15)
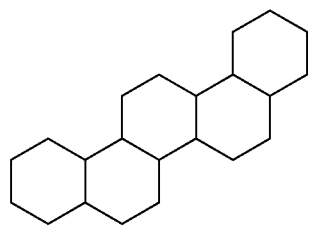
(16)
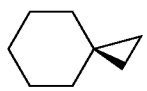
(17)
(18)
(19)
(20)
(21)
(22)
(23)
(24)
(25)
-continued
(26)
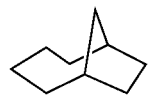
(27)
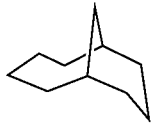
(28)
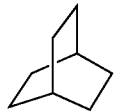
(29)
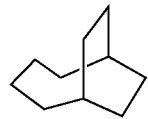
(30)
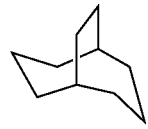
(31)
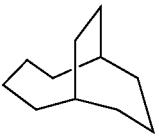
(32)
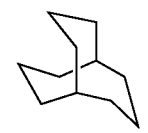
(33)
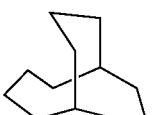
(34)
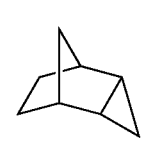
(35)
(36)
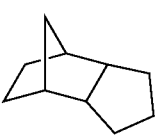
(37)
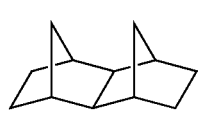

(38) 

(39) 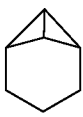

(40) 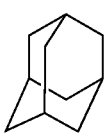

(41) 

(42) 

(43) 

(44) 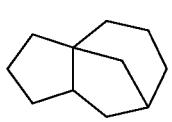

(45) 

(46) 

The bridged cyclic structure may have a hetero atom, an ester bond, an amido bond or a double bond in its ring. The bridged cyclic structure is preferably a bridged cyclic hydrocarbon structure.

The group Y having the bridged cyclic structure includes one having an adamantane structure, such as adamantyl; noradamantyl, decaline residue, tricyclodecanyl, tetracyclododecanyl, norbornyl, and cedrol residue. Preferred of them are one having an adamantane structure (e.g., adamantyl), decaline residue, norbornyl, and cedrol residue. Still preferred are one having an adamantane structure (e.g., adamantyl). A substituted or unsubstituted adamantyl group is particularly preferred.

The substituents the group having a bridged cyclic structure may possess include an alkyl group, a substituted alkyl group, a halogen atom, a hydroxyl group, an alkoxy group, a carboxyl group, and an alkoxycarbonyl group. The alkyl group is preferably a straight-chain or branched one having 1 to 5 carbon atoms, such as methyl, ethyl, propyl, isopropyl, n-butyl, sec-butyl or t-butyl. Still preferred of these alkyl groups are methyl, ethyl, propyl, and isopropyl. The substituents of the substituted alkyl group include a hydroxyl group, a halogen atom, and an alkoxy group. The alkoxy group includes one having 1 to 4 carbon atoms, such as methoxy, ethoxy, propoxy or butoxy.

The alkyl group as $R_1$, $R_2$, $Y_1$, and $Y_2$ may be substituted or unsubstituted and may be straight-chained, branched or cyclic. Examples are those containing 1 to 20 carbon atoms, preferably straight-chain or branched alkyl groups having 1 to 12 carbon atoms (e.g., methyl, ethyl, straight-chain or branched propyl, straight-chain or branched butyl, and straight-chain or branched pentyl) and cycloalkyl groups having 3 to 8 carbon atoms (e.g., cyclopentyl and cyclohexyl). The alkyl group as $R_1$, $R_2$, $Y_1$, and $Y_2$ may have an ether bond.

The aryl group as represented by $R_1$, $R_2$, $Y_1$, and $Y_2$ may be substituted or unsubstituted and preferably includes those having 6 to 14 carbon atoms, such as phenyl, naphthyl, and anthryl. Phenyl or naphthyl is still preferred.

$R_1$ and $R_2$ may be connected to form a ring. $Y_1$ and $Y_2$ may be connected to form a ring together with $S^+$. The group formed by $R_1$ and $R_2$ connected together and the group formed by $Y_1$ and $Y_2$ connected together include alkylene groups containing 2 to 10 carbon atoms, preferably butylene, pentylene, and hexylene, still preferably butylene and pentylene. The ring formed by $R_1$ and $R_2$ connected together and the ring formed by $Y_1$ and $Y_2$ connected together may contain a hetero atom.

The above-mentioned aryl group, alkyl group, and cyclic structure formed by $R_1$ and $R_2$ connected together or by $Y_1$ and $Y_2$ connected together may be substituted or unsubstituted. Where these groups are substituted, the substituents include a nitro group, a halogen atom (e.g., fluorine, chloride, bromine or iodine), a carboxyl group, a hydroxyl group, an amino group, a cyano group, an alkoxy group (preferably containing 1 to 5 carbon atoms), an aryl group (preferably containing 6 to 14 carbon atoms), an alkoxycarbonyl group (preferably containing 2 to 7 carbon atoms), an acyl group (preferably containing 2 to 12 carbon atoms), and an alkoxycarbonyloxy group (preferably containing 2 to 7 carbon atoms). The substituents the aryl group and the cyclic structure may have further include an alkyl group (preferably containing 1 to 20 carbon atoms).

$Y_1$ and $Y_2$ are each preferably an alkyl group having 4 or more carbon atoms, an alkyl group having a hydroxyl group or an alkyl group having an ether bond, still preferably an alkyl group having 6 or more carbon atoms, particularly preferably an alkyl group having 8 or more carbon atoms.

The non-nucleophilic anion represented by $X^-$ includes a sulfonate anion, a carboxylate anion, a sulfonyl imide anion, a bis(alkylsulfonyl)imide anion, and a tris(alkylsulfonyl)methide anion. A non-nucleophilic anion has little ability to induce nucleophilic reaction and is therefore capable of preventing the compound (A) from decomposing with time due to intramolecular nucleophilic reaction. The non-nucleophilic anion thus contributes to storage stability of the stimulus sensitive composition.

The sulfonate anion includes an alkylsulfonate anion, an arylsulfonate anion, and a camphorsulfonate anion. The carboxylate anion includes alkylcarboxylate anions, arylcarboxylate anions, and aralkylcarboxylate anions.

The alkyl moiety of the alkylsulfonate anions is preferably an alkyl group having 1 to 30 carbon atoms, such as methyl, ethyl, propyl, isopropyl n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, cyclopropyl, cyclopentyl, cyclohexyl, adamantyl, norbornyl, or bornyl. The aryl moiety of the arylsulfonate anions is preferably an aryl group having 6 to 14 carbon atoms, such as phenyl, tolyl or naphthyl.

The alkyl or aryl moiety in the alkylsulfonate anions or arylsulfonate anions may have a substituent selected from a nitro group, a halogen atom (e.g., fluorine, chlorine, bromine or iodine), a carboxyl group, a hydroxyl group, an amino group, a cyano group, an alkoxy group (preferably containing 1 to 5 carbon atoms), an aryl group (preferably containing 6 to 14 carbon atoms), an alkoxycarbonyl group (preferably containing 2 to 7 carbon atoms), an acyl group (preferably having 2 to 12 carbon atoms), an alkoxycarbonyloxy group (preferably containing 2 to 7 carbon atoms), etc. The substituent possessed by the aryl group and the cyclic structure further includes an alkyl group (preferably containing 1 to 15 carbon atoms).

Examples of the alkyl moiety of the alkylcarboxylate anions are the same as those recited above for the alkylsulfonate anions. Examples of the aryl moiety of the arylcarboxylate anions are the same as those recited above for the arylsulfonate anions.

The aralkyl moiety of the aralkylcarboxylate anions preferably includes an aralkyl group having 6 to 12 carbon atoms, such as benzyl, phenethyl, naphtylmethyl or naphthylethyl.

The alkyl, aryl or aralkyl moiety in the alkyl-, aryl- or aralkylcarboxylate anions may have a substituent selected from, for example, those recited above with respect to the arylsulfonate anions, such as a halogen atom, an alkyl group, and an alkoxy group, and an alkylthio group.

The sulfonyl imide anion includes a saccharin anion.

The alkyl moiety in the bis(alkylsulfonyl)imide anions and tris(alkylsulfonyl)methide anions is preferably an alkyl group having 1 to 5 carbon atoms, such as methyl, ethyl, propyl, isopropyl, n-butyl, isobutyl, sec-butyl, pentyl or neopentyl. The alkyl group may have a substituent, such as a halogen atom, a halogen-substituted alkyl group, an alkoxy group or an alkylthio group. A fluoroalkyl group is a preferred substituent.

A phosphorus fluoride anion, a boron fluoride anion, an antimony fluoride anion are also included in non-nucleophilic anions.

Preferred non-nucleophilic anions as $X^-$ are alkanesulfonate anions having a fluorine atom at the α-position, arylsulfonate anions substituted with a fluorine atom or a fluorine-containing group, bis(alkylsulfonyl)imide anions having a fluorine atom on the alkyl moiety, and tris(alkylsulfonyl)methide anions having a fluorine atom on the alkyl moiety. Still preferred non-nucleophilic anions are perfluoroalkanesulfonate anions having 4 to 8 carbon atoms and fluorine-substituted benzenesulfonate anions. A nonafluorobutanesulfonate anion, a perfluorooctanesulfonate anion, a pentafluorobenzenesulfonate anion, and a 3,5-bis(trifluoromethyl)benzenesulfonate anion are the most preferred.

The compound (A) is highly transparent to light of 200 nm or shorter wavelengths, especially ArF excimer laser light (193 nm) and $F_2$ excimer laser light (157 nm), and exhibits high photo-acid generation capabilities. A photosensitive composition containing the compound (A) provides a satisfactory pattern profile at high sensitivity and high resolution.

Specific but non-limiting examples of preferred compounds (A) are shown below.

(I-1)

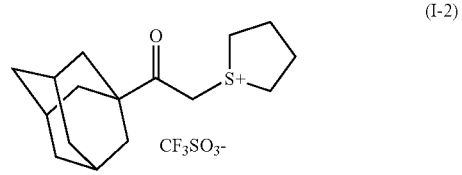
(I-2)

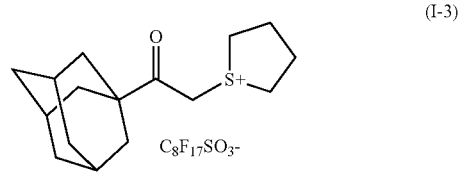
(I-3)

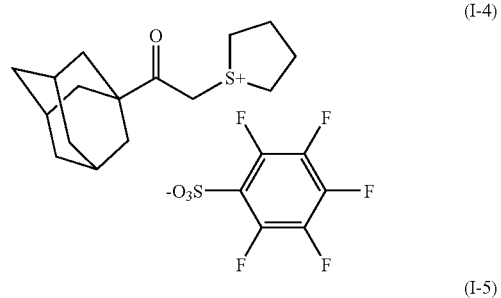
(I-4)

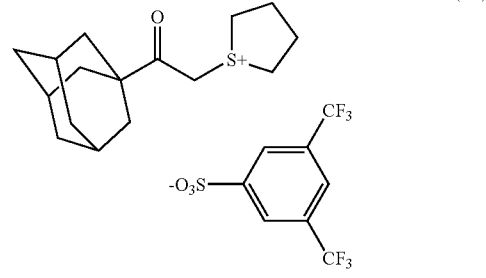
(I-5)

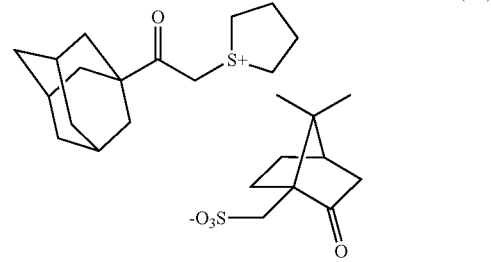
(I-6)

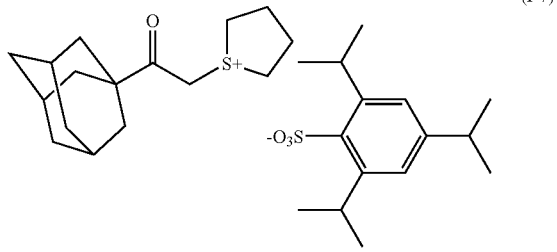
(I-7)

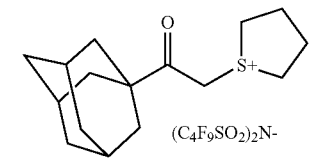
(I-8)
(C4F9SO2)2N-
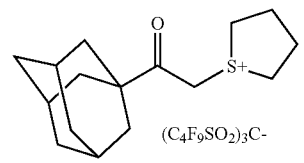
(I-9)
(C4F9SO2)3C-
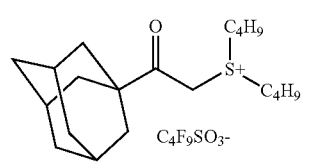
(I-10)
C4F9SO3-
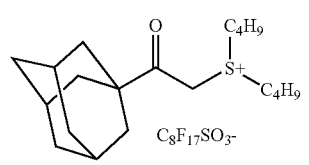
(I-11)
C8F17SO3-
(I-12)
CF3SO3-
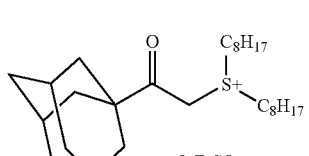
(I-13)
C4F9SO3-
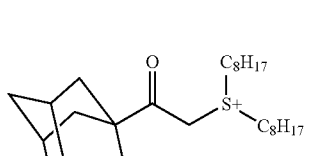
(I-14)
C8F17SO3-
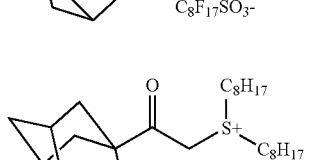
(I-15)
CF3SO3-
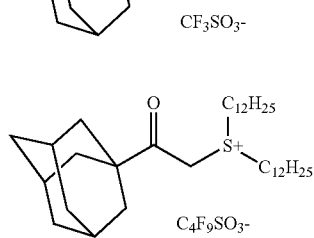
(I-16)
C4F9SO3-
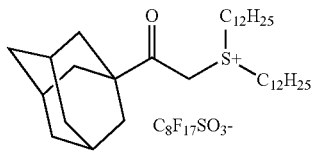
(I-17)
C8F17SO3-
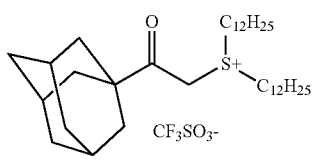
(I-18)
CF3SO3-
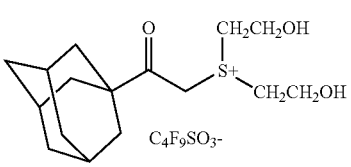
(I-19)
C4F9SO3-
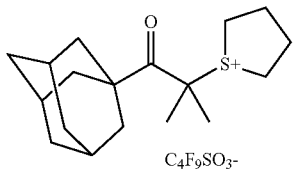
(I-20)
C4F9SO3-
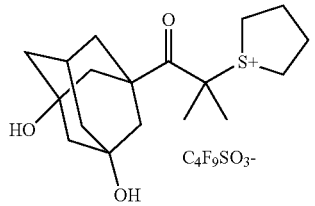
(I-21)
C4F9SO3-
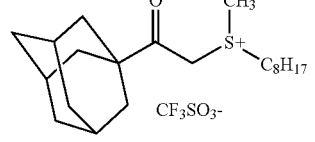
(I-22)
CF3SO3-
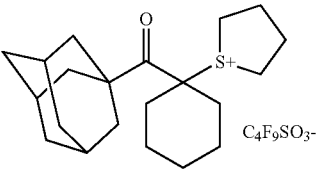
(I-23)
C4F9SO3-
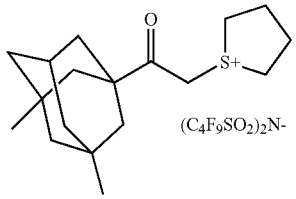
(I-24)
(C4F9SO2)2N-
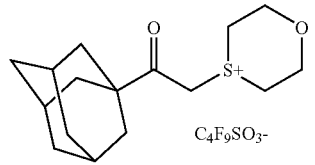
(I-25)
C4F9SO3-

-continued
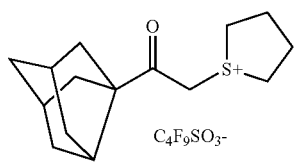
(I-26)
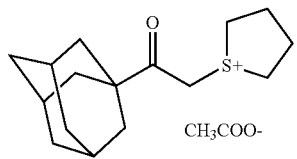
(I-27)
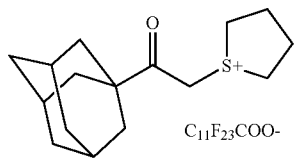
(I-28)
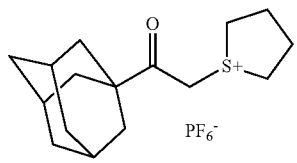
(I-29)
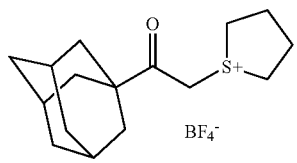
(I-30)
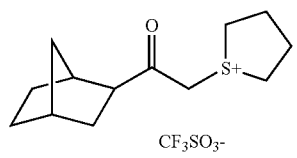
(I-31)
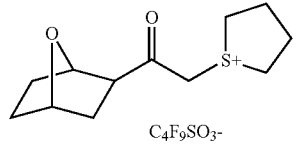
(I-32)
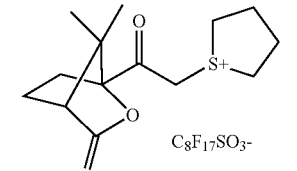
(I-33)
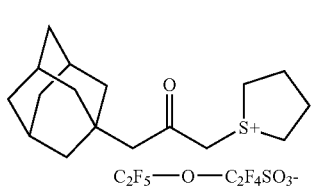
(I-34)
-continued
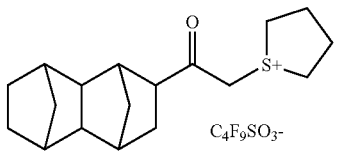
(I-35)
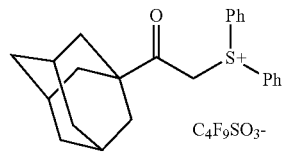
(I-36)
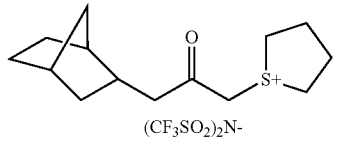
(I-37)
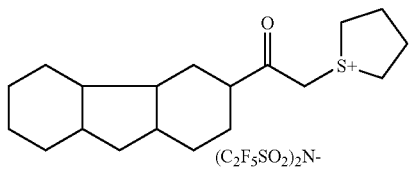
(I-38)
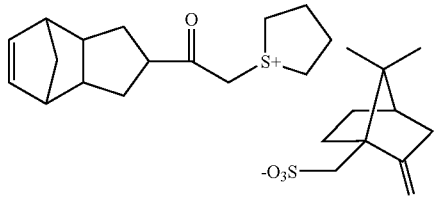
(I-39)
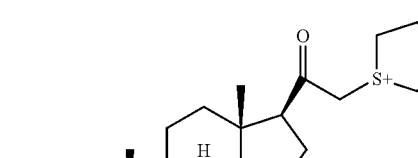
(I-40)
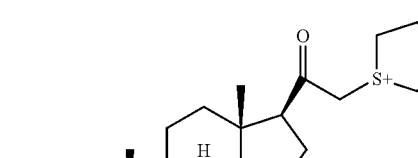
(I-41)
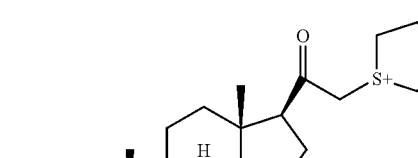
(I-42)

The compounds (A) can be used either individually or as a combination of two or more thereof.

The compound (A) is obtained by reacting a corresponding 2-halogen substituted ketone with a sulfide compound in the presence or absence of a silver catalyst to form a sulfonium salt, which is subjected to salt exchange with a desired anion. Otherwise, the compound (A) is synthesized by reacting a corresponding ketone derivative with a trialkylsilyl halogenide under a basic condition to form a silylenol ether, reacting the silylenol ether with a sulfoxide to form a sulfonium salt, which is subjected to salt exchange with a desired anion.

The stimulus sensitive composition of the invention preferably contains the compound (A) in an amount of 0.1 to 20% by weight, still preferably 1.0 to 15% by weight, particularly preferably 3.0 to 10% by weight, based on the solids content of the composition.

If desired, the compound (A) can be used in combination with photo acid generators capable of generating an acid on exposure to active light rays or a radiation. The molar ratio of the compound (A) to the other photo acid generators) is usually 100/0 to 20/80, preferably 100/0 to 40/60, sill preferably 100/0 to 50/50.

The photo acid generator to be used in combination is appropriately selected from known compounds capable of generating an acid on exposure to active light rays or a radiation, which are used as photo initiators for photocationic polymerization, photo initiators for photo-radical polymerization, photobleaching agents for dyes, photo-discoloring agents, compounds used in microresists, and mixtures thereof. Such photo acid generators include diazonium salts, phosphonium salts, sulfonium salts, iodonium salts, imidosulfonates, oxime sulfonates, diazosulfones, disulfones, and o-nitrobenzyl sulfonates.

Polymers having a group derived from the photo acid generating compound recited above in the main or side chain thereof are also useful. Such polymers are disclosed in U.S. Pat. No. 3,849,137, German Patent 3914407, JP-A-63-26653, JP-A-55-164824, JP-A-62-69263, JP-A-63-146038, JP-A-63-163452, JP-A-62-153853, and JP-A-63-146029. The photo acid generators disclosed in U.S. Pat. No. 3,779, 778 and EP 126,712 are also employable.

Of the photo acid generators that can be used in combination with the compound (A), the compounds represented by formulae (ZI), (ZII), and (ZIII) are preferred.

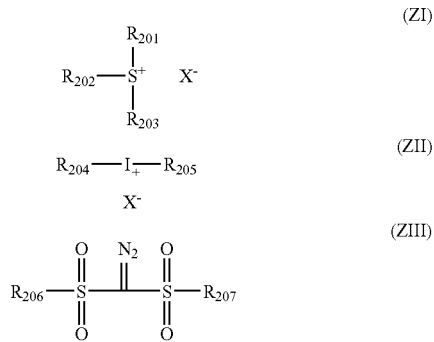

In formula (ZI), $R_{201}$, $R_{202}$, and $R_{203}$ each represent an organic group; $X^-$ represents a non-nucleophilic anion.

The non-nucleophilic anion represented by $X^-$ includes those recited with respect to formula (I).

The organic groups represented by $R_{201}$, $R_{202}$, and $R_{203}$ usually contain 1 to 30 carbon atoms, preferably 1 to 20 carbon atoms. Two out of them maybe taken together to form a cyclic structure, which may contain an oxygen atom, a sulfur atom, an ester linkage, an amide linkage or a carbonyl group. The divalent group formed by two of $R_{201}$, $R_{202}$, and $R_{203}$ includes an alkylene group, e.g., butylene or pentylene.

Specific examples of the organic groups $R_{201}$, $R_{202}$, and $R_{203}$ will be revealed in the description of the compounds (ZI-1), (ZI-2), and (ZI-3) hereinafter given.

The photo acid generators to be used in combination with the compound (A) additionally include those having two or more structures represented by formula (ZI), for example, a compound composed of two structures of formula (ZI) in which at least one of $R_{201}$, $R_{202}$, and $R_{203}$ of one structure is bonded to at least one of $R_{201}$, $R_{202}$, and $R_{205}$ of the other structure.

The compounds of formula (ZI) preferably include the following compounds (ZI-1), compounds (ZI-2), and compounds (ZI-3).

Compounds (ZI-1) are compounds of formula (ZI) wherein at least one of $R_{201}$, $R_{202}$, and $R_{203}$ is an aryl group, that is, compounds having an arylsulfonium cation, namely, arylsulfonium compounds. All of $R_{201}$, $R_{202}$, and $R_{203}$ are an aryl group, or one or two of them are an aryl group with the other(s) being an alkyl group. The arylsulfonium compounds include triarylsulfonium compounds, diarylalkylsulfonium compounds, and aryldialkylsulfonium compounds.

The aryl group of the arylsulfonium compounds is preferably phenyl or naphthyl, still preferably phenyl. Where the arylsulfonium compound has two or three aryl groups, the aryl groups may be the same or different.

The alkyl group the mono- or dialkylarylsulfonium compounds is preferably a straight-chain, branched or cyclic alkyl group having 1 to 15 carbon atoms, such as methyl, ethyl, propyl, n-butyl, sec-butyl, t-butyl, cyclopropyl, cyclobutyl or cyclohexyl.

The aryl group and the alkyl group as $R_{201}$, $R_{202}$, and $R_{203}$ may be substituted with an alkyl group having, e.g., 1 to 15 carbon atoms, an aryl group having, e.g., 6 to 14 carbon atoms, an alkoxy group having, e.g., 1 to 15 carbon atoms, a halogen atom, a hydroxyl group or a phenylthio group. Preferred substituents are a straight-chain, branched or cyclic alkyl group having 1 to 12 carbon atoms and a straight-chain, branched or cyclic alkoxy group having 1 to 12 carbon atoms. Still preferred substituents are an alkyl group having 1 to 4 carbon atoms and an alkoxy group having 1 to 4 carbon atoms. The substituent may be present on any one of, or all of, $R_{201}$, $R_{202}$, and $R_{203}$. Where $R_{201}$, $R_{202}$ and $R_{203}$ are all an aryl group, the substituent is preferably at the p-position of the aryl group.

Compounds (ZI-2) are compounds of formula (ZI) wherein $R_{201}$, $R_{202}$ and $R_{203}$ each represent an organic group having no aromatic ring. The term "aromatic ring" as used herein is intended to include heterocyclic aromatic ring. The organic group having no aromatic ring usually contains 1 to 30 carbon atoms, preferably 1 to 20 carbon atoms. Preferred examples of the organic group having no aromatic ring are an alkyl group, a 2-oxoalkyl group, an alkoxycarbonylmethyl group, an allyl group, and a vinyl group. Still preferred are a straight-chain, branched or cyclic 2-oxoalkyl group and an alkoxycarbonylmethyl group. A straight-chain or branched 2-oxoalkyl group is particularly preferred.

The alkyl group as $R_{201}$, $R_{202}$ or $R_{203}$ may be straight-chain, branched or cyclic and preferably includes a straight-chain or branched alkyl group having 1 to 10 carbon atoms (e.g., methyl, ethyl, propyl, butyl or pentyl) and a cycloalkyl group having 3 to 10 carbon atoms (e.g., cyclopentyl, cyclohexyl or norbornyl).

The 2-oxoalkyl group as $R_{201}$, $R_{202}$ or $R_{203}$ may be straight-chain, branched or cyclic and preferably includes the above-enumerated alkyl groups having a group =C=O at the 2-position.

The alkoxycarbonylmethyl group as $R_{201}$, $R_{202}$ or $R_{203}$ includes the one having an alkoxy group containing 1 to 5 carbon atoms, e.g., methoxy, ethoxy, propoxy, butoxy or pentyloxy.

The organic group having no aromatic ring may be substituted with a halogen atom, an alkoxy group having, e.g., 1 to 5 carbon atoms, a hydroxyl group, a cyano group or a nitro group.

Two out of $R_{201}$, $R_{202}$, and $R_{203}$ may be taken together to form a cyclic structure, which may contain an oxygen atom, a sulfur atom, an ester linkage, an amide linkage or a carbonyl group. The divalent group formed by two of $R_{201}$, $R_{202}$, and $R_{203}$ includes an alkylene group, e.g., butylene or pentylene.

Compounds (ZI-3) are compounds having a phenacylsulfonium salts represented by formula (ZI-3):

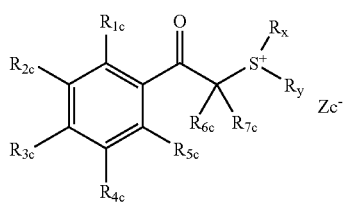

(ZI-3)

wherein $R_{1c}$, $R_{2c}$, $R_{3c}$, $R_{4c}$, and $R_{5c}$ each represent a hydrogen atom, an alkyl group, an alkoxy group or a halogen atom; two or more out of $R_{1c}$, $R_{2c}$, $R_{3c}$, $R_{4c}$, and $R_{5c}$ may be taken together to form a cyclic structure which may contain an oxygen atom, a sulfur atom, an ester linkage, an amide linkage or a carbonyl group; $R_{6c}$ and $R_{7c}$ each represent a hydrogen atom or an alkyl group; $R_x$ and $R_y$ each represent an alkyl group, a 2-oxoalkyl group, an alkoxycarbonylmethyl group, an allyl group or a vinyl group; $R_x$ and $R_y$ may be taken together to form a cyclic structure which may contain an oxygen atom, a sulfur atom, an ester linkage, an amide linkage or a carbonyl group; and $Z_c^-$ represents a non-nucleophilic anion, which includes those recited with reference to formula (I).

The alkyl group as $R_{1c}$ to $R_{5c}$ may be straight-chain, branched or cyclic, including an alkyl group having 1 to 20 carbon atoms, preferably a straight-chain or branched alkyl group having 1 to 12 carbon atoms (e.g., methyl, ethyl, straight-chain or branched propyl, straight-chain or branched butyl or straight-chain or branched pentyl) and a cycloalkyl group having 3 to 8 carbon atoms (e.g., cyclopentyl or cyclohexyl).

The alkoxy group as $R_{1c}$ to $R_{5c}$ may be straight-chain, branched or cyclic, including an alkoxy group having 1 to 10 carbon atoms, preferably a straight-chain or branched alkoxy group having 1 to 5 carbon atoms (e.g., methoxy, ethoxy, straight-chain or branched propoxy, straight-chain or branched butoxy or straight-chain or branched pentyloxy) and a cycloalkoxy group having 3 to 8 carbon atoms (e.g., cyclopentyloxy or cyclohexyloxy).

It is preferred that at least one of $R_{1c}$ to $R_{5c}$ be a straight-chain, branched or cyclic alkyl group or a straight-chain, branched or cyclic alkoxy group. It is still preferred that the total carbon atom number of $R_{1c}$ to $R_{5c}$ be from 2 to 15. In this case, the compound (ZI-3) has improved solvent solubility and is prevented from particle formation during storage.

The alkyl group as $R_x$ and $R_y$ includes those recited above as for $R_{1c}$ to $R_{5c}$.

The 2-oxoalkyl group as $R_x$ and $R_y$ includes the alkyl groups as $R_{1c}$ to $R_{5c}$ having a group =C=O at the 2-position thereof.

The alkoxycarbonylmethyl group as $R_x$ and $R_y$ includes those having the alkoxy group recited above as for $R_{1c}$ to $R_{5c}$.

The group formed by $R_x$ and $R_y$ taken together includes butylene and pentylene.

$R_x$ and $R_y$ each preferably represent an alkyl group having 4 or more carbon atoms, particularly 6 or more carbon atoms, especially 8 or more carbon atoms.

In formulae (ZII) and (ZIII), $R_{204}$, $R_{205}$, $R_{206}$, and $R_{207}$ each represent a substituted or unsubstituted aryl group or a substituted or unsubstituted alkyl group; and $X^-$ represents a non-nucleophilic anion.

The aryl group as $R_{204}$ to $R_{207}$ is preferably phenyl or naphthyl, still preferably phenyl.

The alkyl group as $R_{204}$ to $R_{207}$ is may be straight-chain, branched or cyclic and preferably includes a straight or branched alkyl group having 1 to 10 carbon atoms (e.g., methyl, ethyl, propyl, butyl or pentyl) and a cycloalkyl group having 3 to 10 carbon atoms (e.g., cyclopentyl, cyclohexyl or norbornyl). The substituent of the substituted aryl or alkyl group includes an alkyl group having, e.g., 1 to 15 carbon atoms, an aryl having, e.g., 6 to 15 carbon atoms, an alkoxy group having, e.g., 1 to 15 carbon atoms, a halogen atom, a hydroxyl group, and a phenylthio group.

The non-nucleophilic group $X^-$ includes those enumerated above with respect to formula (I).

Of the photo acid generators that can be used in combination with the compound (A), the compounds represented by formulae (ZIV), (ZV), and (ZVI) shown below are also preferred.

$$Ar_3—SO_2—SO_2—Ar_4 \quad (ZIV)$$

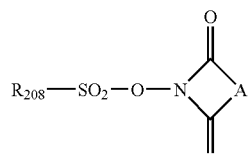

(ZV)

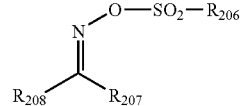

(ZVI)

wherein $Ar_3$ and $Ar_4$ each represent a substituted or unsubstituted aryl group; $R_{206}$, $R_{207}$, and $R_{208}$ each represent a substituted or unsubstituted alkyl group or a substituted or unsubstituted aryl group; A represents a substituted or unsubstituted alkylene group, a substituted or unsubstituted alkenylene group or a substituted or unsubstituted arylene group.

Of the above-described photo acid generators for combined use with the compound (A) still preferred are those represented by formulae (ZI), (ZII), and (ZIII). Particularly preferred photo acid generators for combined use are shown below.

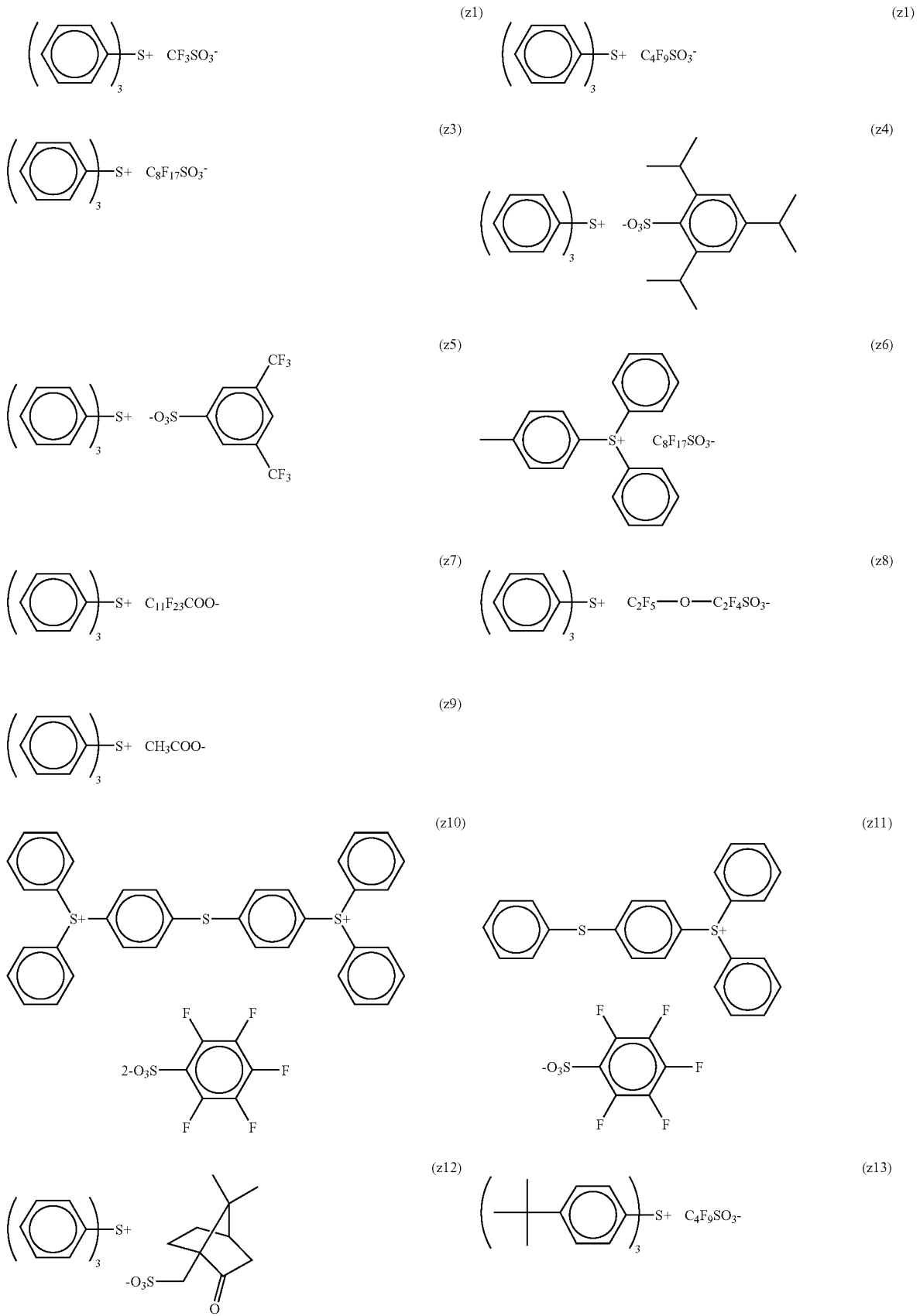

-continued
(z14) 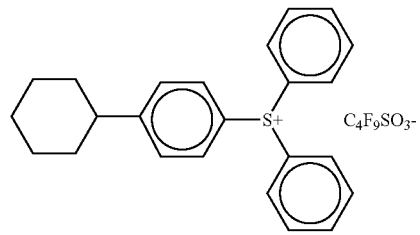
(z15) 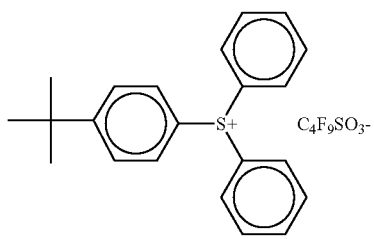
(z16) 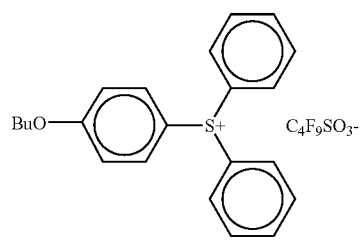
(z17) 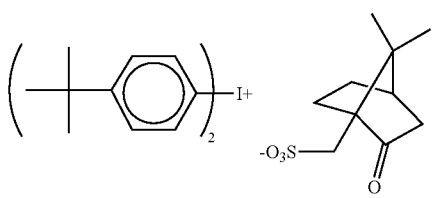
(z18) 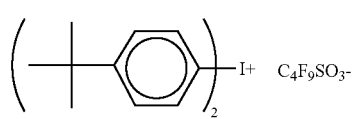
(z19) 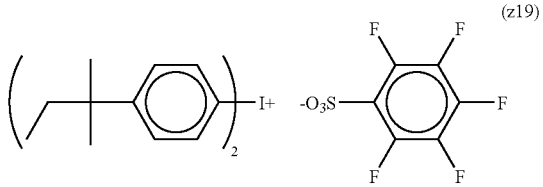
(z20) 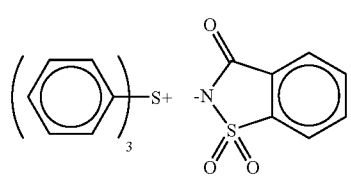
(z21) 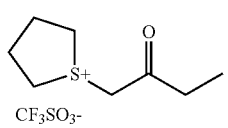
(z22) 
(z23) 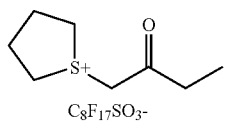
(z24) 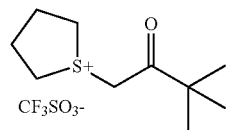
(z25) 
(z26) 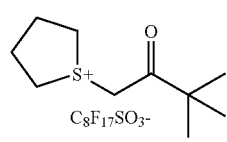
(z27) 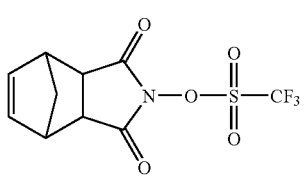
(z28) 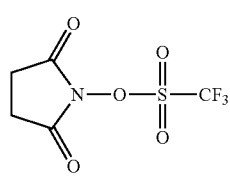
(z29) 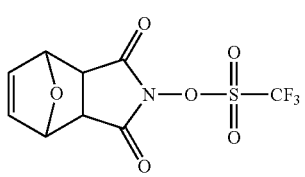
(z30) 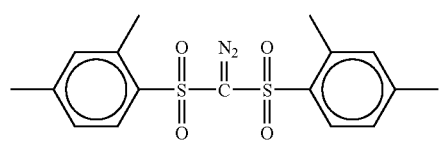
(z31) 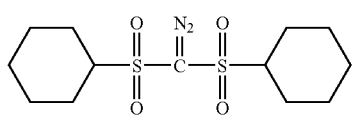

-continued
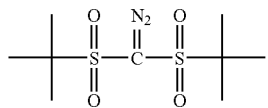 (z32)
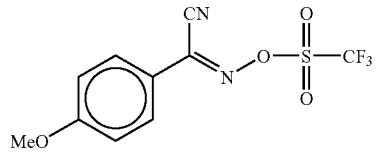 (z33)
 (z34)
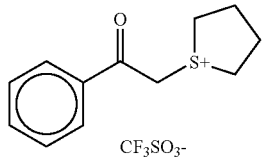 (z35)
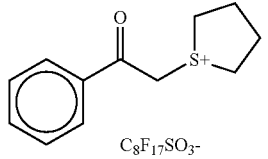 (z36)
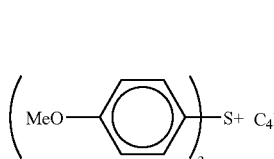 (z37)
 (z38)
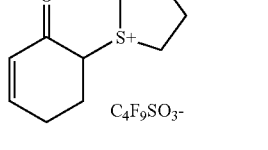 (z39)
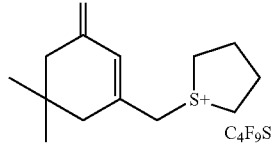 (z40)
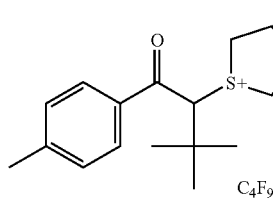 (z41)

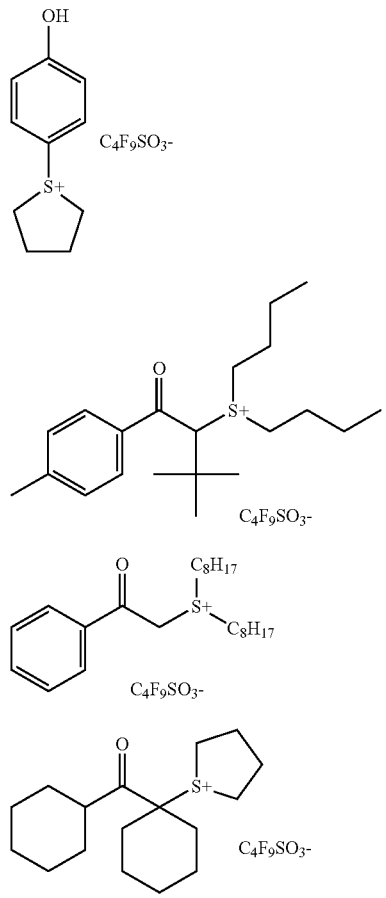

The positive stimulus sensitive composition of the present invention contains as component (B) a resin (B) that decomposes by the action of an acid to have increased solubility in an alkaline developer. The resin (B) is the one having a group decomposable by an acid (hereinafter referred to as an acid decomposable group) in the main chain and/or the side chain thereof. The resin (B) is preferably the one having an acid decomposable group in the side chain thereof.

The acid decomposable group preferably includes a carboxyl group with its hydrogen atom displaced with a group releasable by an acid (hereinafter, acid releasable group) and a hydroxyl group with its hydrogen atom displaced with an acid releasable group. Preferred acid decomposable groups include a silyl ether group, a cumyl ester group, an acetal group, a tetrahydropyranyl ether group, an enol ether group, an enol ester group, a tertiary alkyl ether group, a tertiary alkyl ester group, and a tertiary alkyl carbonate group. Still preferred acid decomposable groups are a tertiary alkyl ester group, a tertiary alkyl carbonate group, a cumyl ester group, an acetal group, and a tetrahydropyranyl ether group.

The base polymer to which the acid decomposable groups are attached as a side chain is an alkali soluble resin having a hydroxyl group or a carboxyl group in the side chain. The alkali soluble resin preferably has an alkali dissolution rate of 170 A (angstrom)/sec or higher, particularly 330 A/sec or higher, measured in 0.26 N tetramethylammonium hydroxide (TMAH) at 23° C. From this viewpoint, particularly preferred alkali soluble resins include those having a hydroxystyrene unit, such as homo- or copolymers of o-, m-or p-hydroxystyrene, hydrogenated poly(hydroxystyrene), halogen- or alkyl-substituted poly(hydroxystyrene), partially O-alkylated or O-acylated poly(hydroxystyrene), styrene-hydroxystyrene copolymers, α-methylstyrene-hydroxystyrene copolymers, and hydrogenated novolak resins.

Preferred repeating units having an acid decomposable group of the alkali soluble resin include those derived from t-butoxycarbonyloxystyrene, 1-alkoxyethoxystyrenes, and tertiary alkyl (meth)acrylates.

The resin (B) can be prepared by reacting the alkali soluble resin with a precursor of an acid decomposable group or copolymerizing a monomer having an acid decomposable group and providing an alkali soluble resin with various comonomers as taught in EP 254853, JP-A-2000-25850, JP-A-2001-223860, and JP-A-2002-251259.

Specific examples of the resin (B) are listed below for illustrative purposes only but not for limitation.
1) p-t-Butoxystyrene/p-hydroxystyrene copolymer,
2) p-(t-Butoxycarbonyloxy)styrene/p-hydroxystyrene copolymer,
3) p-(t-Butoxycarbonylmethyloxy)styrene/p-hydrozystyrene copolymer,
4) 4-(t-Butoxycarbonylmethyloxy)-3-methylstyrene/4-hydroxy-3-methylstyrene copolymer,
5) p-(t-Butoxycarbonylmethyloxy)styrene/p-hydroxystyrene (10% hydrogenated) copolymer,
6) m-(t-Butoxycarbonylmethyloxy)styrene/m-hydroxystyrene copolymer, 7) o-(t-Butoxycarbonylmethyloxy)styrene/o-hydroxystyrene copolymer,
8) p-(Cumyloxycarbonylmethyloxy) styrene/p-hydroxystyrene copolymer,
9) Cumyl methacrylate/methyl methacrylate copolymer,
10) 4-t-Butoxycarbonylstyrene/dimethyl maleate copolymer,
11) Benzyl methacrylate/tetrahydropyranyl methacrylate copolymer,
12) p-(t-Butoxycarbonylmethyloxy)styrene/p-hydroxystyrene/styrene copolymer,
13) p-t-Butoxystyrene/p-hydroxystyrene/fumaronitrile copolymer,
14) t-Butoxystyrene/hydroxyethyl methacrylate copolymer,
15) Styrene/N-(4-hydroxyphenyl)maleimide/N-(4-t-butoxycarbonyloxyphenyl)maleimide copolymer,
16) p-Hydroxystyrene/t-butyl methacrylate copolymer,
17) Styrene/p-hydroxystyrene/t-butyl methacrylate copolymer,
18) p-Hydroxystyrene/t-butyl acrylate copolymer,
19) Styrene/p-hydroxystyrene/t-butyl acrylate copolymer,
20) p-(t-Butoxycarbonylmethyloxy)styrene/p-hydroxystyrene/N-methylmaleimide copolymer,
21) t-Butyl methacrylate/1-adamantylmethyl methacrylate copolymer,
22) p-Hydroxystyrene/t-butyl acrylate/p-acetoxystyrene copolymer,
23) p-Hydroxystyrene/t-butyl acrylate/p-(t-butoxycarbonyloxy)styrene copolymer,
24) p-Hydroxystyrene/t-butyl acrylate/p-(t-butoxycarbonylmethyloxy)styrene copolymer, (R-1)
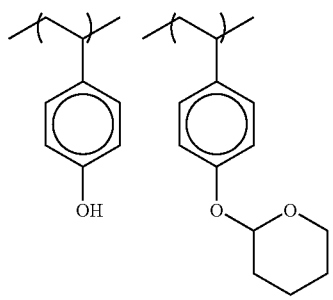

(R-2)
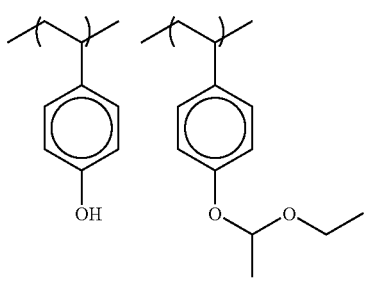

(R-3)
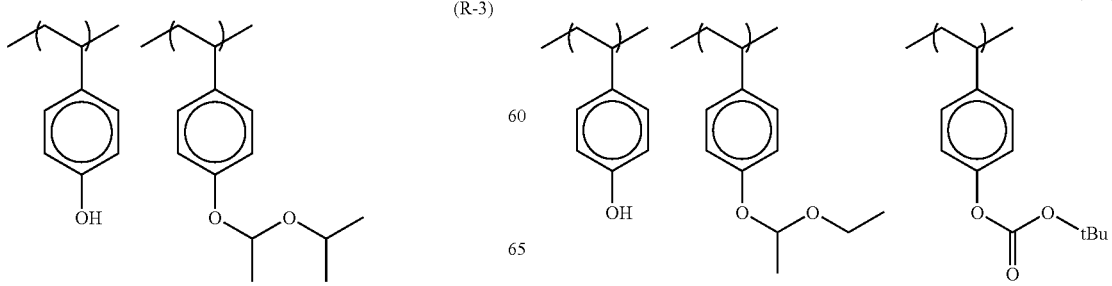

-continued (R-4)
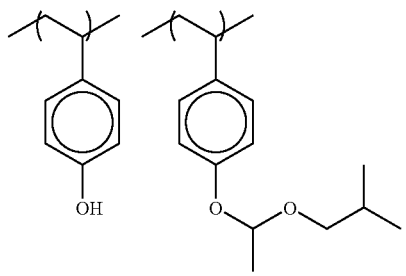

(R-5)
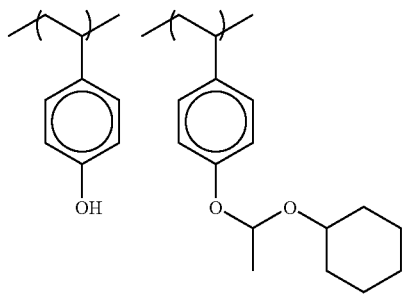

(R-6)
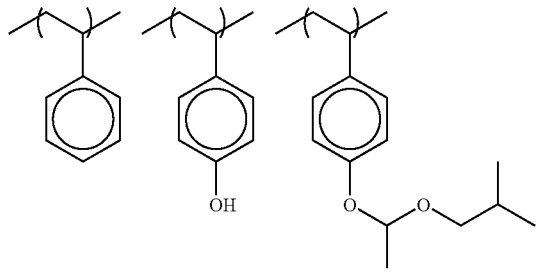

(R-7)

(R-8)

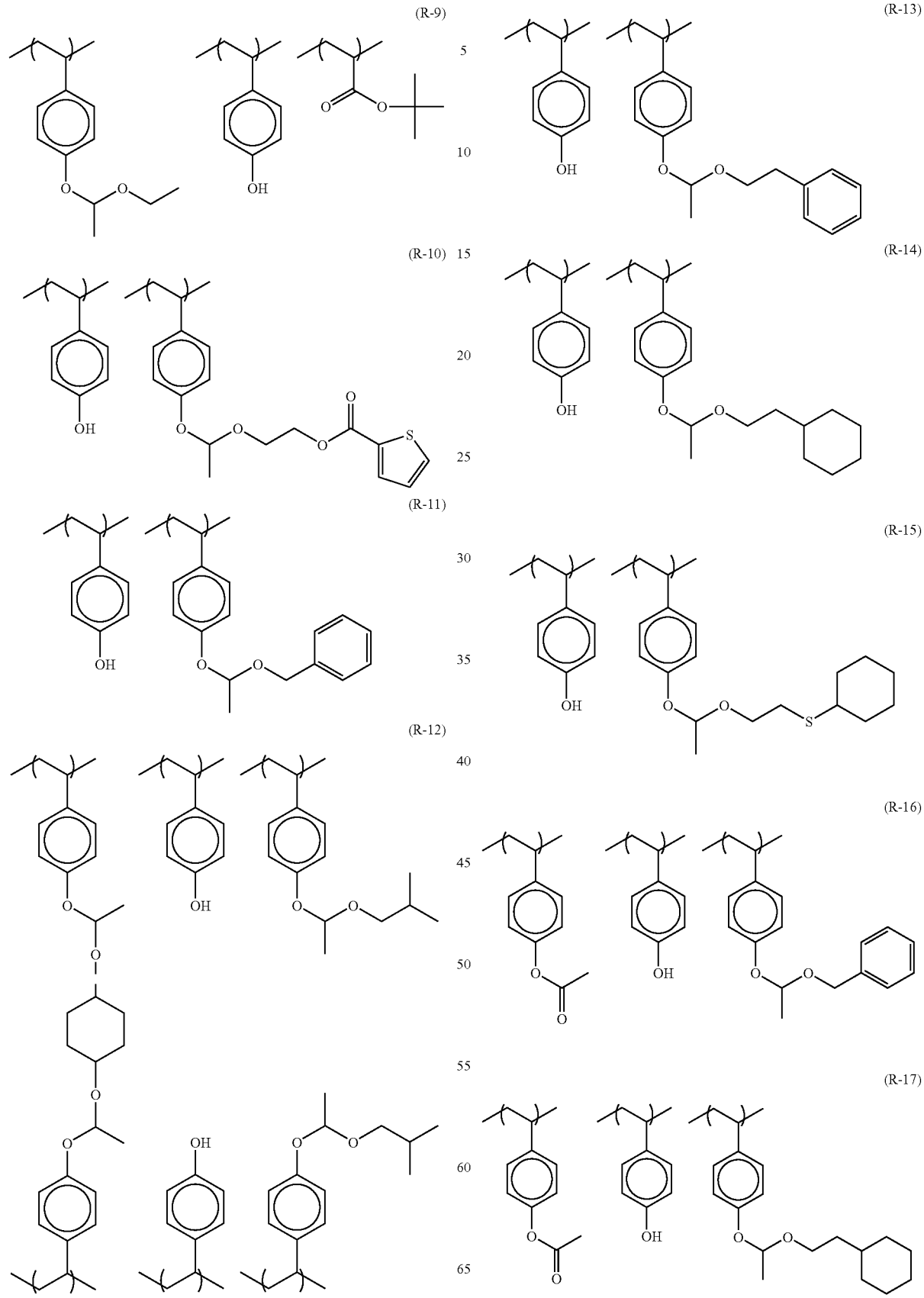

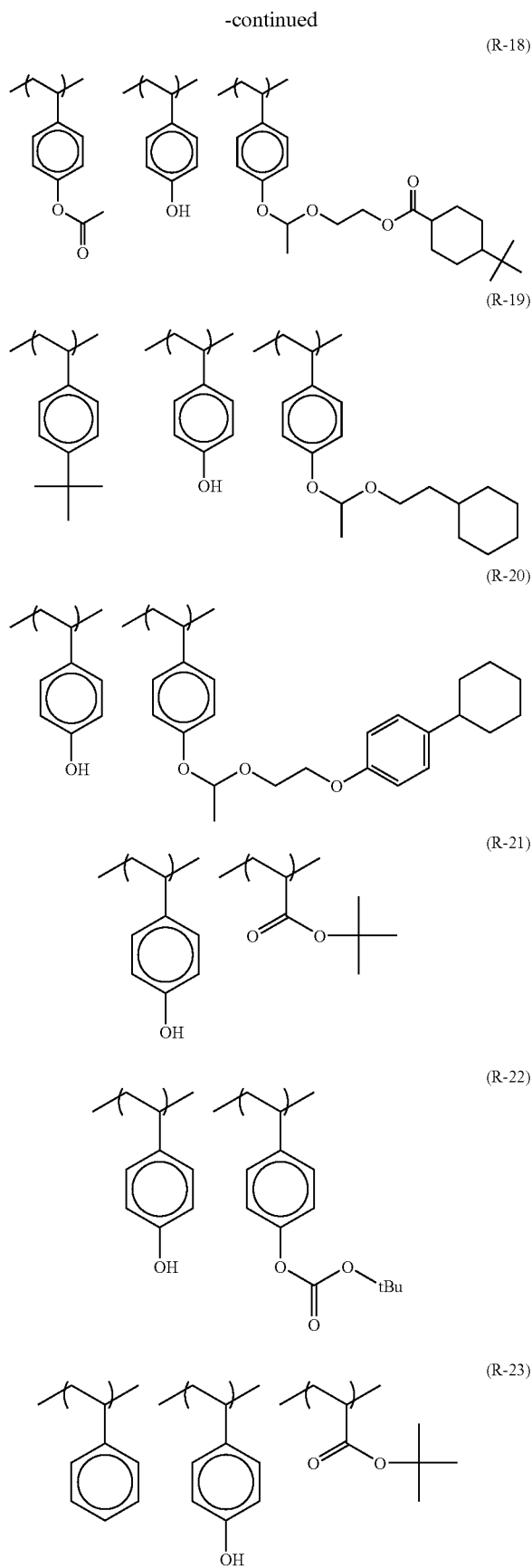
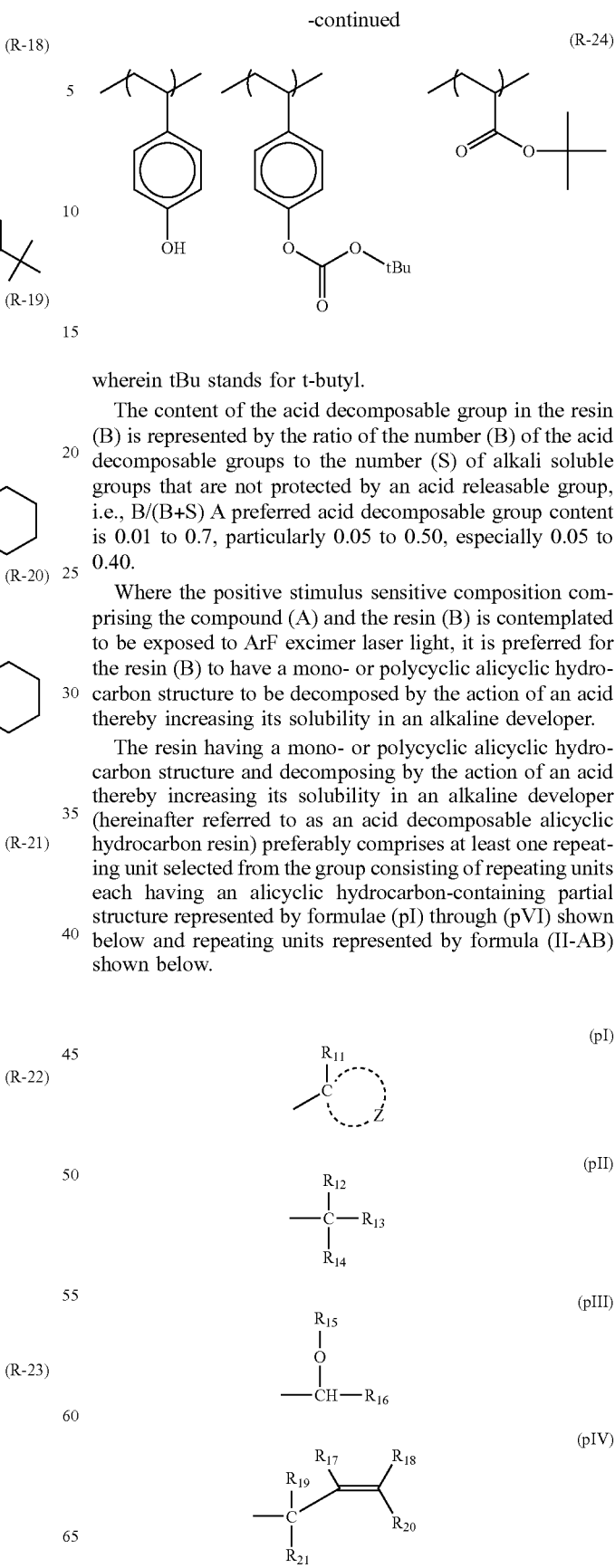

wherein tBu stands for t-butyl.

The content of the acid decomposable group in the resin (B) is represented by the ratio of the number (B) of the acid decomposable groups to the number (S) of alkali soluble groups that are not protected by an acid releasable group, i.e., B/(B+S) A preferred acid decomposable group content is 0.01 to 0.7, particularly 0.05 to 0.50, especially 0.05 to 0.40.

Where the positive stimulus sensitive composition comprising the compound (A) and the resin (B) is contemplated to be exposed to ArF excimer laser light, it is preferred for the resin (B) to have a mono- or polycyclic alicyclic hydrocarbon structure to be decomposed by the action of an acid thereby increasing its solubility in an alkaline developer.

The resin having a mono- or polycyclic alicyclic hydrocarbon structure and decomposing by the action of an acid thereby increasing its solubility in an alkaline developer (hereinafter referred to as an acid decomposable alicyclic hydrocarbon resin) preferably comprises at least one repeating unit selected from the group consisting of repeating units each having an alicyclic hydrocarbon-containing partial structure represented by formulae (pI) through (pVI) shown below and repeating units represented by formula (II-AB) shown below.

-continued

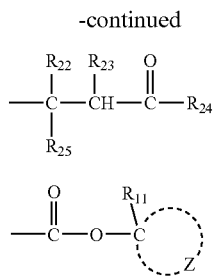

(pV)

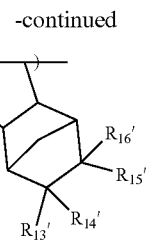

(II-B)

(pVI)

wherein $R_{13}'$, $R_{14}'$, $R_{15}'$, and $R_{16}'$ each represent a hydrogen atom, a halogen atom, a cyano group, a carboxyl group, —$COOR_5$, an acid decomposable group, —C(=O)—X-A'-$R_{17}'$, a substituted or unsubstituted alkyl group or a substituted or unsubstituted cyclic hydrocarbon group; $R_5$ represents a substituted or unsubstituted alkyl group, a substituted or unsubstituted cyclic hydrocarbon group or a group —Y shown below; X represents an oxygen atom, a sulfur atom, —NH—, —$NHSO_2$— or —$NHSO_2NH$—; A' represents a single bond or a divalent linking group; at least two of $R_{13}'$ to $R_{16}'$ may be taken together to form a ring; n represents 0 or 1; $R_{17}'$ represents a carboxyl group, —$COOR_5$, a cyano group, a hydroxyl group, a substituted or unsubstituted alkoxy group, —CO—NH—$R_6$, —CO—NH—$SO_2$—$R_6$ or a group —Y shown below; $R_6$ represents a substituted or unsubstituted alkyl group or a substituted or unsubstituted cyclic hydrocarbon group; and the group —Y has one of formulae:

In formulae (pI) and (pVI), $R_{11}$ represents a methyl group, an ethyl group, an n-propyl group, an isopropyl group, an n-butyl group, an isobutyl group or a sec-butyl group; and Z represents an atomic group necessary for forming an alicyclic hydrocarbon group together with the carbon atom.

In formulae (pII) and (pIII), $R_{12}$, $R_{13}$, $R_{14}$, $R_{15}$, and $R_{16}$ each represent a straight-chain or branched alkyl group having 1 to 4 carbon atoms or an alicyclic hydrocarbon group, provided that at least one of $R_{12}$, $R_{13}$, and $R_{14}$ and at least one of $R_{15}$ and $R_{16}$ represent an alicyclic hydrocarbon group.

In formula (pIV), $R_{17}$, $R_{18}$, $R_{19}$, $R_{20}$, and $R_{21}$ each represent a hydrogen atom, a straight-chain or branched alkyl group having 1 to 4 carbon atoms or an alicyclic hydrocarbon group, provided that at least one of then is an alicyclic hydrocarbon group and that at least one of $R_{19}$ and $R_{21}$ is a straight-chain or branched alkyl group having 1 to 4 carbon atoms or an alicyclic hydrocarbon group.

In formula (pV), $R_{22}$, $R_{23}$, $R_{24}$, and $R_{25}$ each represent a hydrogen atom, a straight-chain or branched alkyl group having 1 to 4 carbon atoms or an alicyclic hydrocarbon group, provided that at least one of them is an alicyclic hydrocarbon group; and $R_{23}$ and $R_{24}$ may be taken together to form a ring.

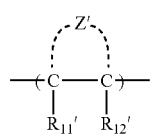

(II-AB)

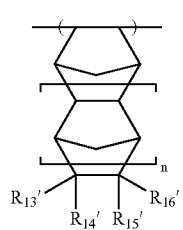

wherein $R_{21}'$, $R_{22}'$, $R_{23}'$, $R_{24}'$, $R_{25}'$, $R_{26}'$, $R_{27}'$, $R_{28}'$, $R_{29}'$, and $R_{30}'$ each represent a hydrogen atom or a substituted or unsubstituted alkyl group; and a and b each represent 1 or 2.

In formulae (pI) through (pVI), the alkyl group represented by $R_{12}$ to $R_{25}$ is substituted or unsubstituted and straight-chain or branched alkyl group having 1 to 4 carbon atoms, including methyl, ethyl, n-propyl, isopropyl, n-butyl, isobutyl, sec-butyl, and t-butyl. The substituent of the substituted alkyl group includes an alkoxy group having 1 to 4 carbon atoms, a halogen atom (e.g., fluorine, chlorine, bromine or iodine), an acyl group, an acyloxy group, a cyano group, a hydroxyl group, a carboxyl group, an alkoxycarbonyl group, and a nitro group.

wherein $R_{11}'$ and $R_{12}'$ each represent a hydrogen atom, a cyano group, a halogen atom or a substituted or unsubstituted alkyl group; and Z' represents an atomic group necessary for forming a substituted or unsubstituted alicyclic structure together with the two carbon atoms to which it is bonded.

The repeating unit of formula (II-AB) preferably includes a repeating unit represented by formula (II-A) or (II-B).

(II-A)

The alicyclic hydrocarbon group represented by $R_{12}$ to $R_{25}$ and the alicyclic hydrocarbon group completed by Z and the adjacent two carbon atoms include mono- or polycyclic hydrocarbon groups having 5 or more carbon atoms, including monocyclic, bicyclic, tricyclic or tetracyclic structures. These alicyclic hydrocarbon groups preferably contain 6 to 30 carbon atoms, still preferably 7 to 25 carbon atoms. The alicyclic hydrocarbon groups may have a substituent(s).

Examples of preferred alicyclic hydrocarbon groups are adamantyl, noradamantyl, decaline residue, tricyclodecanyl, tetracyclododecanyl, norbornyl, cedrol residue, cyclohexyl, cycloheptyl, cyclooctyl, cyclodecanyl, and cyclododecanyl.

Still preferred are adamantyl, decaline residue, norbornyl, cedrol residue, cyclohexyl, cycloheptyl, cyclooctyl, cyclodecanyl, and cyclododecanyl.

The substituents of the alicyclic hydrocarbon groups include a substituted or unsubstituted alkyl group, a halogen atom, a hydroxyl group, an alkoxy group, a carboxyl group, and an alkoxycarbonyl group. The alkyl group is preferably a lower alkyl group, such as methyl, ethyl, propyl, isopropyl or butyl, still preferably methyl, ethyl, propyl or isopropyl. The substituent of the substituted alkyl group includes a hydroxyl group, a halogen atom, and an alkoxy group. The alkoxy group includes lower alkoxy groups having 1 to 4 carbon atoms, such as methoxy, ethoxy, propoxy and butoxy.

The structures represented by formulae (pI) through (pVI) can be used to protect alkali soluble groups. The alkali soluble groups are known per se in the art, including a carboxyl group, a sulfo group, a phenyl group, and a thiol group, preferably a carboxyl group and a sulfo group. The alkali soluble group protected with the structure of formulae (pI) to (pVI) includes structures having a carboxyl group of which the hydrogen atom is displaced with the structures of formulae (pI) to (pVI).

Repeating units having an alkali soluble group protected with the structure of formulae (pI) through (pVI) are preferably those represented by formula (pA):

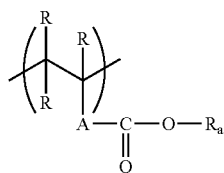

(pA)

wherein a plurality of Rs, which may be the same or different, each represent a hydrogen atom, a halogen atom or a substituted or unsubstituted and straight-chain or branched alkyl group having 1 to 4 carbon atoms; A represents a single bond or a divalent linking group selected from an alkylene group, a substituted alkylene group, an ether group, a thioether group, a carbonyl group, an ester group, an amido group, a sulfonamido group, a urethane group, a urea group and a combination thereof; and $R_6$ represents any one of the groups represented by formulae (pI) through (pVI).

The repeating unit of formula (pA) is preferably one derived from a 2-alkyl-2-adamantyl (meth)acrylate or a dialkyl(1-adamantyl)methyl (meth)acrylate.

Specific examples of the repeating unit of formula (pA) are shown below. In the following formulae, Rx is H, $CH_3$ or $CF_3$.

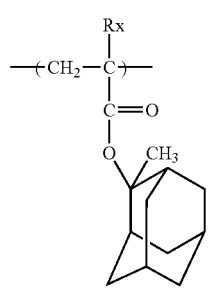

1

-continued

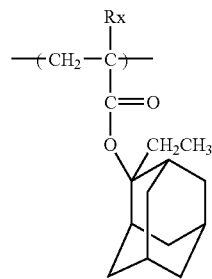

2

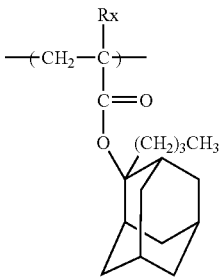

3

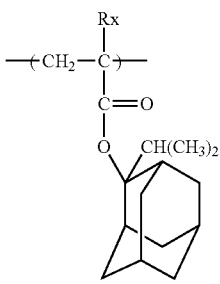

4

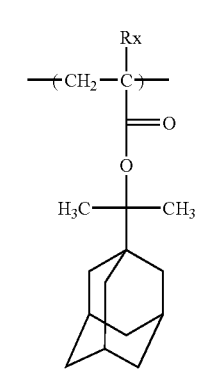

5

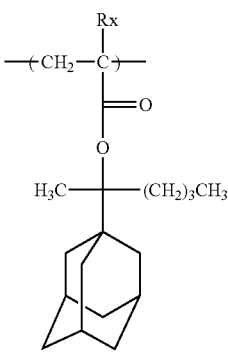

6

-continued
7
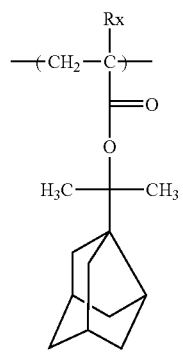
8
9
10
11
12
-continued
13
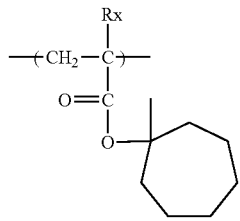
14
15
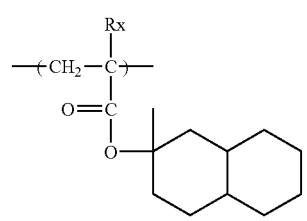
16
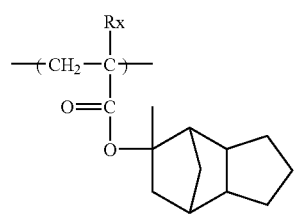
17
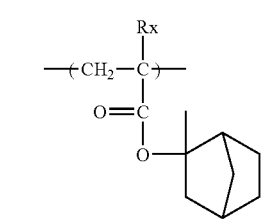
18
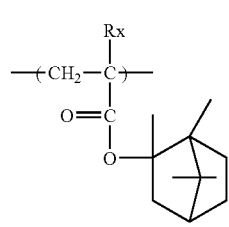

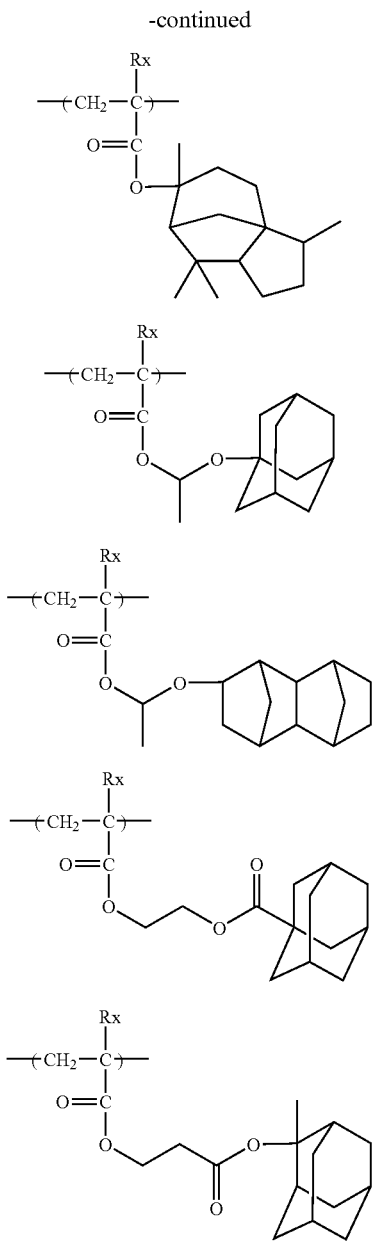

In formula (II-B), $R_{11}'$ and $R_{12}'$ each represent a hydrogen atom, a cyano group, a halogen atom or a substituted or unsubstituted alkyl group; and Z' represents an atomic group necessary for forming a substituted or unsubstituted alicyclic structure together with the two carbon atoms to which it is bonded.

The halogen atom as represented by $R_{11}'$ or $R_{12}'$ includes chlorine, bromine, fluorine, and iodine.

The alkyl group as represented by $R_{11}'$, $R_{12}'$, and $R_{21}'$ to $R_{30}'$ is preferably a straight-chain or branched alkyl group having 1 to 10 carbon atoms, still preferably a straight-chain or branched alkyl group having 1 to 6 carbon atoms, particularly preferably methyl, ethyl, propyl, isopropyl, n-butyl, isobutyl, sec-butyl or t-butyl.

The substituent of the substituted alkyl group includes a hydroxyl group, a halogen atom, a carboxyl group, an alkoxy group, an acyl group, a cyano group, and an acyloxy group. The halogen atom includes chlorine, bromine, fluorine, and iodine. The alkoxy group includes those having 1 to 4 carbon atoms, e.g., methoxy, ethoxy, propoxy, and butoxy. The acyl group includes formyl and acetyl. The acyloxy group includes acetoxy.

The atomic group Z' for completing an alicyclic structure serves to form a substituted or unsubstituted alicyclic hydrocarbon repeating unit in the resin and is preferably an atomic group necessary to form a bridged alicyclic structure that serves to provide a bridged alicyclic hydrocarbon repeating unit in the resin. The alicyclic hydrocarbon skeleton completed by Z' includes those formed by Z in formula (pI) or recited as $R_{12}$ to $R_{25}$ in formulae (pII) to (pVI). The alicyclic hydrocarbon skeleton may have a substituent(s) selected from, for example, $R_{13}'$, $R_{14}'$, $R_{15}'$, and $R_{16}'$ in formulae (II-A) and (II-B).

Of the repeating units having the bridged alicyclic hydrocarbon structure, preferred are those represented by formula (II-A) or (II-B).

In the acid-decomposable alicyclic hydrocarbon resins, the acid decomposable group can be present in the moiety $C(=O)$—$X$-$A'$-$R_{17}'$ or as a substituent of Z' of formula (II-AB).

The acid decomposable group is represented by formula:

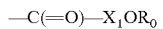

wherein $X_1$ has the same meaning as X; and $R_0$ represents a tertiary alkyl group (e.g., t-butyl or t-amyl), an isobornyl group, a 1-alkoxyethyl group (e.g., 1-ethoxyethyl, 1-butoxyethyl, 1-isobutoxyethyl or 1-cyclohexyloxyethyl), an alkoxymethyl group (e.g., 1-methoxymethyl or 1-ethoxymethyl), a 3-oxoalkyl group, a tetrahydropyranyl group, a tetrahydrofuranyl group, a trialkylsilyl ester group, a 3-oxocyclohexyl ester group, a 2-methyl-2-adamantyl group, a mevalonic lactone residue, etc.

The halogen atom as represented by $R_{13}'$ to $R_{16}'$ includes chlorine, bromine, fluorine, and iodine.

The alkyl group as represented by $R_5$, $R_6$, and $R_{13}'$ to $R_{16}'$ is preferably a straight-chain or branched alkyl group having 1 to 10 carbon atoms, still preferably a straight-chain or branched alkyl group having 1 to 6 carbon atoms, particularly preferably methyl, ethyl, propyl, isopropyl, n-butyl, isobutyl, sec-butyl or t-butyl.

The cyclic hydrocarbon group as represented by $R_5$, $R_6$, and $R_{13}'$ to $R_{16}'$ includes a cycloalkyl group and a bridged hydrocarbon group, such as cyclopropyl, cyclopentyl, cyclohexyl, adamantyl, 2-methyl-2-adamantyl, norbornyl, bornyl, isobornyl, tricyclodecanyl, dicyclopentenyl, norbornane epoxy, menthyl, isomenthyl, neomenthyl, and tetracyclododecanyl.

The ring formed by connection of at least two of $R_{13}'$ to $R_{16}'$ includes rings having 5 to 12 carbon atoms, such as cyclopentene, cyclohexene, cycloheptane, and cyclooctane.

The alkoxy group as represented by $R_{17}'$ includes those having 1 to 4 carbon atoms, such as methoxy, ethoxy, propoxy, and butoxy.

The alkyl group, the cyclic hydrocarbon group, and the alkoxy group may have a substituent(s). The substituents include a hydroxyl group, a halogen atom, a carboxyl group, an alkoxy group, an acyl group, a cyano group, an acyloxy group, an alkyl group, and a cyclic hydrocarbon group. The halogen atom includes chlorine, bromine, fluorine, and iodine. The alkoxy group includes those having 1 to 4 carbon atoms, such as methoxy, ethoxy, propoxy, and butoxy. The acyl group includes formyl and acetyl. The acyloxy group includes acetoxy. The alkyl group and the cyclic hydrocarbon groups include those recited above.

The divalent linking group as represented by A' includes an alkylene group, a substituted alkylene group, an ether group, a thioether group, a carbonyl group, an ester group, an amido group, a sulfonamido group, a urethane group, a urea group, and a combination thereof In the acid decomposable alicyclic hydrocarbon resin, the acid decomposable group can be present in at least one of the repeating unit having the partial structure containing the alicyclic hydrocarbon represented by formulae (pI) through (pVI), the repeating unit represented by formula (II-AB), and a repeating unit derived from an additional comonomer described intra.

The groups $R_{13}'$ to $R_{16}'$ in formulae (II-A) and (II-B) are also used as substituents of the atomic group Z' necessary to form an alicyclic structure, preferably a bridged alicyclic structure, in formula (II-AB).

Specific but non-limiting examples of the repeating units represented by formulae (II-A) or (II-B) are shown below.

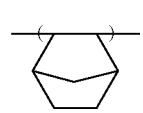

(II-1)

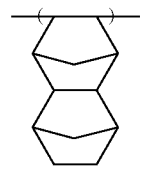

(II-2)

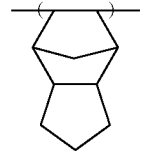

(II-3)

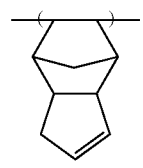

(II-4)

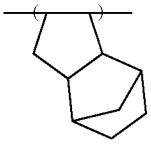

(II-5)

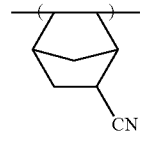

(II-6)

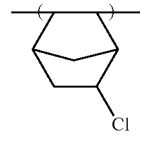

(II-7)

-continued

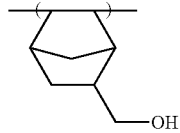

(II-8)

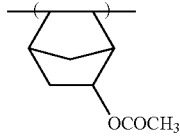

(II-9)

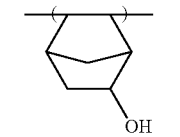

(II-10)

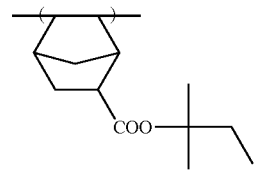

(II-11)

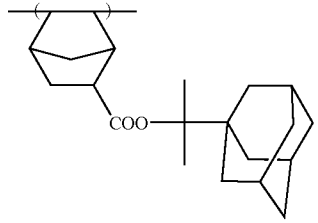

(II-12)

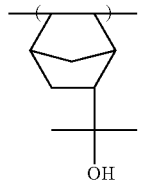

(II-13)

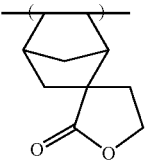

(II-14)

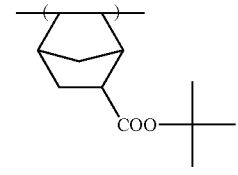

(II-15)

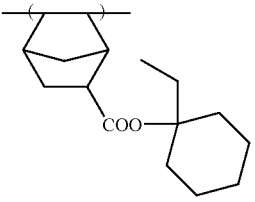

(II-16)

-continued
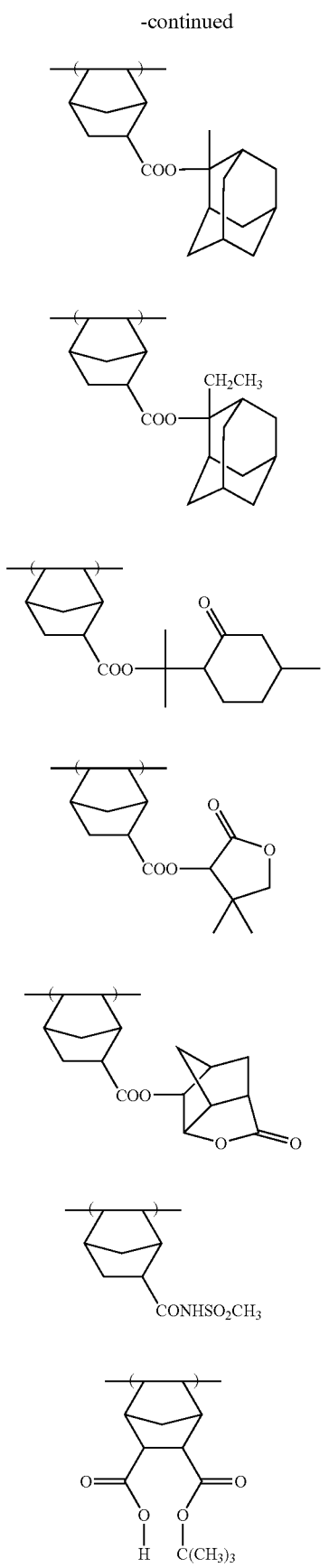
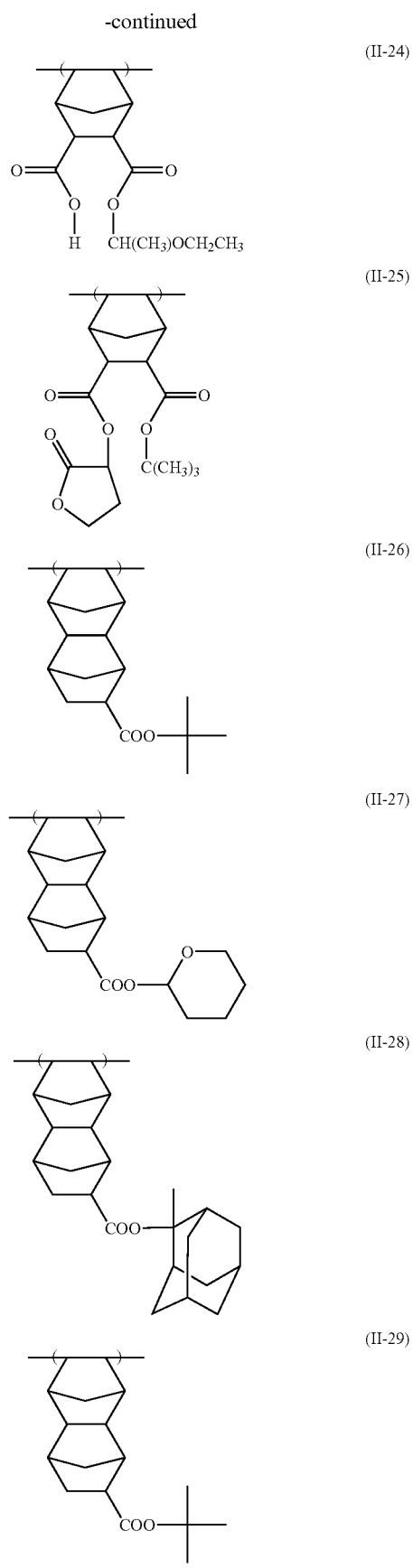

-continued (II-30)
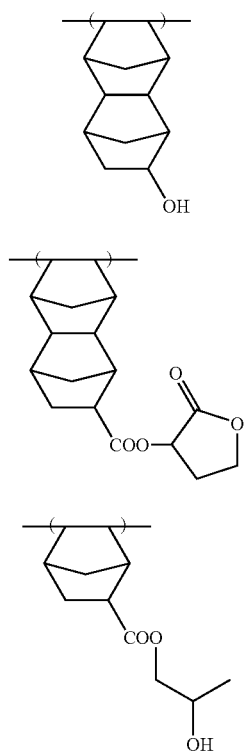

(II-31)

(II-32)

It is preferred for the acid decomposable alicyclic hydrocarbon resin to have a lactone group, particularly a repeating unit containing a group having a lactone structure represented by any one of formulae (Lc), (V-1), (V-2), (V-3), (V-4), and (V-5) shown below. The group having a lactone structure may be directly bonded to the main chain of the resin.

(Lc)
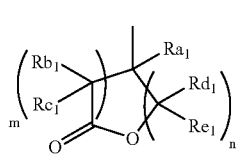

(V-1)
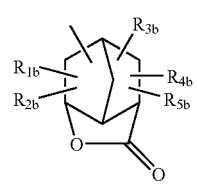

(V-2)
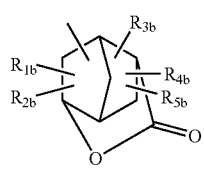

(V-3)
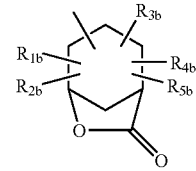

(V-4)

(V-5)
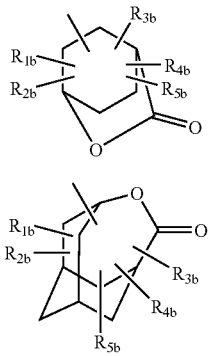

In formula (Lc), $Ra_1$, $Rb_1$, $Rc_1$, $Rd_1$, and $Re_1$ each represent a hydrogen atom or a substituted or unsubstituted alkyl group; and n and n each represent an integer of 0 to 3, with proviso that m+n is 2 to 6.

In formulae (V-1) to (V-5), $R_{1b}$, $R_{3b}$, $R_{3b}$, $R_{4b}$, and $R_{5b}$ each represent a hydrogen atom, a substituted or unsubstituted alkyl group, a substituted or unsubstituted cycloalkyl group, a substituted or unsubstituted alkoxy group, a substituted or unsubstituted alkoxycarbonyl group, a substituted or unsubstituted alkylsulfonylimino group or a substituted or unsubstituted alkenyl group; and two of them may be taken together to form a ring.

The alkyl group as $Ra_1$ to $Re_1$ in formula (Lc) and as $R_{1b}$ to $R_{5b}$ in formulae (V-1) to (V-5) and the alkyl moiety of the alkoxy group, alkoxycarbonyl group and alkylsulfonylimino group as $R_{1b}$ to $R_{5b}$ in formulae (V-1) to (V-5) may be straight-chain or branched and substituted or unsubstituted.

The repeating unit containing the group having a lactone structure represented by any one of formulae (Lc) and (V-1) to (V-5) includes the repeating unit of formula (II-A) or (II-B) wherein at least one of $R_{13}'$ to $R_{16}'$ is the group of formulae (Lc) and (V-1) through (V-5) (for example, a repeating unit having —COOR$_5$ in which R$_5$ is a group of formulae (Lc) and (V-1) to (V-5)) and a repeating unit represented by formula (AI):

(AI)
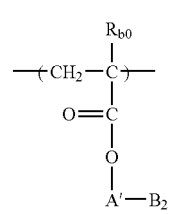

wherein $R_{b0}$ represents a hydrogen atom, a halogen atom or a substituted or unsubstituted alkyl group having 1 to 4 carbon atoms; A' represents a single bond or a divalent linking group selected from an ether group, an ester group, a carbonyl group, an alkylene group, and a combination thereof; and $B_2$ represents a group represented by anyone of formulae (Lc) and (V-1) through (V-5).

The substituent of the substituted alkyl group as $R_{b0}$ includes those recited as preferred substituents of the alkyl group as $R_{1b}$ in formulae (V-1) to (V-5). The halogen atom as $R_{b0}$ includes fluorine, chlorine, bromine, and iodine. $R_{b0}$ is preferably a hydrogen atom.

Specific but non-limiting examples of the repeating units containing a group having a lactone structure are shown below.

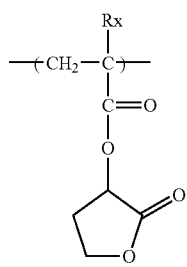
(IV-1)

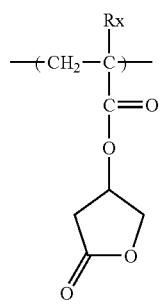
(IV-2)

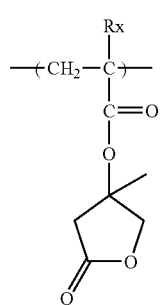
(IV-3)

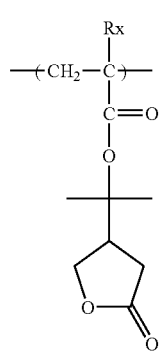
(IV-4)

-continued

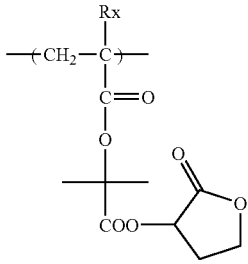
(IV-5)

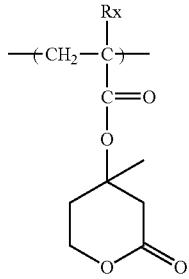
(IV-6)

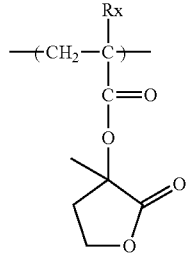
(IV-7)

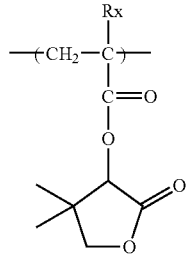
(IV-8)

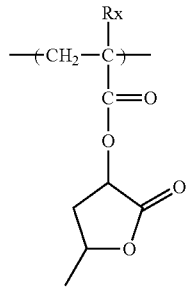
(IV-9)

(IV-10) 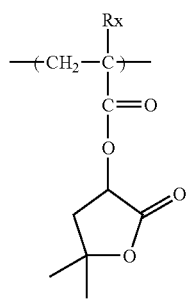
(IV-11) 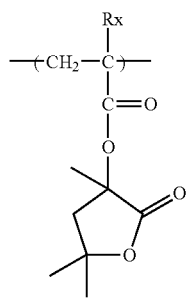
(IV-12) 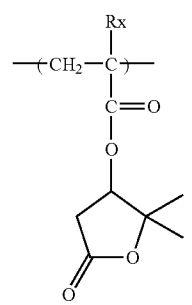
(IV-13) 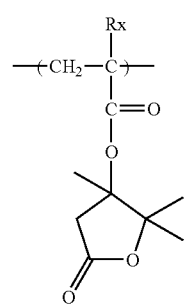
(IV-14) 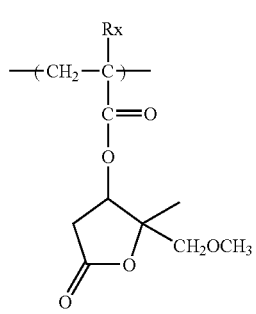
(IV-15) 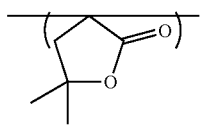
(IV-16) 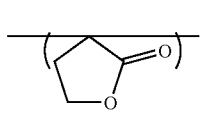
(Ib-1) 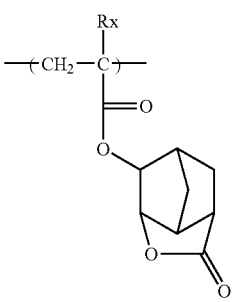
(Ib-2) 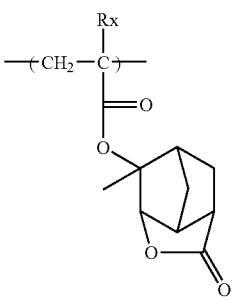
(Ib-3) 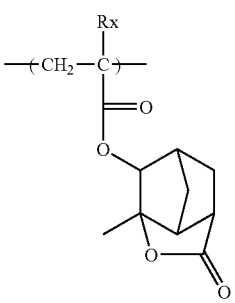
(Ib-4) 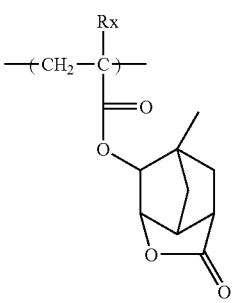

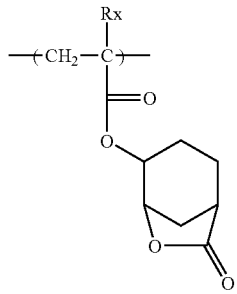 (Ib-5)
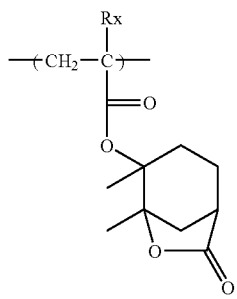 (Ib-6)
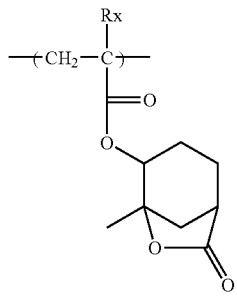 (Ib-7)
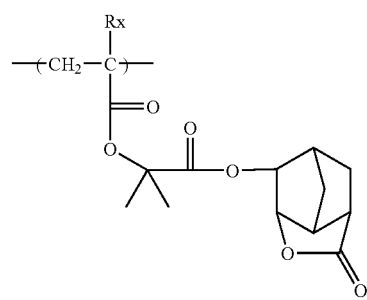 (Ib-8)
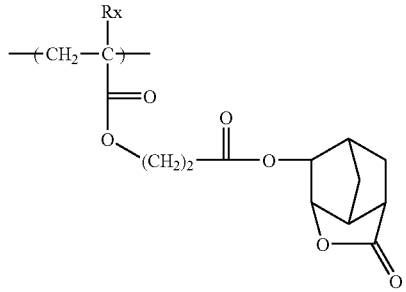 (Ib-9)
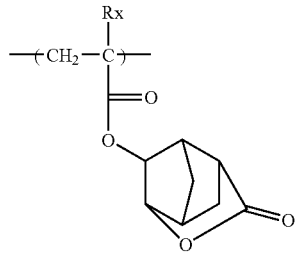 (Ib-10)
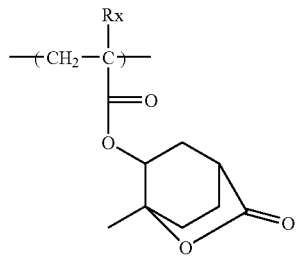 (Ib-11)
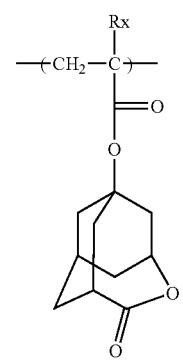
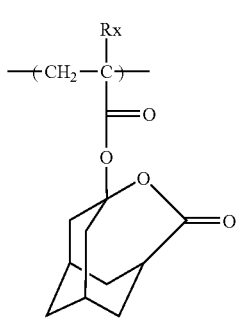
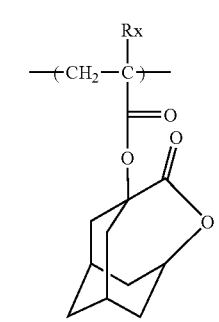

-continued
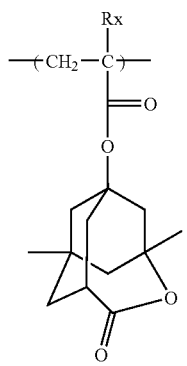
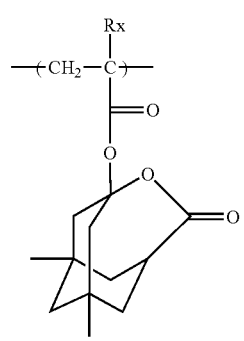
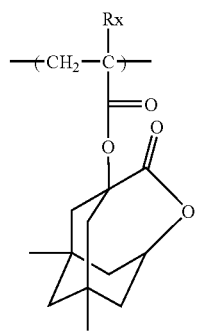
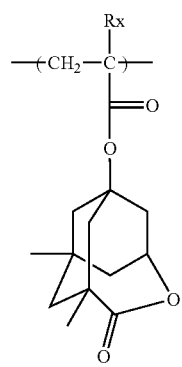
-continued
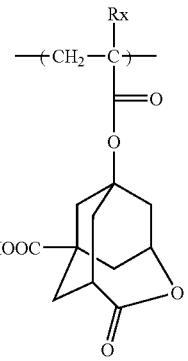
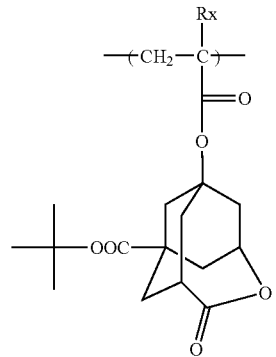
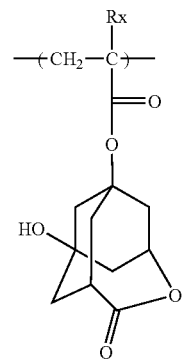
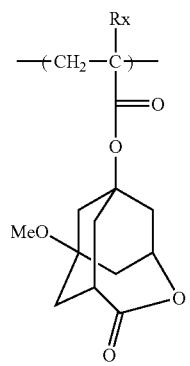

-continued

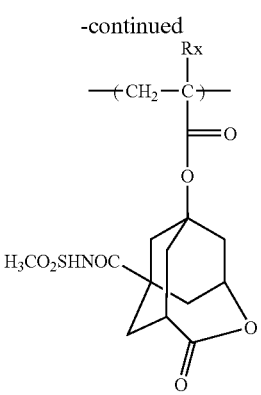

wherein Rx represents H, CH$_3$ or CF$_3$.

The acid decomposable alicyclic hydrocarbon resin may further contain a repeating unit having a group represented by formula (VII):

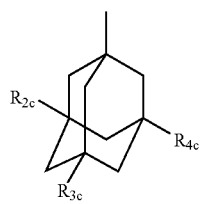

(VII)

wherein R$_{2c}$, R$_{3c}$, and R$_{4c}$ each represent a hydrogen atom or a hydroxyl group, provided that at least one of them is a hydroxyl group.

The group of formula (VII) preferably contains one or two hydroxyl groups, still preferably two hydroxyl groups.

The repeating unit having the group of formula (VII) includes the repeating unit represented by formula (II-A) or (II-B) in which at least one of R$_{13}$' to R$_{16}$' has the group of formula (VII) (for example a repeating unit having —COOR$_5$ in which R$_5$ is the group of formula (VII)) and a repeating unit represented by formula (AII):

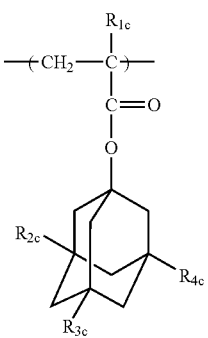

(AII)

wherein R$_{1c}$ represents a hydrogen atom or a methyl group; and R$_{2c}$, R$_{3c}$, and R$_{4c}$ each represent a hydrogen atom or a hydroxyl group, provided that at least one of R$_{2c}$, R$_{3c}$, and R$_{4c}$ is a hydroxyl group. It is preferred that two of R$_{2c}$, R$_{3c}$, and R$_{4c}$ are a hydroxyl group.

Specific but non-limiting examples of the repeating unit of formula (AII) are shown below.

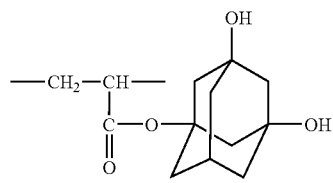
(1)

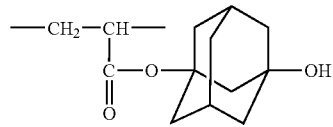
(2)

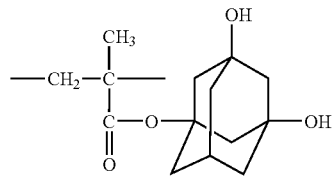
(3)

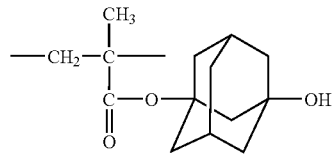
(4)

The acid decomposable alicyclic hydrocarbon resin can further contain a repeating unit represented by formula (VIII):

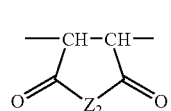
(VIII)

wherein Z$_2$ represents —O— or —N(R$_{41}$)—; R$_{41}$ represents a hydrogen atom, a hydroxyl group, an alkyl group, a haloalkyl group or —OSO$_2$—R$_{42}$; and R$_{42}$ represents an alkyl group, a haloalkyl group, a cycloalkyl group or a camphor residual group.

Specific but non-limiting examples of the repeating unit represented by formula (VIII) are shown below.

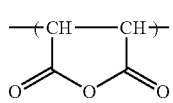
[I'-1]

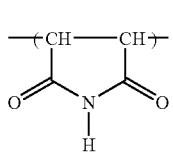
[I'-2]

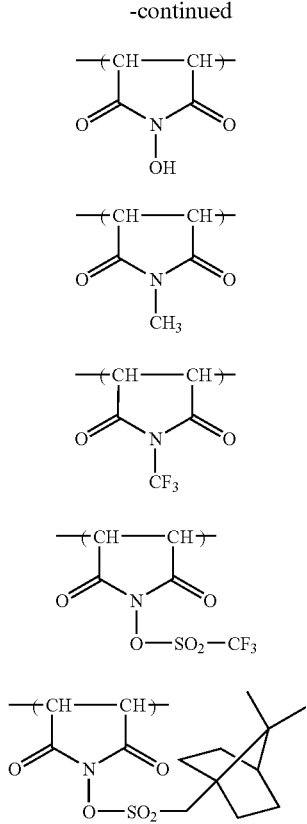

The acid decomposable alicyclic hydrocarbon resin as component (B) can further contain other various repeating units for the purpose of controlling dry etching resistance, suitability to standard developers, adhesion to a substrate, resist profile, and other characteristics generally required of resists, such as resolution, heat resistance, and sensitivity.

The repeating units serving for these properties include, but are not limited to, those derived from compounds having one addition polymerizable unsaturated bond per molecule, such as acrylic esters, methacrylic esters, acrylamides, methacrylamides, allyl compounds, vinyl ethers, and vinyl esters. Incorporating such optional repeating units makes it possible to finely control the performance characteristics required of the acid decomposable alicyclic hydrocarbon resin, particularly (1) solubility in a coating solvent, (2) film forming capabilities (glass transition point), (3) developability with an alkaline developer, (4) film thickness loss (hydrophilicity or hydrophobicity and alkali solubility), (5) adhesion to a substrate in an unexposed area, and (6) dry etching resistance. The acid decomposable alicyclic hydrocarbon resin may further contain repeating units of other addition polymerizable unsaturated compounds copolymerizable with the above-described various repeating units.

The copolymerization ratio of the repeating units is decided appropriately taking into consideration of the above-mentioned properties such as dry etching resistance, suitability to standard developers, adhesion to a substrate, resist profile, and characteristics generally required of a resist including resolution, heat resistance and sensitivity.

Preferred embodiments of the acid decomposable alicyclic hydrocarbon resin include (i) a resin containing a repeating unit having an alicyclic hydrocarbon-containing partial structure represented by formulae (pI) through (pVI) (sidechain type) and (ii) a resin containing a repeating unit represented by formula (II-AB) (main chain type). The resin of the type (ii) includes a resin comprising the repeating unit of formula (II-AB), a maleic anhydride derivative unit, and a (meth)acrylate unit (hybrid type).

The acid decomposable alicyclic hydrocarbon resin preferably contains the repeating unit having an acid decomposable group in a proportion of 10 to 60 mol %, particularly 20 to 50 mol %, especially 25 to 40 mol %, based on the total repeating units. The content of the repeating unit having the alicyclic hydrocarbon-containing partial structure of formula (pI) to (pVI) in the resin is preferably 30 to 70 mol %, still preferably 35 to 65 mol %, particularly preferably 40 to 60 mol %, based on the total repeating units. The content of the repeating unit of formula (II-AB) in the resin is preferably 10 to 60 mol %, still preferably 15 to 55 mol %, particularly preferably 20 to 50 mol %, based on the total repeating units.

The contents of other comonomer units in the resin are decided appropriately according to desired performance of the composition. In general, the total content of other comonomer units is preferably not more than 99 mol %, still preferably not more than 90 mol %, particularly preferably not more than 80 mol %, based on the total molar quantity of the repeating unit having the alicyclic hydrocarbon-containing partial structure of formulae (pI) to (pVI) and the repeating unit of formula (II-AB).

Where the stimulus sensitive composition of the invention is intended to be exposed to ArF excimer laser light, it is preferred that the resin (B) be free from an aromatic group from the viewpoint of transparency to ArF light.

The acid decomposable alicyclic hydrocarbon resin can be synthesized in a usual manner by, for example, radical polymerization. It is generally prepared as follows. Monomers are put into a reaction vessel all at once or dividedly. If necessary, the monomers are dissolved uniformly in an appropriate reaction solvent, such as ethers (e.g., tetrahydrofuran, 1,4-dioxane, and diisopropyl ether), ketones (e.g., methyl ethyl ketone and methyl isobutyl ketone) or esters (e.g., ethyl acetate), or a solvent capable of dissolving the composition of the invention (described infra), such as propylene glycol monomethyl ether acetate. The reaction system is allowed to polymerize in the presence of a commercially available radical initiator (e.g., azo initiators or peroxides) in an inert gas (e.g., nitrogen or argon) atmosphere under, if necessary, heating. If needed, the initiator is added in divided portions, or an additional amount of the initiator is added with the progress of polymerization. After completion of the reaction, the reaction mixture is poured into a poor solvent to collect the resulting polymer in the form of powder or solid. The monomer concentration of the reaction system is 20% by weight or higher, preferably 30% by weight or higher, still preferably 40% by weight or higher. The reaction temperature ranges 10° to 150° C., preferably 30° to 120° C., particularly preferably 50° to 100° C.

Where the positive stimulus sensitive composition is to be exposed to $F_2$ excimer laser light, it is preferred for the resin (B) to have a fluorine-substituted structure in the main chain and/or the side chain and to be decomposable by the action of an acid to increase its solubility in an alkaline developer. Such a resin (B) will be referred to as a fluorine-containing resin. The fluorine-containing resin preferably contains (i) a hydroxyl group substituted at the 1-position with a fluorine atom or a fluoroalkyl group or (ii) an acid decomposable group-protected hydroxyl group substituted at the 1-position with a fluorine atom or a fluoroalkyl group. The fluorine-containing resin still preferably contains a hexafluoro-2-propanol structure or a hexafluoro-2-propanol structure with its hydroxyl group protected with an acid decomposable group. The fluorine-containing resin exhibits improved transparency to far ultraviolet light, especially $F_2$ excimer laser light (wavelength: 157 nm).

The fluorine-containing resin as component (B) preferably has at least one of repeating units represented by formulae (FA), (FB), (FC), (FD), (FE), (FF), and (FG):

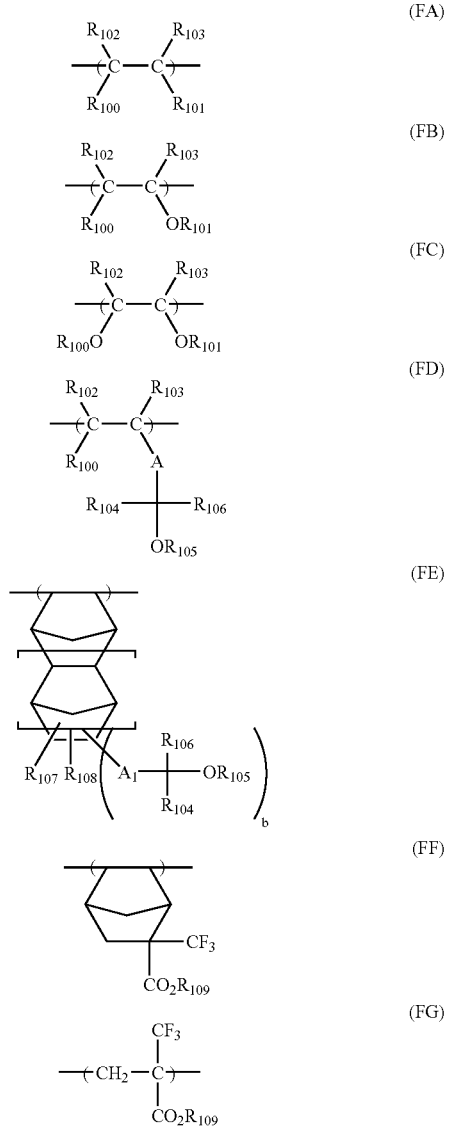

In formulae (FA), (FB), (FC), and (FD), $R_{100}$, $R_{101}$, $R_{102}$, and $R_{103}$ each represent a hydrogen atom, a fluorine atom, an alkyl group, a fluoroalkyl group or an aryl group.

In formulae (FD) and (FE), $R_{104}$ and $R_{106}$ each represent a hydrogen atom, a fluorine atom or a fluoroalkyl group, provided that at least one of them is a fluorine atom or a fluoroalkyl group; $R_{105}$ represents a hydrogen atom, an alkyl group, a fluoroalkyl group, an acyl group, an alkoxycarbonyl group or an acid decomposable group; $A_1$ represents a single bond or a divalent linking group selected from, for example, a straight-chain, branched or cyclic alkylene group, an alkenylene group, an arylene group, —OCO—, —COO—, —CON($R_{24}$)—, and a combination thereof; and $R_{24}$ represents a hydrogen atom or an alkyl group. Both $R_{104}$ and $R_{106}$ are preferably a trifluoromethyl group.

In formula (FE), $R_{107}$ and $R_{108}$ each represent a hydrogen atom, a halogen atom, an alkyl group, a fluoroalkyl group, an alkoxy group, an alkoxycarbonyl group or an acid decomposable group; a represents 0 or 1; and b represents 0, 1 or 2.

In formulae (FF) and (FG), $R_{109}$ represents a hydrogen atom, an alkyl group, a fluoroalkyl group or an acid decomposable group.

The repeating units represented by formulae (FA) through (FG) contain at least one, preferably three or more fluorine atoms, per unit.

In formulae (FA) through (FG), the alkyl groups include those having 1 to 8 carbon atoms, preferably methyl, ethyl, propyl, n-butyl, sec-butyl, hexyl, 2-ethylhexyl, and octyl. The cycloalkyl group includes monocyclic ones having 3 to 8 carbon atoms preferably cyclopropyl, cyclopentyl, cyclohexyl, cycloheptyl and cyclooctyl; and polycyclic ones having 6 to 20 carbon atoms, preferably adamantyl, norbornyl, isobornyl, camphoryl, dicyclopentyl, α-pinenyl, tricyclodecanyl, tetracyclododecyl, and androstanyl. The monocyclic or polycyclic cycloalkyl group may have its carbon atom substituted with a hetero atom such as an oxygen atom.

The fluoroalkyl groups include those having 4 to 12 carbon atoms, preferably perfluorobutyl, perfluorohexyl, perfluorooctyl, perfluorooctylethyl, and perfluoxododecyl.

The haloalkyl groups include those having 1 to 4 carbon atoms, preferably chloromethyl, chloroethyl, chloropropyl, chlorobutyl, bromomethyl, and bromoethyl.

The aryl group includes the one having 6 to 15 carbon atoms, preferably phenyl, tolyl, dimethylphenyl, 2,4,6-trimethylphenyl, naphthyl, anthryl, and 9,10-dimethoxyanthryl.

The aralkyl group includes the one having 7 to 12 carbon atoms, preferably benzyl, phenethyl, and naphthylmethyl.

The alkenyl group includes the one having 2 to 8 carbon atoms, preferably vinyl, allyl, butenyl, and cyclohexenyl.

The alkoxy group includes the one having 1 to 8 carbon atoms, preferably methoxy, ethoxy, n-propoxy, isopropoxy, butoxy, pentyloxy, allyloxy, and octyloxy.

The acyl group includes the one having 1 to 10 carbon atoms, preferably formyl, acetyl, propanoyl, butanoyl, pivaloyl, octanoyl, and benzoyl.

The acyloxy group is preferably the one having 2 to 12 carbon atoms, such as acetoxy, propionyloxy or benzoyloxy.

The alkynyl group is preferably the one having 2 to 5 carbon atoms, such as ethynyl, propynyl or butynyl.

The alkoxycarbonyl groups include isopropoxycarbonyl, t-butoxycarbonyl, t-amyloxycarbonyl, and 1-methyl-1-cyclohexyloxycarbonyl, preferably secondary or tertiary alkoxycarbonyl groups, still preferably tertiary alkoxycarbonyl groups.

The halogen atom includes fluorine, chlorine, bromine, and iodine.

The alkylene group is preferably the one having 1 to 8 carbon atoms that may be substituted, such as methylene, ethylene, propylene, butylene, hexylene or octylene.

The alkenylene group is preferably the one having 2 to 6 carbon atoms that may be substituted, such as ethenylene, propenylene or butenylene.

The cycloalkylene group is preferably the one having 5 to 8 carbon atoms that may be substituted, such as cyclopentylene or cyclohexylene.

The arylene group is preferably the one having 6 to 15 carbon atoms that may be substituted, such as phenylene, tolylene or naphthylene.

These groups may have a substituent(s). Suitable substituents include an alkyl group, a cycloalkyl group, an aryl group, an amino group, an amido group, a ureido group, a urethane group, an active hydrogen-containing group (e.g., a hydroxyl group or a carboxyl group), a halogen atom (e.g., fluorine, chlorine, bromine or iodine), an alkoxy group (e.g., methoxy, ethoxy, propoxy or butoxy), a thioether group, an acyl group (e.g., acetyl, propanoyl or benzoyl), an acyloxy group (e.g., acetoxy, propanoyloxy or benzoyloxy), an alkoxycarbonyl group (e.g., methoxycarbonyl, ethoxycarbonyl or propoxycarbonyl), a cyano group, and a nitro group. The alkyl, cycloalkyl and aryl groups as substituents include those recited above. Additionally, the alkyl group as a substituent may be substituted with a fluorine atom or a cycloalkyl group.

In the fluorine-containing resins, the acid decomposable group (the group decomposable by the action of an acid to reveal alkali solubility) includes —O—C($R_{36}$)($R_{37}$)($R_{38}$), —O—C($R_{36}$)($R_{37}$)($OR_{38}$), —O—COO—C($R_{36}$)($R_{37}$)($R_{38}$), —O—C($R_{01}$)($R_{02}$)COO—C($R_{36}$)($R_{37}$)($R_{38}$), —COO—C($R_{36}$)($R_{37}$)($R_{38}$), and —COO—C($R_{36}$)($R_{37}$)($OR_{39}$), wherein $R_{36}$, $R_{37}$, $R_{38}$, and $R_{39}$ each represent a substituted or unsubstituted alkyl group, a substituted or unsubstituted cycloalkyl group, a substituted or unsubstituted aryl group, a substituted or unsubstituted aralkyl group or a substituted or unsubstituted alkenyl group; and $R_{01}$ and $R_{02}$ each represent a hydrogen atom, a substituted or unsubstituted alkyl group, a substituted or unsubstituted cycloalkyl group, a substituted or unsubstituted alkenyl group, a substituted or unsubstituted aralkyl group or a substituted or unsubstituted aryl group. Such an acid decomposable group includes a tertiary alkyl (e.g., t-butyl, t-amyl, 1-alkyl-1-cyclohexyl, 2-alkyl-2-adamantyl, 2-adamantyl-2-propyl or 2-(4-methylcyclohexyl)-2-propyl) ether or ester group, an acetal or acetal ester group (e.g., 1-alkoxy-1-ethoxy group or tetrahydropyranyl), a t-alkyl carbonate group, and a t-alkylcarbonylmethoxy group.

The repeating units represented by formula (FA) through (FG) include, but are not limited to, the following.

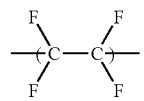
(F-1)

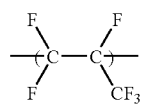
(F-2)

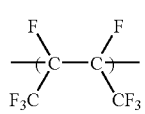
(F-3)

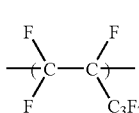
(F-4)

-continued

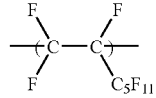
(F-5)

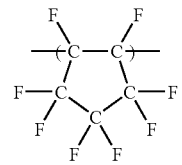
(F-6)

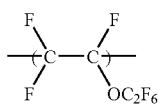
(F-7)

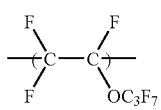
(F-8)

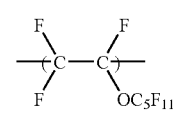
(F-9)

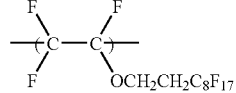
(F-10)

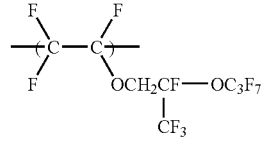
(F-11)

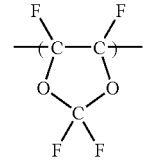
(F-12)

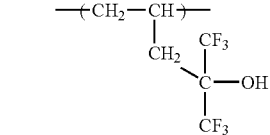
(F-13)

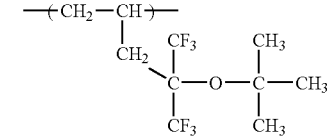
(F-14)

(F-15)

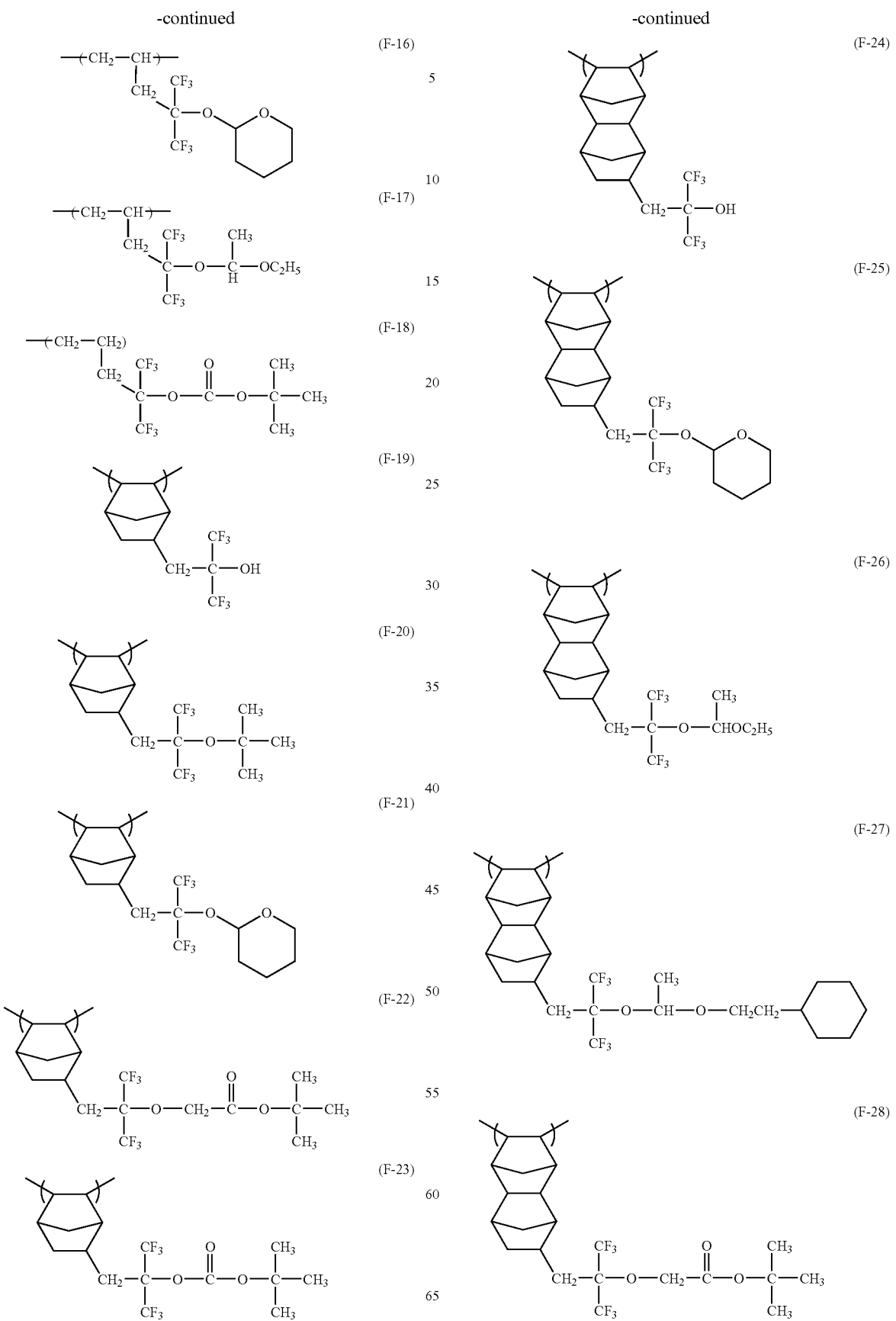

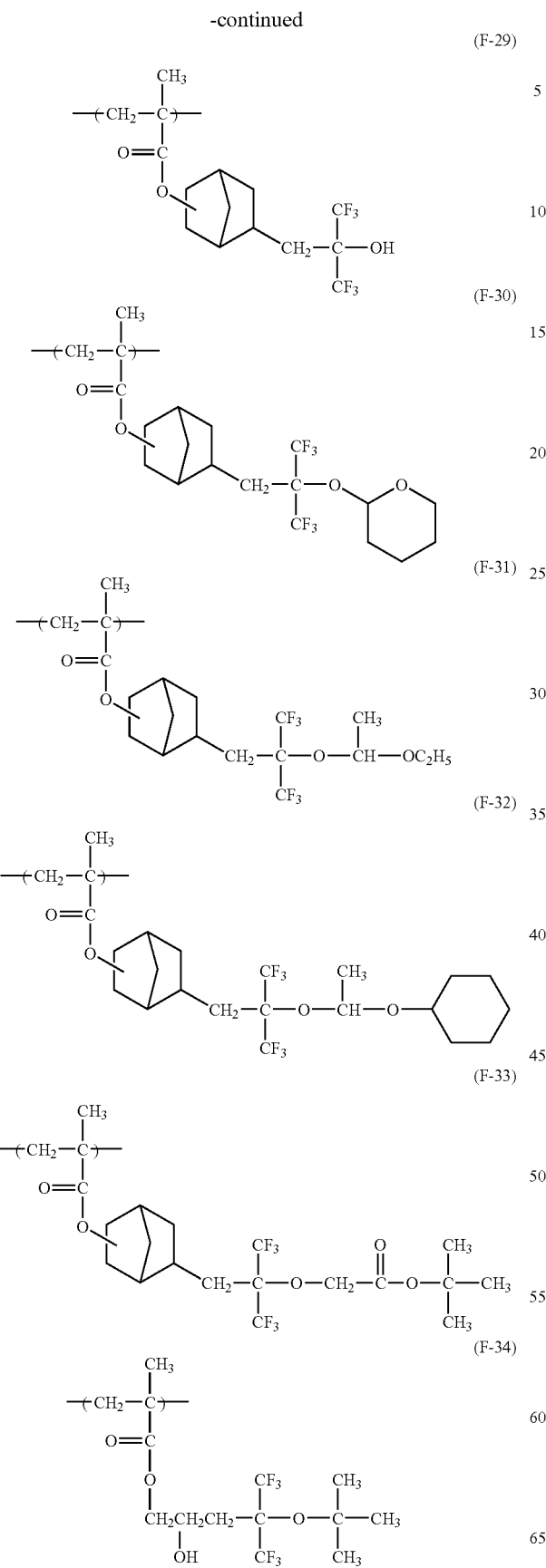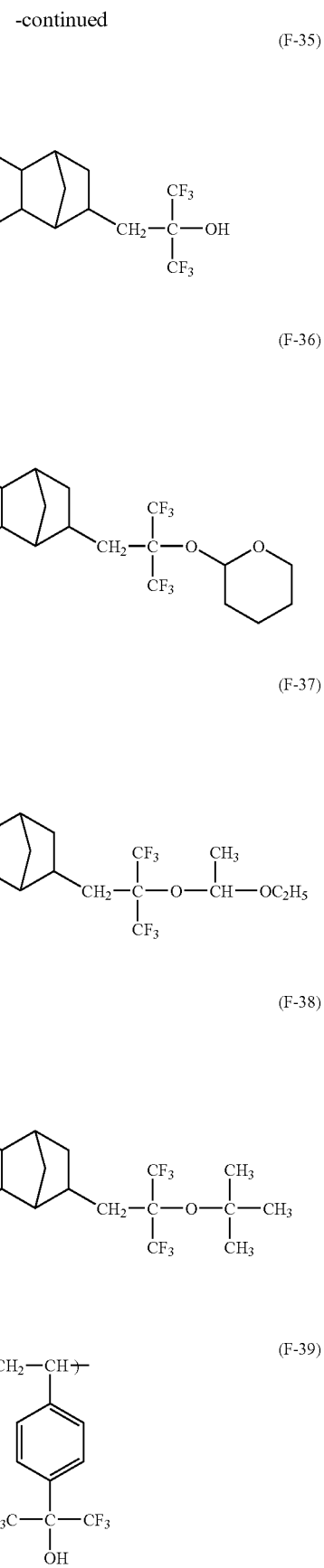

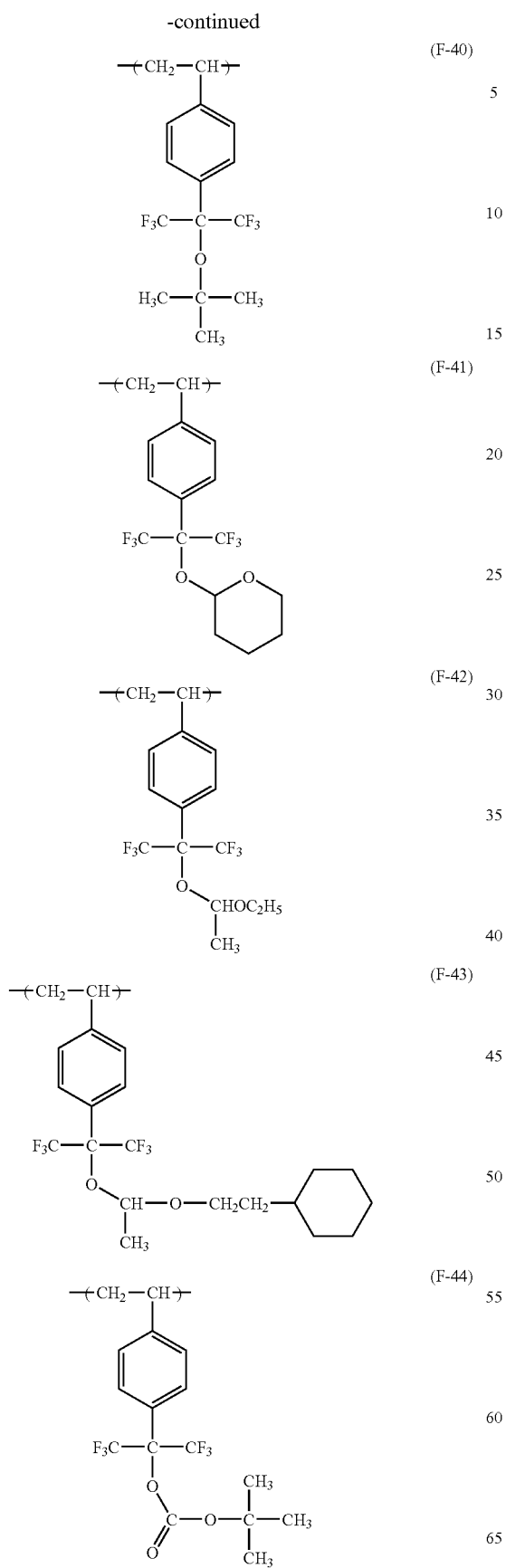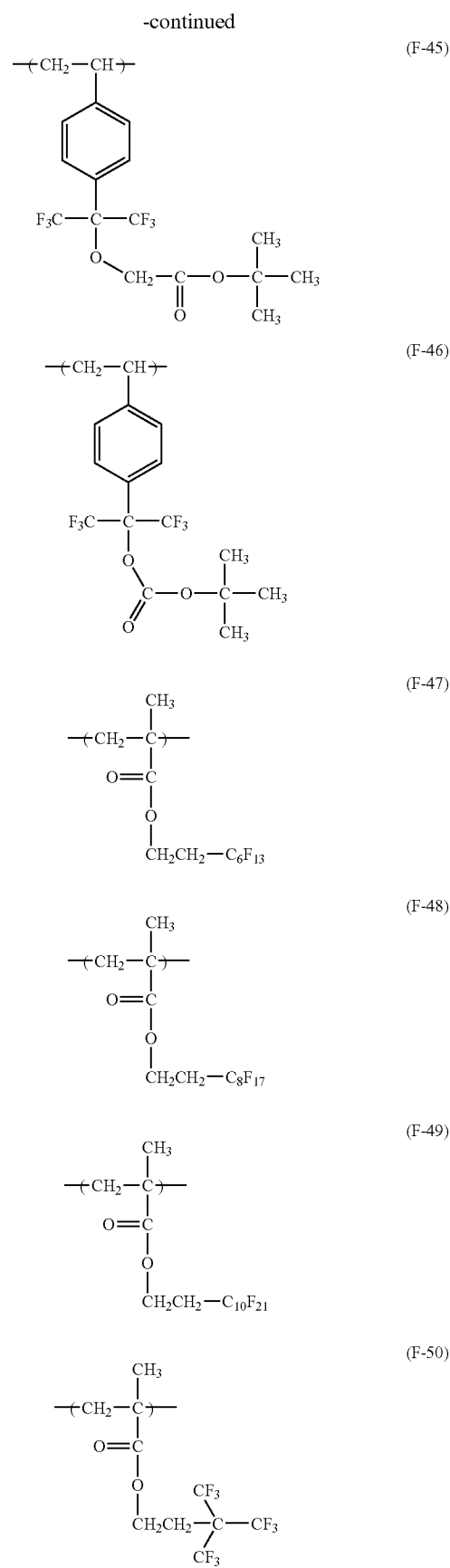

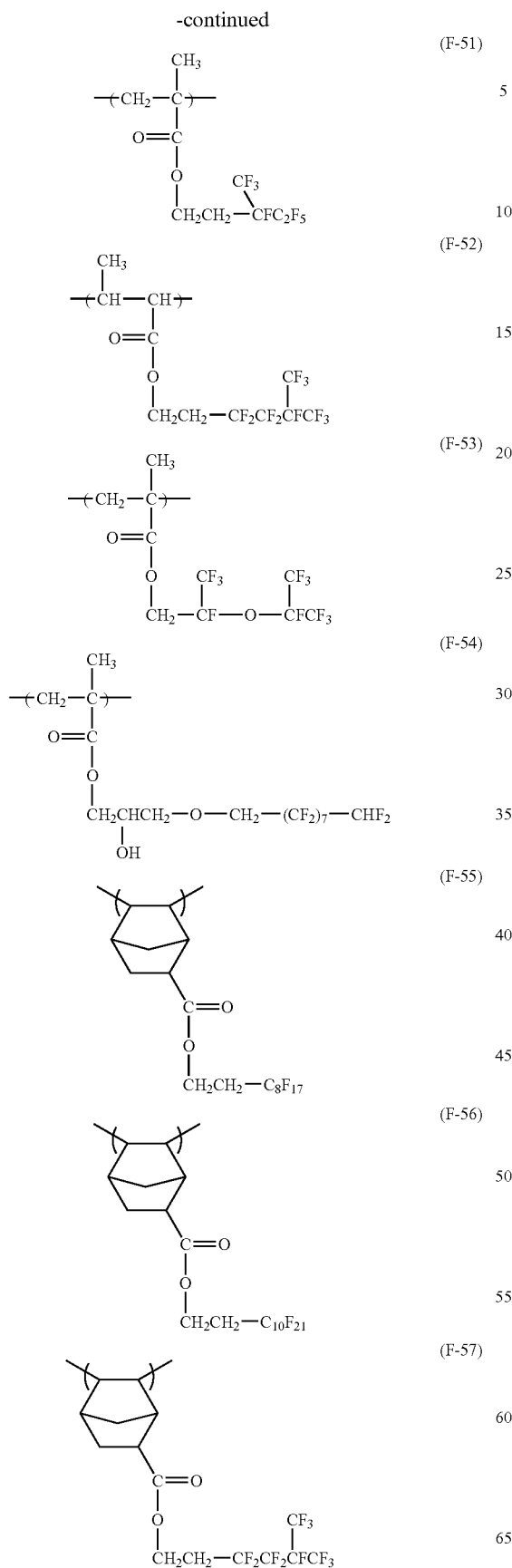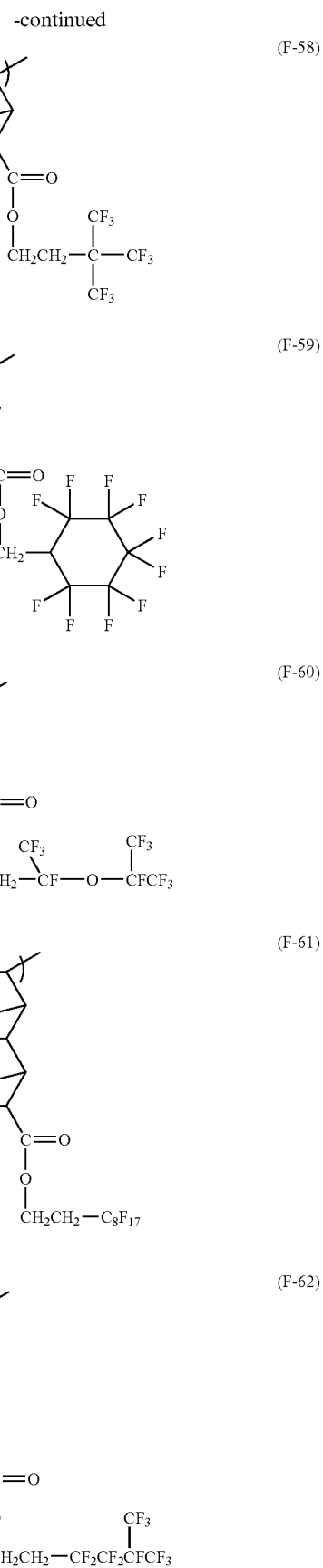

-continued (F-63)
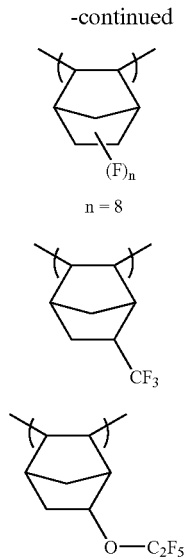
n = 8

(F-64)

(F-65)

The fluorine-containing resin as component (B) usually contains the repeating units of formulae (FA) to (FG) in a total amount of 10 to 80 mol %, preferably 30 to 70 mol %, still preferably 35 to 65 mol %, based on the total repeating units constituting the resin.

The fluorine-containing resin as component (B) can further contain other various repeating units for the purpose of improving performance properties as a positive resist composition. Comonomers that can be used for that purpose include compounds having one addition polymerizable unsaturated bond per molecule, such as acrylic esters, methacrylic esters, acrylamides, methacrylamides, allyl compounds, vinyl ethers, vinyl esters, styrenes, and crotonic esters.

The fluorine-containing resin preferably comprises, in addition to the fluorine-containing repeating units, other comonomer units for the purpose of improving dry etching resistance, controlling alkali solubility, improving adhesion to a substrate, and the like. The other comonomer units preferably used for that purpose include:

(1) repeating units having the alicyclic hydrocarbon-containing partial structure represented by formulae (pI) through (pVI) and repeating units represented by formula (II-B), specifically, repeating units 1 to 23 represented by formula (pA) and repeating units (II-1) to (II-32), preferably repeating units 1 to 23 in which Rx is $CF_3$;

(2) repeating units having the lactone structure represented by formulae (Lc) and (V-1) to (V-5), specifically repeating units (IV-1) to (IV-16) and (Ib-1) to (Ib-11); and (3) repeating units represented by formulae (XV), (XVI), and (XVII) shown below, which are derived from maleic anhydride, a vinyl ether, and a cyano-containing vinyl compound, respectively, specifically repeating units (C-1) to (C-15). These repeating units may or may not contain a fluorine atom.

(XV)
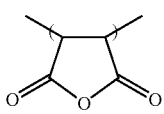

-continued (XVI)
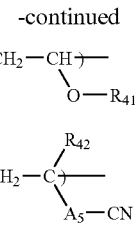

(XVII)

wherein $R_{41}$ represents an alkyl group, a cycloalkyl group, an aralkyl group or an aryl group; $R_{42}$ represents a hydrogen atom, a halogen atom, a cyano group, an alkyl group or a haloalkyl group; $A_5$ represents an alkylene group, an alkenylene group, a cycloalkylene group, an arylene group, —O—CO—$R_{22}$—, —CO—O—$R_{23}$—, or —CO—N($R_{24}$)—$R_{25}$; $R_{22}$, $R_{23}$, and $R_{25}$, which may be the same or different, each represent a single bond or a divalent linking group selected from an alkylene group, an alkenylene group, a cycloalkylene group, and an arylene group, the divalent linking group may contain an ether group, an ester group, an amido group, a urethane group or a ureido group; and $R_{24}$ represents a hydrogen atom, a substituted or unsubstituted alkyl group, a substituted or unsubstituted cycloalkyl group, a substituted or unsubstituted aralkyl group or a substituted or unsubstituted aryl group.

Examples of these substituents are the same as those described with reference to formulae (FA) to (FG).

Illustrative non-limiting examples of the repeating units represented by formulae (XVI) and (XVII) are shown below.

(C-1)
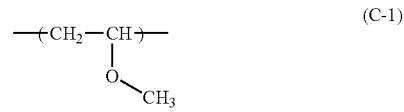

(C-2)
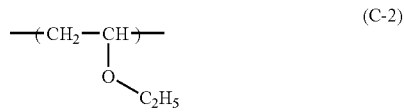

(C-3)
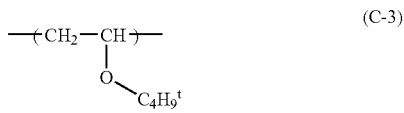

(C-4)
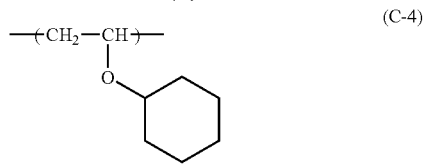

(C-5)
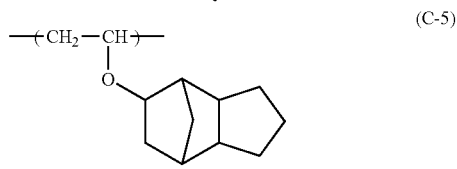

(C-6)
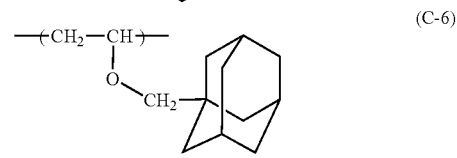

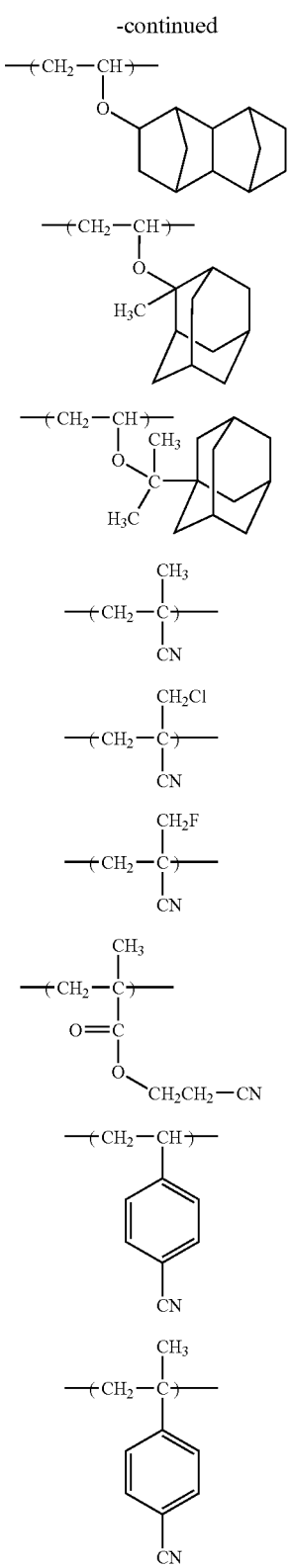

The total amount of the other comonomer units such as those of formulae (XV) to (XVII) is usually 0 to 70 mol %, preferably 10 to 60 mol %, still preferably 20 to 50 mol %, based on the total repeating units constituting the fluorine-containing resin.

The fluorine-containing resin as component (B) can have the acid decomposable group in any repeating unit. The content of the acid decomposable group-containing repeating unit is preferably 10 to 70 mol %, still preferably 20 to 60 mol %, particularly preferably 30 to 60 mol %.

The fluorine-containing resin can be synthesized by radical polymerization similarly to the acid decomposable alicyclic hydrocarbon resin.

The resin (B) preferably has a weight average molecular weight of 1,000 to 200,000 in terms of polystyrene equivalent weight average molecular weight measured by GPC (hereinafter the same). Resins having a weight average molecular weight less than 1,000 tend to have reduced heat resistance and reduced dry etching resistance. Resins having a weight average molecular weight exceeding 200,000 tend to have poor developability or poor film forming properties due to too high viscosity.

The content of the resin (B) in the stimulus sensitive composition is preferably 40 to 99.99% by weight, still preferably 50 to 99.97% by weight, based on the total solids content.

The dissolution inhibitor (C) used as component (C) of the stimulus sensitive composition has a molecular weight of 3000 or less and decomposes by the action of an acid to increase its solubility in an alkaline developer. The dissolution inhibitor (C) is preferably such that does not interfere with transmission of light having wavelengths of 220 nm or shorter. From this viewpoint, the dissolution inhibitor (C) is preferably an alicyclic or aliphatic compound containing an acid decomposable group, exemplified by the acid decomposable group-containing cholic acid derivatives described in *Proceeding of SPIE*, 2724, 355 (1996). Examples of the acid decomposable group and examples of the alicyclic structure are the same as those described with reference to the acid decomposable alicyclic hydrocarbon resin.

Where the stimulus sensitive composition of the invention is adapted to be irradiated with KrF excimer laser beams or electron beams, it is preferred for the dissolution inhibitor (C) to contain a phenol structure derived by displacing the phenolic hydroxyl group of a phenol compound with an acid decomposable group. The phenol compound preferably has 1 to 9, particularly 2 to 6, phenol structures per molecule.

The dissolution inhibitor (C) preferably has a weight average molecular weight of 300 to 3,000, still preferably 500 to 2,500.

The amount of the dissolution inhibitor (C) to be added is preferably 3 to 50% by weight, still preferably 5 to 40% by weight, based on the total solids content of the stimulus sensitive composition.

Illustrative non-limiting examples of suitable dissolution inhibitors (C) are shown below.

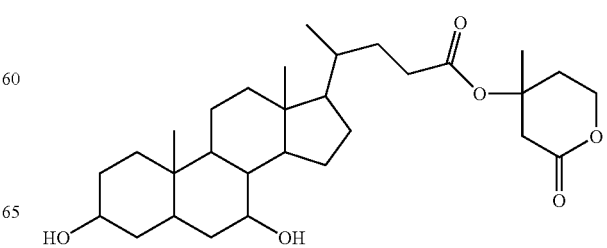

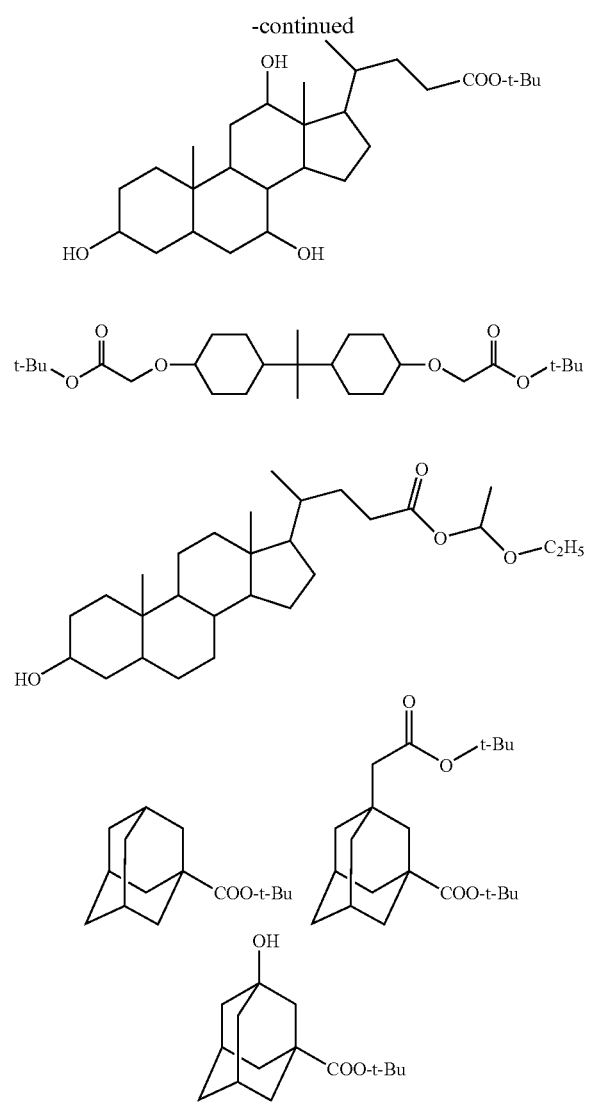

The resin soluble in an alkaline developer which can be used as component (D) (hereinafter referred to as an alkali soluble resin D) preferably has an alkali dissolution rate of 20 Å (angstrom)/sec or higher, particularly 200 Å/sec or higher, measured in 0.26 N TMAH at 23° C.

The alkali soluble resin D includes, but is not limited to, novolak resins, hydrogenated novolak resins, acetone-pyrogallol resins, poly(o-, m- or p-hydroxystyrene), hydrogenated poly(hydroxystyrene), poly(halogen- or alkyl-substituted hydroxystyrene), hydroxystyrene-N-substituted maleimide copolymers, o/p- and m/p-hydroxystyrene copolymers, poly(hydroxystyrene) the hydroxyl groups of which are partially O-alkylated (e.g., 5 to 30 mol % O-methylated, O-(1-methoxy)ethylated, O-(1-ethoxy)ethylated, O-2-tetrahydropyranylated or O-(t-butoxycarbonyl)methylated), poly(hydroxystyrene) the hydroxyl groups of which are partially O-acylated (e.g., 5 to 30 mol % O-acetylated or O-(t-butoxy)carbonylated), styrene-maleic anhydride copolymers, styrene-hydroxystyrene copolymers, α-methylstyrene-hydroxystyrene copolymers, carboxyl-containing methacrylic resins and derivatives thereof, and polyvinyl alcohol derivatives.

Particularly preferred alkali soluble resins (D) include novolak resins, homo-or copolymers of o-, m- or p-hydroxystyrene, poly(alkyl-substituted hydroxystyrene), partially O-alkylated or O-acylated poly(hydroxystyrene), styrene-hydroxystyrene copolymers, and α-methylstyrene-hydroxystyrene copolymers. The novolak resins are obtainable by addition condensation of a prescribed monomer and an aldehyde in the presence of an acid catalyst.

The alkali soluble resin D preferably has a weight average molecular weight of 2000 or more, particularly 5,000 to 200,000, especially 5,000 to 100,000.

The above-described alkali soluble resins can be used as component (D) either individually or as a combination of two or more thereof. The amount of component (D) to be used is usually 40 to 97% by weight, preferably 60 to 90% by weight, based on the total solids content of the stimulus sensitive composition.

The negative stimulus sensitive composition according to the invention contains, as component (E), a crosslinking agent crosslinkable with the alkali soluble resin (D) by the action of an acid (hereinafter referred to as a crosslinking agent (E)). The crosslinking agent (E) is not particularly limited but preferably includes (1) hydroxymethylated, alkoxymethylated or acyloxymethylated phenol derivatives, (2) compounds having an N-hydroxymethyl group, an N-alkoxymethyl group or an N-acyloxymethyl group, and (3) epoxy-containing compounds. The alkoxymethyl group and the acyloxymethyl group preferably contain 6 or fewer carbon atoms. Particularly preferred crosslinking agents (E) are shown below.

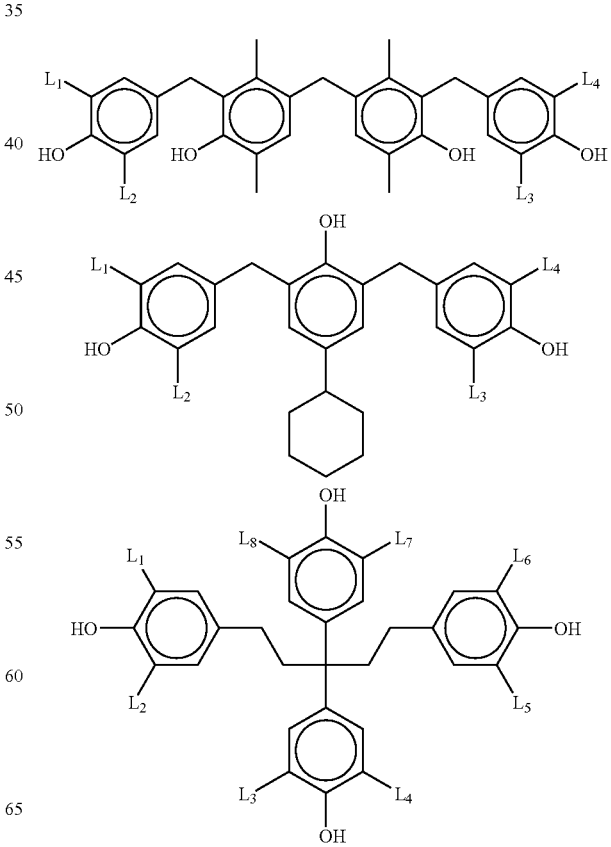

-continued

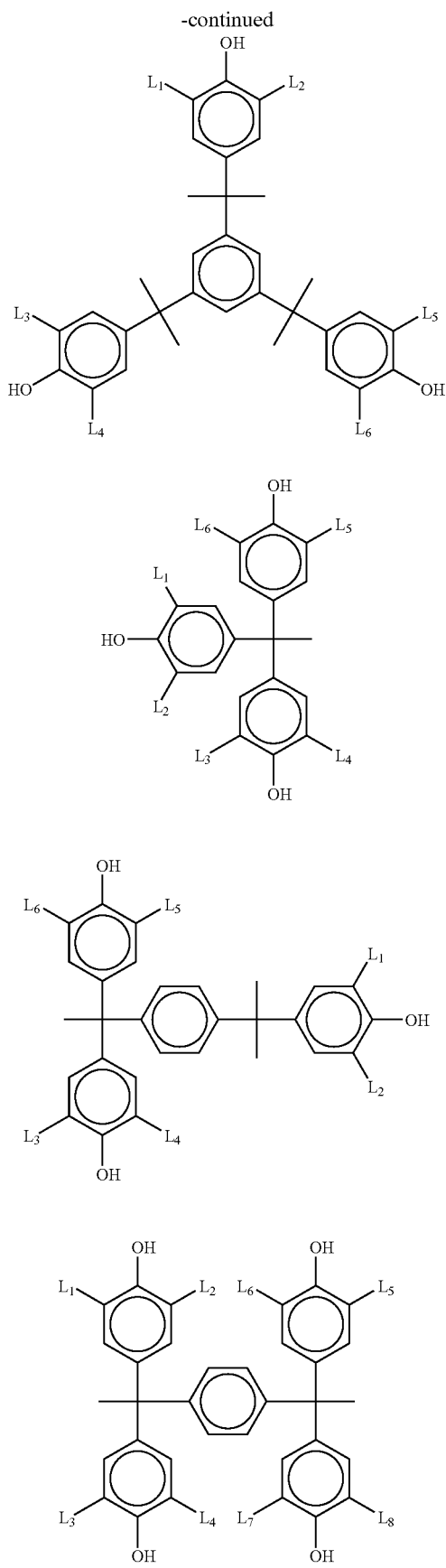

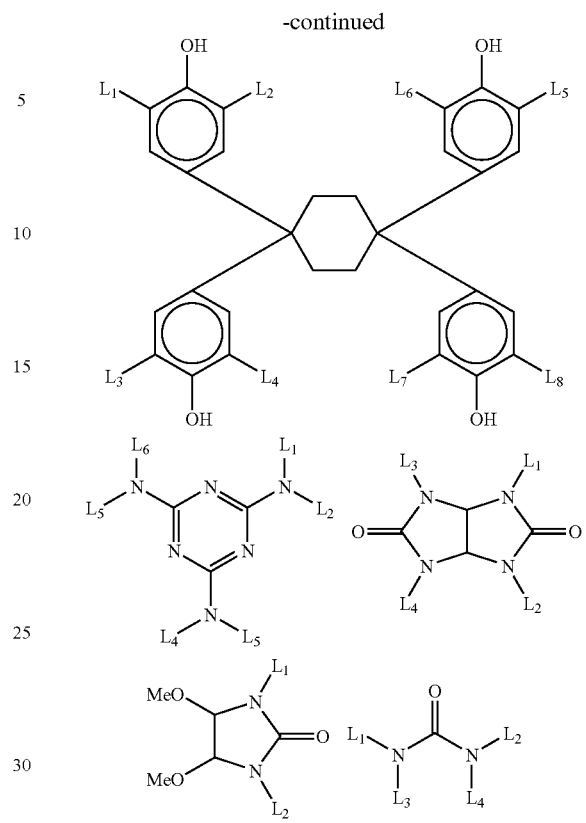

wherein $L^1$, $L^2$, $L^3$, $L^4$, $L^5$, $L^6$, $L^7$, and $L^8$, which may be the same or different, each represent a hydrogen atom, a hydroxymethyl group, a methoxymethyl group, an ethoxymethyl group or an alkyl group having 1 to 6 carbon atoms.

The crosslinking agent (E) is used in an amount usually of 3 to 70% by weight, preferably of from 5 to 50% by weight, based on the total solids content of the negative stimulus sensitive composition.

It is preferred for the stimulus sensitive composition of the invention to further contain a basic compound as component (F) (hereinafter referred to as a basic compound (F)) so as to reduce performance changes with time from exposure to heating. Basic compounds (F) that are preferred include those represented by structural formulae (A) through (E):

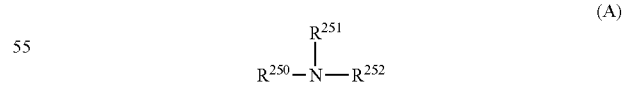

(A)

wherein $R^{250}$, $R^{251}$, and $R^{252}$ each represent a hydrogen atom, an alkyl group having 1 to 20 carbon atoms, an aminoalkyl group having 1 to 20 carbon atoms, a hydroxyalkyl group having 1 to 20 carbon atoms or a substituted or unsubstituted aryl group having 6 to 20 carbon atoms; $R^{250}$ and $R^{251}$ may be taken together to form a ring; and the alkyl group and the alkyl-containing groups may have an oxygen atom, a sulfur atom or a nitrogen atom in the alkyl chain.

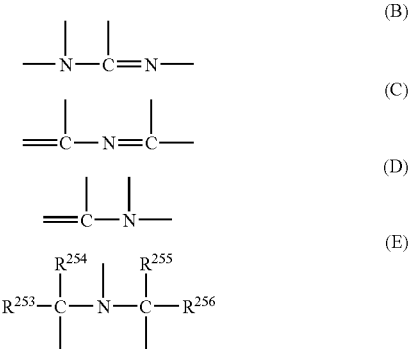

wherein $R^{253}$, $R^{254}$, $R^{255}$, and $R^{256}$ each represent an alkyl group having 1 to 6 carbon atoms.

Still preferred basic compounds (F) include substituted or unsubstituted guanidines, substituted or unsubstituted aminopyrrolidines, substituted or unsubstituted pyrazoles, substituted or unsubstituted pyrazolines, substituted or unsubstituted piperazines, substituted or unsubstituted aminomorpholines, substituted or unsubstituted aminoalkylmorpholines, and substituted or unsubstituted piperidines. Particularly preferred basic compounds (F) include compounds having a structure selected from an imidazole structure, a diazabicyclo structure, an onium hydroxide structure an onium carboxylate structure, a trialkylamine structure, an aniline structure, and a pyridine structure; alkylamine derivatives having a hydroxyl group and/or an ether bond; and aniline derivatives having a hydroxyl group and/or an ether bond.

Examples of the compounds having an imidazole structure are imidazole, 2,4,5-triphenylimidazole, and benzimidazole. Examples of the compounds having a diazabicyclo structure are 1,4-diazabicyclo[2,2,2]octane, 1,5-diazabicyclo[4,3,0]non-5-ene, and 1,8-diazabicyclo[5,4,0]undec-7-ene. The compounds having an onium hydroxide structure include triarylsulfonium hydroxides, phenacylsulfonium hydroxide, and 2-oxoalkyl-containing sulfonium hydroxides, such as triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide. The compounds having an onium carboxylate structure correspond to the compounds having an onium hydroxide structure with their anion replaced with a carboxylate, including acetates, adamantane-1-carboxylates, and perfluoroalkylcarboxylates. Examples of the compounds having a trialkylamine structure are tri (n-butyl) amine and tri (n-octyl) amine. The compounds having an aniline structure include 2,6-diisopropylaniline and N,N-dimethylaniline. The alkylamine derivatives having a hydroxyl group and/or an ether linkage include ethanolamine, diethanolamine, triethanolamine, and tris(methoxyethoxyethyl)amine. The aniline derivatives having a hydroxyl group and/or an ether linkage include N,N-bis(hydroxyethyl)aniline.

These basic compounds can be used either individually or as a combination of two or more thereof. The basic compound is added in an amount usually of 0.001 to 10% by weight, preferably 0.01 to 5% by weight, based on the total solids content of the stimulus sensitive composition. Amounts less than 0.001% by weight are little effective. Addition of more than 10% by weight can result in reduction of sensitivity or deterioration of developability.

It is preferred for the stimulus sensitive composition of the invention to further contain, as component (a), at least one fluorine- and/or silicon-containing surface active agent (a fluorine-containing surface active agent, a silicon-containing surface active agent, or a fluorine- and silicon-containing surface active agent). Addition of the fluorine- and/or a silicon-containing surface active agent secures capabilities of forming a resist pattern with reduced development defects and with good adhesion to a substrate at satisfactory sensitivity and resolution when in using a light source having a wavelength of 250 nm or shorter, particularly 220 nm or shorter.

Suitable fluorine- and/or silicon-containing surface active agents are described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360, 692, 5,529,881, 5,296,330, 5,436,098, 5,576,143, 5,294,511, and 5,824,451. Commercially available fluorine- and/or silicon-containing surface active agents are also utilized, including EFTOP series EF301 and EF303 (from Shin Akita Kasei K.K.); Fluorad series FC430 and FC431 (from Sumitomo 3M Ltd.); Megafac series F171, F173, F176, F189, and R08 (from Dainippon Ink & Chemicals Inc.); Surflon series S-382, SC101, 102, 103, 104, 105 and 106 from Asahi Glass Co., Ltd.); and Troy Sol S-366 (from Troy Chemical Industries, Inc.). Polysiloxane polymer KP-341 (from Shin-Etsu Chemical Co., Ltd.) is also useful as a silicon-containing surface active agent In addition to the above-mentioned known surface active agents, a polymeric surface active agent having a fluoro-aliphatic group is also useful as component (G), which is obtained from a fluoro-aliphatic compound by telomerization or oligomerization techniques. The fluoro-aliphatic compound is synthesized in accordance with the process disclosed in JP-A-2002-90991.

The polymer having a fluoro-aliphatic group is preferably a copolymer of a fluoro-aliphatic group-containing monomer and a poly(oxyalkylene) acrylate and/or a poly (oxyalkylene) methacrylate, in which the monomer units are arranged either randomly or in blocks. The poly(oxyalkylene) group includes poly(oxyethylene), poly(oxypropylene), and poly(oxybutylene). The poly(oxyalkylene) group may be a unit having alkylene moieties of different chain length linked in blocks in the same chain, such as poly (oxyethylene/oxypropylene/oxyethylene) and poly(oxyethylene/oxypropylene). The copolymer of a fluoro-aliphatic group-containing monomer and a poly(oxyalkylene) (meth)acrylate may have three or more repeating units, i.e., two or more different fluoro-aliphatic group-containing monomer units and/or two or more different poly(oxyalkylene) (meth) acrylate monomer units, The fluoro-aliphatic group-containing copolymers include Megafac series F178, F-470, F-473, F-475, F-476, and F-472 (from Dainippon Ink L Chemicals Inc.); copolymers of a $C_6F_{13}$-containing (meth)acrylate and a poly(oxyalkylene) (meth)acrylate; copolymers of a $C_6F_{13}$-containing (meth)acrylate, poly(oxyethylene) acrylate, and poly(oxypropylene) (meth)acrylate; copolymers of a $C_6F_{17}$-containing (meth)acrylate and a poly(oxyalkylene) (meth) acrylate; and copolymers of a $C_6F_{17}$-containing (meth) acrylate, poly(oxyethylene) acrylate, and poly (oxypropylene) (meth)acrylate.

The fluorine- and/or silicon-containing surface active agent is used in an amount preferably of 0.0001 to 2% by weight, particularly 0.001 to 1% by weight, based on the total solids content of the stimulus sensitive composition.

The stimulus sensitive composition of the invention is used in the form of a solution of the above-described components in an organic solvent. Useful organic solvents include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethyl sulfoxide, N-methylpyrrolidone, and tetrahydrofuran.

These organic solvents can be used either individually or as a mixture thereof. A mixture of a hydroxyl-containing solvent and a hydroxyl-free solvent is preferred for reducing particle generation during storage of the composition in a solution form.

Hydroxyl-containing solvents include ethylene glycol, ethylene glycol monomethyl ether, ethylene glycol monoethyl ether, propylene glycol, propylene glycol monomethyl ether, propylene glycol monoethyl ether, and ethyl lactate. Preferred of them are propylene glycol monomethyl ether and ethyl lactate. Hydroxyl-free solvents include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Preferred of them are propylene glycol monomethyl ether acetate, ethyl ethoxypropionate, 2-heptanone, γ-butyrolactone, cyclohexanone, and butyl acetate. Still preferred are propylene glycol monomethyl ether acetate, ethyl ethoxypropionate, and 2-heptanone.

The mixing weight ratio of the hydroxyl-containing solvent to the hydroxyl-free solvent is 1/99 to 99/1, preferably 10/90 to 90/10, still preferably 20/80 to 60/40. From the standpoint of coating uniformity, a mixed solvent containing 50% by weight or more of the hydroxyl-free solvent is desirable.

If desired, the stimulus sensitive composition can contain additives, such as dyes, plasticizers, surface active agents other than component (G), photo sensitizers, and compounds accelerating dissolution in a developer (hereinafter referred to as a dissolution accelerator).

The dissolution accelerator that can be used in the invention is a low-molecular compound having a molecular weight of 1,000 or less and containing at least two phenolic hydroxyl groups or at least one carboxyl group per molecule. The dissolution accelerator containing a carboxyl group is preferably alicyclic or aliphatic. The amount of the dissolution accelerator to be added is preferably 2 to 50% by weight, still preferably 5 to 30% by weight, based on the acid decomposable resin (B) or the alkali soluble resin (D). Where added in amounts exceeding 50% by weight, the dissolution accelerator can increase scum generation or deform the pattern during development.

The low-molecular phenolic compounds useful as a dissolution accelerator can easily be synthesized with reference to the processes taught in JP-A-4-122938, JP-A-2-28531, U.S. Pat. No. 4,916,210, and EP 219294.

The low-molecular alicyclic or aliphatic compounds having a carboxyl group include, but are not limited to, carboxylic acid derivatives having a steroid structure, such as cholic acid, deoxycholic acid, and lithocolic acid, adamantane carboxylic acid derivatives, adamantane dicarboxylic acid, cyclohexanecarboxylic acid, and cyclohexane dicarboxylic acid.

The surface active agents other than component (G) (the fluorine- and/or silicon-containing ones) include nonionic surface active agents, such as polyoxyethylene alkyl ethers, polyoxyethylene alkyl allyl ethers, polyoxyethylene polyoxypropylene block copolymers, sorbitan fatty acid esters, and polyoxyethylene sorbitan fatty acid esters. These surface active agents can be added either individually or as a combination thereof.

In using the stimulus sensitive composition of the present invention, the above-described various components are dissolved in an appropriate solvent, preferably the above-mentioned mixed solvent. The thus diluted composition is applied to a prescribed substrate, such as a substrate used in the fabrication of precise IC devices (e.g., silicon wafer with a silicon dioxide coat), by an appropriate coating technique with a spinner, a coater, etc.

The resulting coating film is irradiated through a mask of prescribed pattern with active light rays or a radiation, baked, and developed to form a satisfactory pattern. Useful active light rays include infrared light, visible light, ultraviolet light, far ultraviolet light, X-rays, and electron beams, preferably far ultraviolet light rays having wavelengths of 250 nm or shorter, particularly 220 nm or shorter, specifically KrF excimer laser light (248 nm), ArF excimer laser light (193 nm), $F_2$ excimer laser light (157 nm), X-rays, and electron beams. ArF excimer laser light and $F_2$ excimer laser light are especially preferred. In the present invention, X-rays and electron beams are included under the term "active light rays".

Development is carried out with an alkaline developer as follows. The alkaline developer is an aqueous solution of an inorganic alkali, such as sodium hydroxide, potassium hydroxide, sodium carbonate, sodium silicate, sodium metasilicate or aqueous ammonia; a primary amine, such as ethylamine or n-propylamine; a secondary amine, such as diethylamine or di-n-butylamine; a tertiary amine, such as triethylamine or methyldiethylamine; an alcohol amine, such as dimethylethanolamine or triethanolamine; a quaternary ammonium salt, such as tetramethylammonium hydroxide or tetraethylammoniun hydroxide; a cyclic amine, such as pyrrole or piperidine; and so forth. The alkaline developer may contain adequate amounts of alcohols or surface active agents. The alkaline developer usually has a concentration of 0.1 to 20% by weight and a pH ranging from 10.0 to 15.0.

EXAMPLES

The present invention will now be illustrated in greater detail with reference to Examples, but it should be understood that the invention is not construed as being limited thereto. In Examples, all the percents are by weight unless otherwise noted.

Synthesis of Compounds A:

Synthesis Example 1

Synthesis of Compound (I-1)

In 100 ml of acetonitrile were dissolved 15.4 g of 1-adamantyl bromomethyl ketone and 7.9 g of tetrahydrothiophene and allowed to react at room temperature for 4 hours. The precipitated powder was collected by filtration and washed with acetonitrile to give 7.5 g of 2-(1-adamantyl)-2-oxoethyltetrahydrothiophenium bromide. The whole amount of the 2-(1-adamantyl)-2-oxoethyltetrahydrothiophenium bromide was dissolved in 200 ml of ethanol, and a solution of 7.7 g of potassium nonafluorobutanesulfonate in a water/acetonitrile mixed solvent was added to the solution. The mixed solution was concentrated to dryness. The resulting powder was washed with water and recrystallized from a mixed solvent of acetone (80 ml) and distilled water (80 ml) to give 10 g of compound (I-1).

$^1$H-NMR (DMSO-d6, 300 MHz): δ 1.6–2.1 (m, 15H), δ 2.05–2.3 (m, 4H), δ 3.3–3.6 (m, 4H), δ 4.8 (s, 2H)

Synthesis Example 2

Synthesis of Compound (I-2)

Compound (I-2) was synthesized in the same manner as in Synthesis Example 1, except for replacing potassium nonafluorobutanesulfonate with sodium trifluoromethanesulfonate.

Synthesis Example 3

Synthesis of Compound (I-3)

Compound (I-3) was synthesized in the same manner as in Synthesis Example 1, except for replacing potassium nonafluorobutanesulfonate with potassium perfluorooctanesulfonate.

Synthesis Example 4

Synthesis of Compound (I-4)

Compound (I-4) was synthesized in the same manner as in Synthesis Example 1, except for replacing potassium nonafluorobutanesulfonate with tetramethylammonium pentafluorobenzenesulfonate.

Synthesis Example 5

Synthesis of Compound (I-5)

Compound (I-5) was synthesized in the same manner as in Synthesis Example 1, except for replacing potassium nonafluorobutanesulfonate with tetramethylammonium 3,5-bistrifluoromethylbenzenesulfonate.

Synthesis Example 6

Synthesis of Compound (I-6)

Compound (I-6) was synthesized in the same manner as in Synthesis Example 1, except for replacing potassium nonafluorobutanesulfonate with sodium 10-camphorsulfonate.

Synthesis Example 7

Synthesis of Compound (I-7)

Compound (I-7) was synthesized in the same manner as in Synthesis Example 1, except for replacing potassium nonafluorobutanesulfonate with tetramethylammonium 2,4,6-triisopropylbenzenesulfonate.

Synthesis Example 8

Synthesis of Compound (I-8)

Compound (I-8) was synthesized in the same manner as in Synthesis Example 1, except for replacing potassium nonafluorobutanesulfonate with lithium bis(nonafluorobutanesulfonyl)imide.

Synthesis Example 9

Synthesis of Compound (I-9)

Compound (I-9) was synthesized in the same manner as in Synthesis Example 1, except for replacing potassium nonafluorobutanesulfonate with lithium tris(nonafluorobutanesulfonyl)methide.

Synthesis Example 10

Synthesis of Compound (I-13)

In 100 ml of acetonitrile were dissolved 5.0 g of 1-adamantyl bromomethyl ketone and 7.5 g of octyl sulfide, and 4.5 g of silver tetrafluoroborate was added thereto, followed by refluxing for 3 hours. The reaction mixture was filtered, and the filtrate was concentrated. The resulting oily substance was washed with diisopropyl ether to give 9.5 g of 2-(1-adamantyl)-2-oxoethyldioctylsulfonium tetrafluoroborate. The whole amount of the product was dissolved in 200 ml of chloroform, and a solution of 6.4 g of potassium nonafluorobutanesulfonate in a mixed solvent of water/acetonitrile, followed by stirring well. The reaction mixture was liquid/liquid separated, and the aqueous phase was extracted with 100 ml of chloroform. The organic layer was washed with water and concentrated to yield 10.2 g of compound (I-13).

Synthesis Example 11

Synthesis of Compound (I-14)

Compound (I-14) was synthesized in the same manner as in Synthesis Example 10, except for replacing potassium nonafluorobutanesulfonate with potassium perfluorooctanesulfonate.

Synthesis Example 12

Synthesis of Compound (I-15)

Compound (I-15) was synthesized in the same manner as for compound (I-13), except for replacing potassium nonafluorobutanesulfonate with sodium trifluoromethanesulfonate.

Synthesis Example 13

Synthesis of Compounds (I-10) to (I-12)

Compounds (I-10) to (I-12) were synthesized in the same manner as for compounds (I-13) to (I-15) except for replacing octyl sulfide with butyl sulfide.

Synthesis Example 14
Synthesis of Compounds (I-16) to (I-18)
Compounds (I-16) to (I-18) were synthesized in the same manner as for compounds (I-13) to (I-15), except for replacing octyl sulfide with dodecyl sulfide.
The structure and weight average molecular weight (Mw) of acid decomposable alicyclic hydrocarbon resins (1) to (22) used in Examples are shown below.
(1)
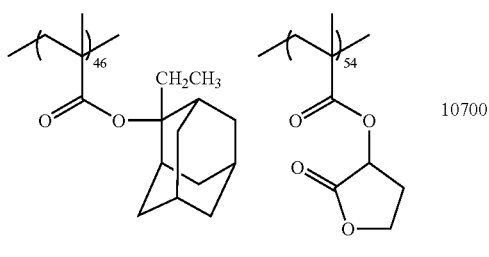
10700
(2)
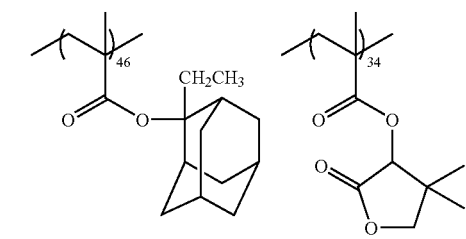
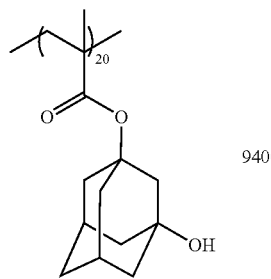
9400
(3)
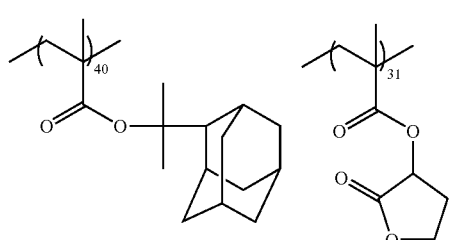
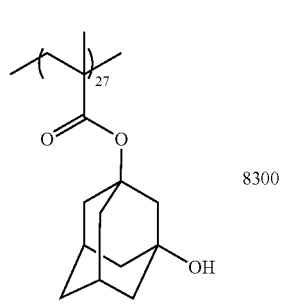
8300
(4)
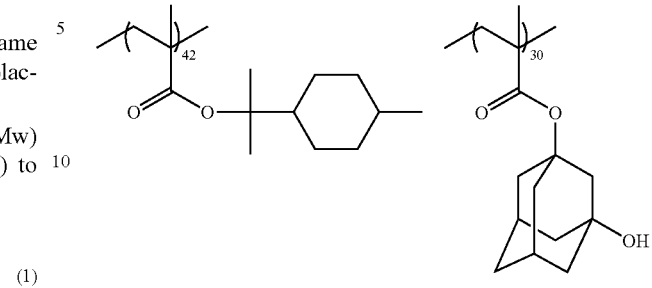
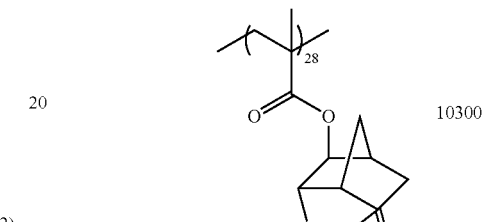
10300
(5)
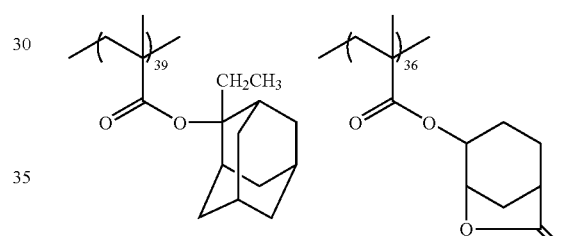
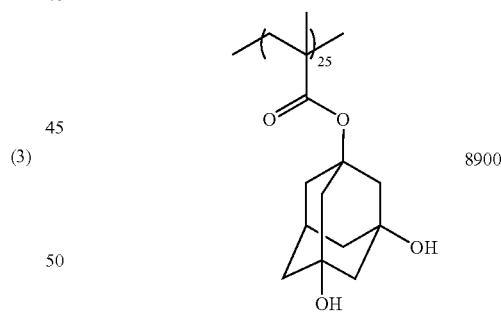
8900
(6)
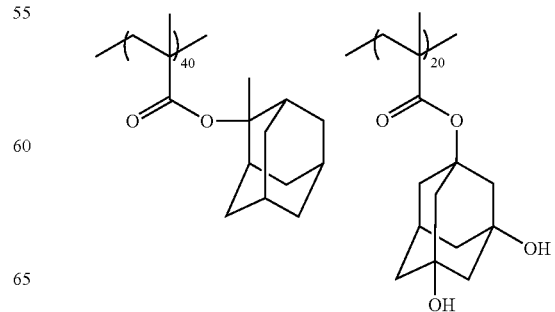

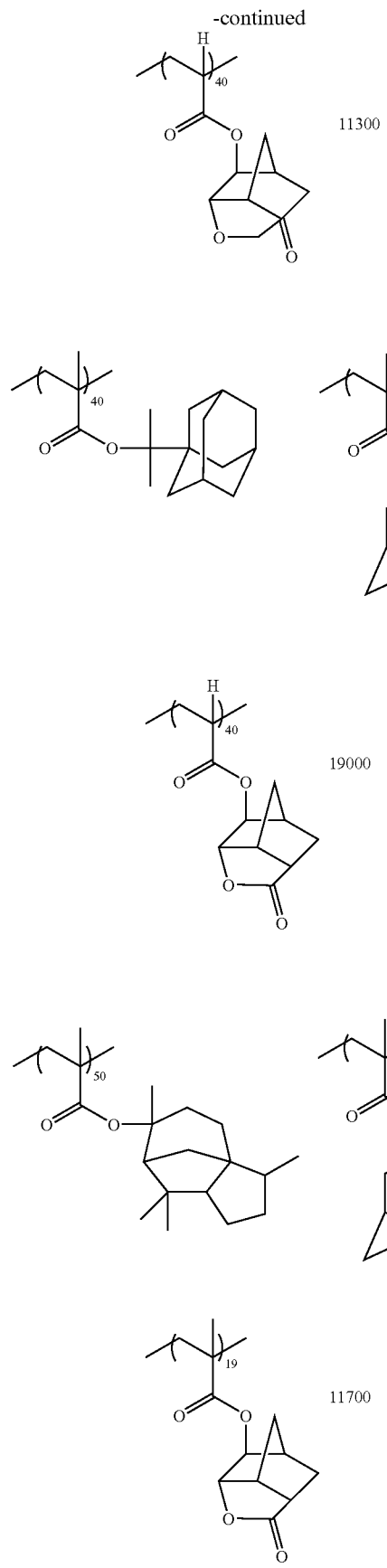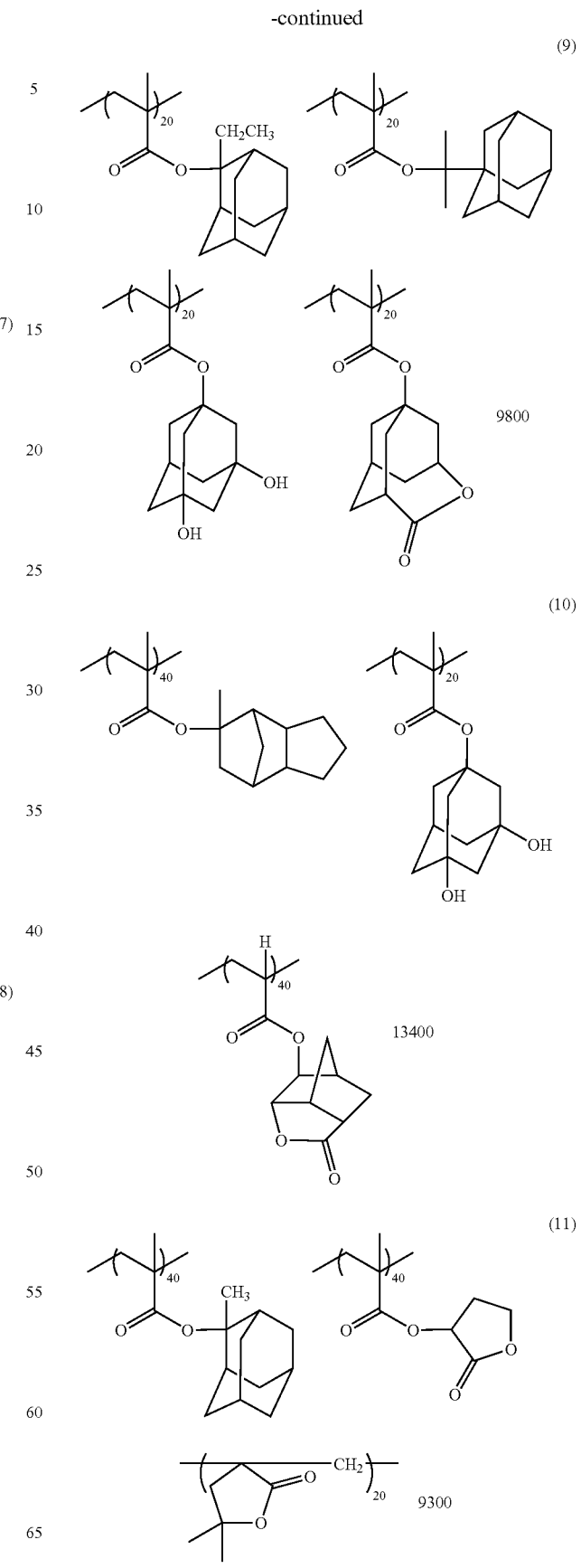

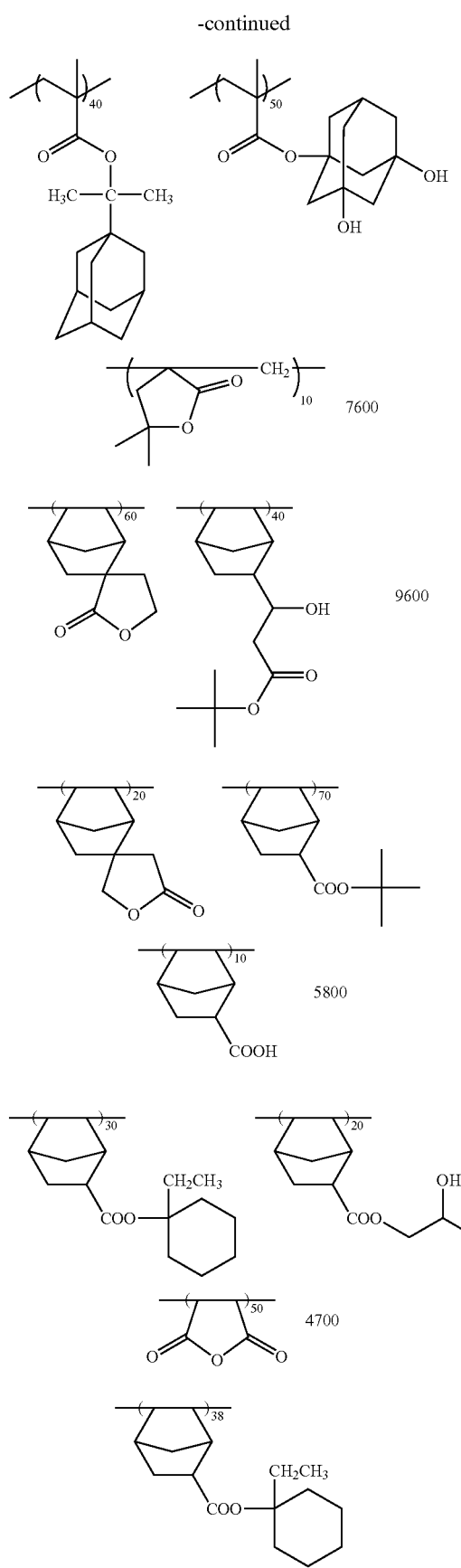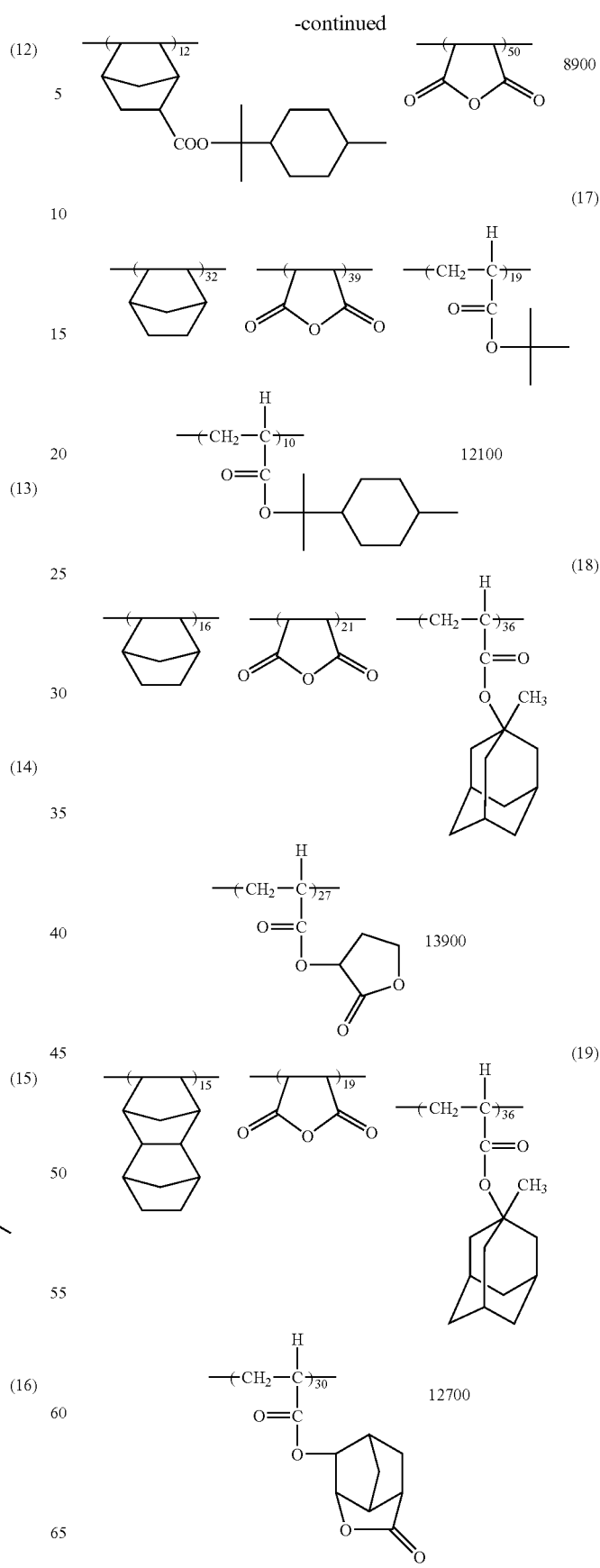

-continued

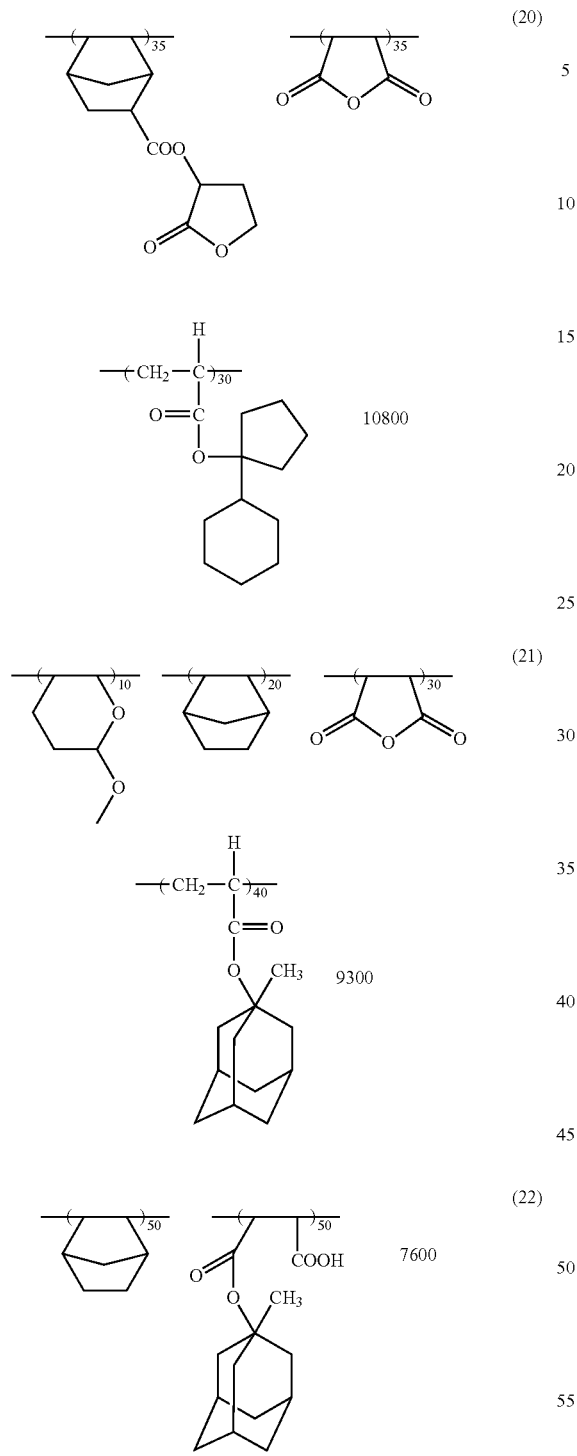

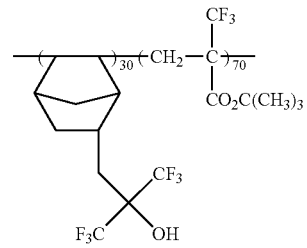
(FII-1)

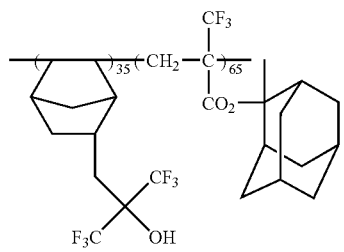
(FII-2)

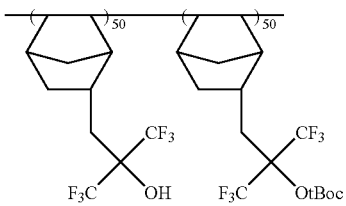
(FII-3)

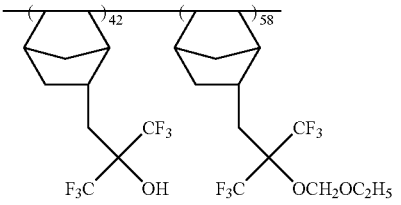
(FII-4)

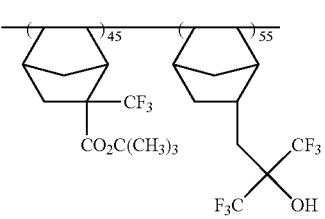
(FII-5)

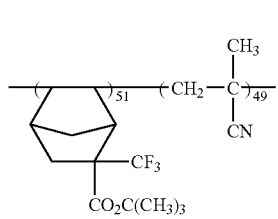
(FII-6)

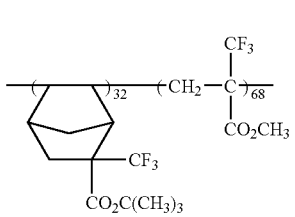
(FII-7)

The structure of the fluorine-containing resins (FII-1) to (FII-40) used in Examples are shown below. In Table 1 are shown the weight average molecular weight (Mw), molecular weight distribution (Mw/Mn), and oligomer (molecular weight (M) <1000) content of resins (FII-1) to (FII-26). In Table 2 are shown the weight average molecular weight (Mw) and molecular weight distribution (Mw/Mn) of resins (FII-27) to (FII-40).

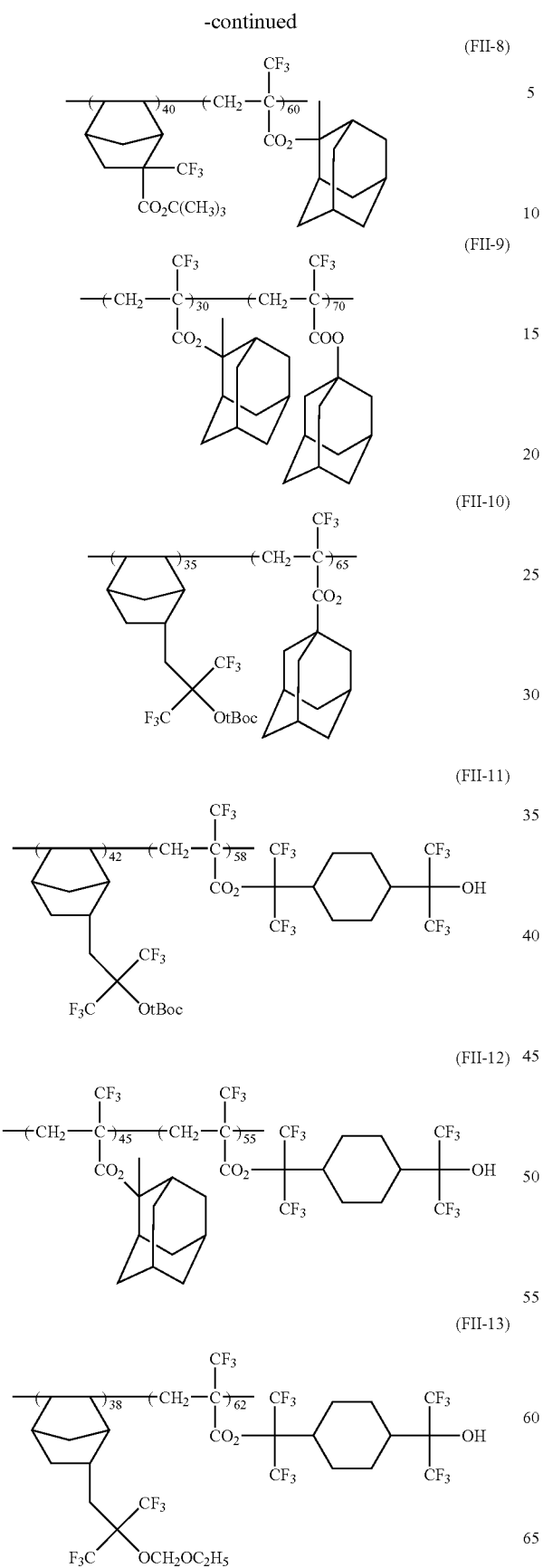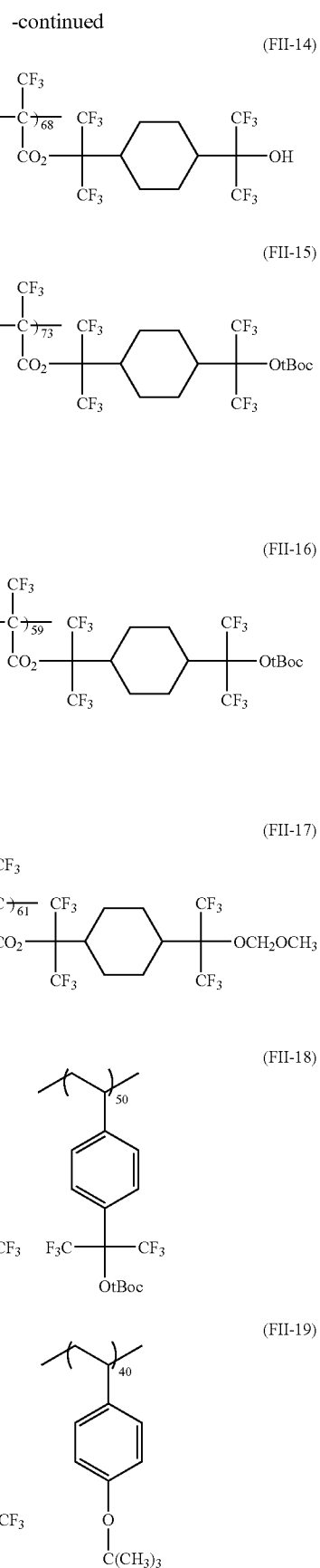

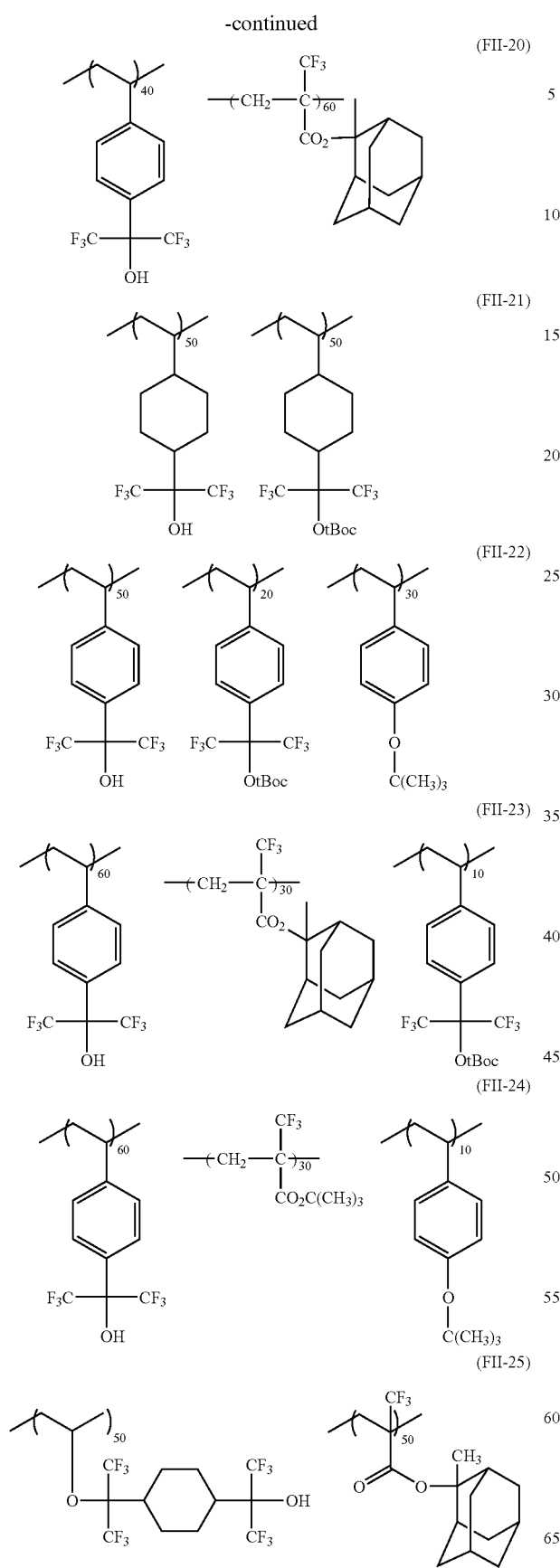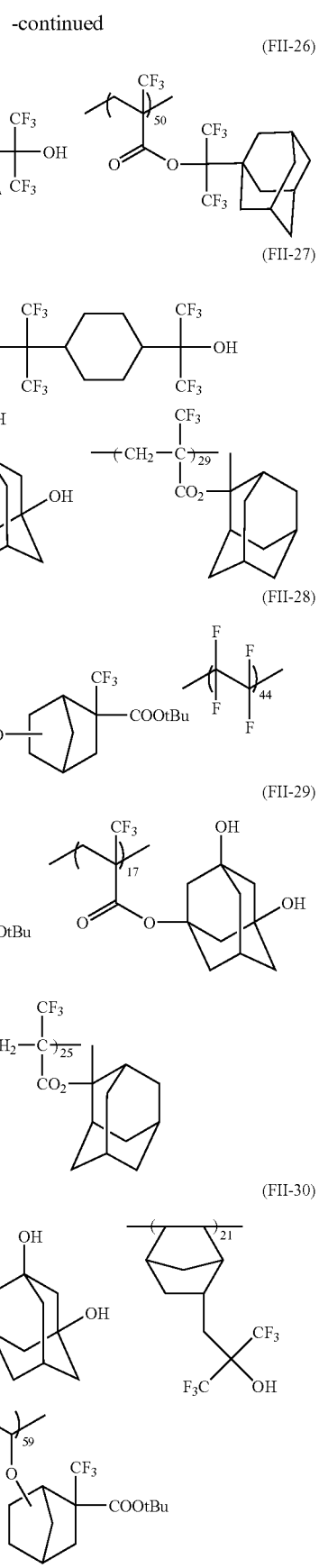

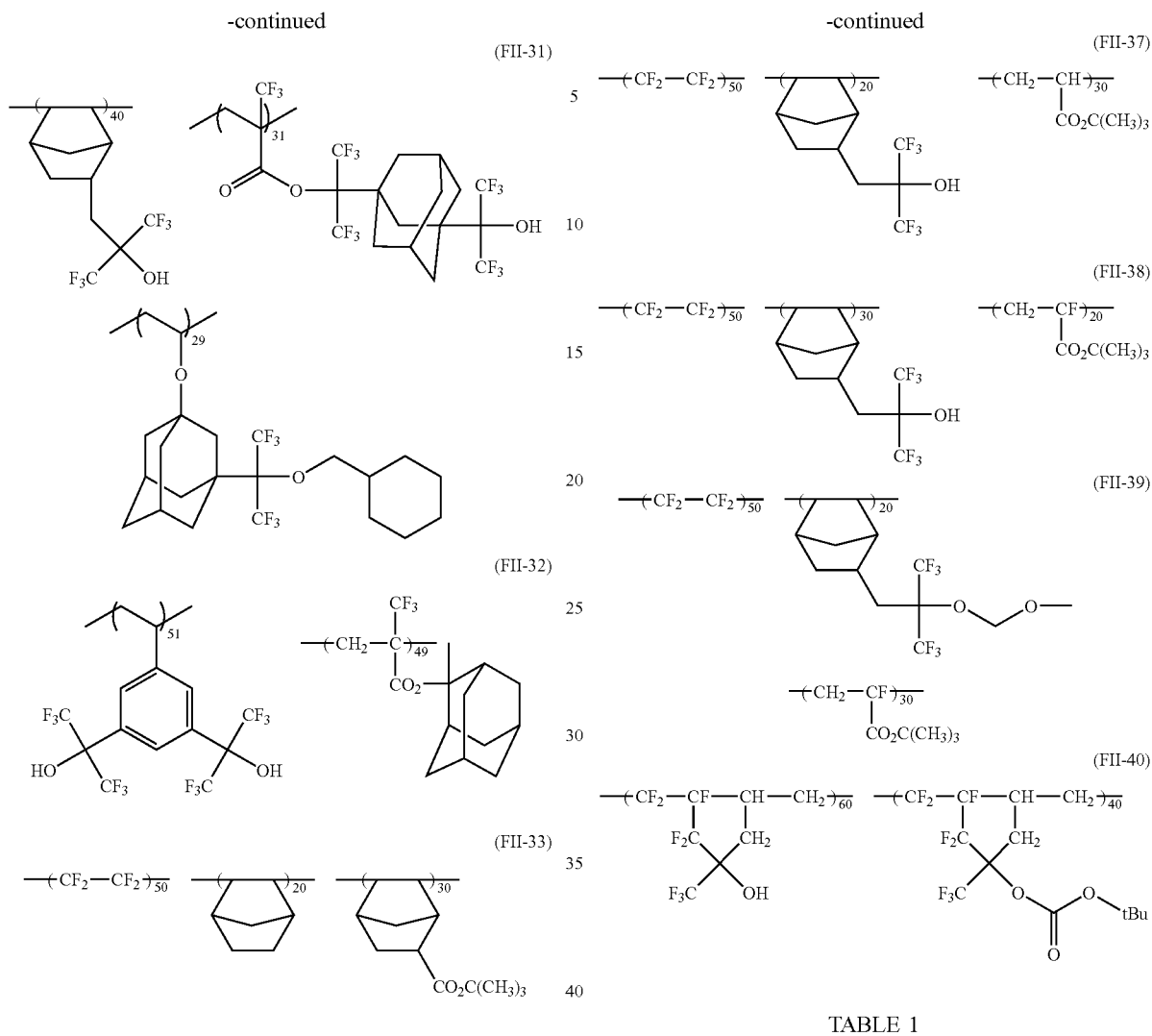
| Resin | Mw | Mw/Mn | Content of Oligomer (M < 1000) (%) |
|---|---|---|---|
| (FII-1) | 15200 | 1.45 | 5 |
| (FII-2) | 24000 | 1.75 | 8 |
| (FII-3) | 18200 | 1.85 | 7 |
| (FII-4) | 16500 | 1.46 | 6 |
| (FII-5) | 9500 | 1.58 | 8 |
| (FII-6) | 19500 | 2.02 | 8 |
| (FII-7) | 6500 | 1.85 | 7 |
| (FII-8) | 28400 | 1.68 | 9 |
| (FII-9) | 28600 | 1.44 | 5 |
| (FII-10) | 12800 | 1.65 | 8 |
| (FII-11) | 16800 | 1.68 | 9 |
| (FII-12) | 28400 | 1.58 | 6 |
| (FII-13) | 19800 | 1.69 | 8 |
| (FII-14) | 8700 | 1.95 | 8 |
| (FII-15) | 15200 | 1.46 | 7 |
| (FII-16) | 19500 | 1.65 | 4 |
| (FII-17) | 16900 | 1.42 | 8 |
| (FII-18) | 15900 | 1.85 | 9 |
| (FII-19) | 15000 | 1.55 | 4 |
| (FII-20) | 12500 | 1.88 | 8 |
| (FII-21) | 25000 | 1.68 | 9 |
| (FII-22) | 16000 | 1.54 | 7 |
| (FII-23) | 14600 | 1.95 | 5 |
| (FII-24) | 17500 | 1.48 | 5 |
| (FII-25) | 16500 | 1.52 | 6 |
| (FII-26) | 14600 | 1.63 | 5 |

TABLE 2

| Resin | Mw | Mw/Mn |
|---|---|---|
| (FII-27) | 8300 | 1.55 |
| (FII-28) | 8300 | 1.62 |
| (FII-29) | 8000 | 1.52 |
| (FII-30) | 9200 | 1.71 |
| (FII-31) | 10200 | 1.47 |
| (FII-32) | 7900 | 1.35 |
| (FII-33) | 6800 | 1.60 |
| (FII-34) | 7400 | 1.59 |
| (FII-35) | 9300 | 1.70 |
| (FII-36) | 4800 | 1.55 |
| (FII-37) | 4700 | 1.51 |
| (FII-38) | 6400 | 1.69 |
| (FII-39) | 9600 | 1.70 |
| (FII-40) | 4600 | 1.68 |

Examples 1 to 20 and Comparative Examples 1 and 2

Preparation of Resist:

Components shown in Table 3 (abbreviations used in Table 3 are listed below the table) were dissolved in the solvent shown in Table 3 to prepare a solution having a solids content of 12%, which was filtered through a polytetrafluoroethylene or polyethylene filter having a pore size of 0.1 μm to prepare a positive resist solution. The resulting positive resist solution was evaluated for sensitivity and profile according to the test method described later. The results obtained are shown in Table 4.

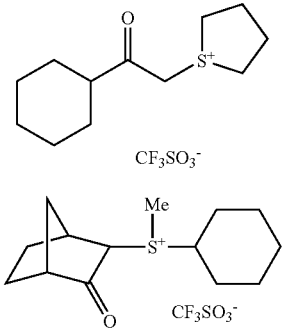

PAG-A

PAG-B

DBN: 1,5-diazabicycle[4.3.0]non-5-ene
TPI: 2,4,5-triphenylimidazole
TPSA: triphenylsulfonium acetate
HEP: N-hydroxyethylpiperidine
DIA: 2,6-diisopropylaniline
DCMA: dicyclohexylmethylamine
TPA: tripenylamine
TOA: tri-n-octylamine
HAP: hydroxyantipyrine
TBAH: tetrabutylammonium hydroxide
TMEA: tris(methoxyethoxyethyl)amine
PEA: N-phenyldiethanolamine
W-1: Megafac P176 (from Dainippon Ink & Chemicals Inc.; F-containing)

TABLE 3

| | Resin (B) | Compound (A) | Additional Acid Generator | Basic Compound (F) | Surfactant (G) (0.03 g) | Solvent (weight ratio) | Dissolution Inhibitor (C) |
|---|---|---|---|---|---|---|---|
| Example 1 | (2)/10 g | (I-2)/0.5 g | — | DBN/0.02 g | W-1 | A1 = 100 | — |
| Example 2 | (3)/10 g | (I-3)/0.5 g | — | TMEA/0.02 g | W-1 | A1 = 100 | — |
| Example 3 | (6)/10 g | (I-1)/0.4 g | — | TPSA/0.02 g | W-2 | A1 = 100 | — |
| Example 4 | (7)/10 g | (I-13)/0.1 g | (z38)/0.15 g + (z50)/0.2 g | HEP/0.01 g | W-2 | A3/B1 = 80/20 | — |
| Example 5 | (9)/10 g | (I-5)/0.3 g | (z27)/0.2 g | TOA/0.03 g | W-3 | A2/B1 = 90/10 | — |
| Example 6 | (11)/10 g | (I-17)/0.2 g | (z35)/0.2 g | TBAH/0.01 g | W-3 | A4/B1 = 90/10 | LCB/1 g |
| Example 7 | (13)/10 g | (I-20)/0.6 g | — | TPA/0.007 g | W-4 | A1/B1 = 50/50 | — |
| Example 8 | (14)/10 g | (I-13)/0.8 g | (z18)/0.15 g + (z49)/0.2 g | DBN/0.02 g | W-4 | A1/B1 = 90/10 | — |
| Example 9 | (15)/8 g + (8)/ 2 g | (I-34)/0.5 g | (z34)/0.1 g + (z52)/0.2 g | TPI/0.03 g | W-1 | A5/B2 = 90/10 | — |
| Example 10 | (18)/10 g | (I-8)/0.4 g | (z3)/0.2 g | TPI/0.02 g | W-1 | A1/B1 = 95/5 | — |
| Example 11 | (19)/10 g | (I-1)/0.5 g | (z18)/0.1 g + (z32)/0.2 g | DIA/0.02 g | W-2 | A1/B1 = 90/10 | — |
| Example 12 | (20)/10 g | (I-13)/0.5 g | (z38)/0.15 g | DIA/0.01 g HAP/0.01 g | w-2 | A1/B1 = 95/5 | — |
| Example 13 | (21)/10 g | (I-13)/0.1 g | (z14)/0.15 g + (z51)/0.2 g | TPI/0.03 g | W-3 | A1/B1 = 95/5 | — |
| Example 14 | (22)/10 g | (I-19)/0.2 g | (z38)/0.2 g + (z54)/0.1 g | DBN/0.02 g | W-3 | A1/B1 = 95/5 | — |
| Example 15 | (1)/5 g + (16)/5 g | (I-35)/0.2 g | (z2)/0.1 g + (z31)/0.1 g | DIA/0.02 g | W-4 | A1/B1 = 80/20 | — |
| Example 16 | (4)/5 g + (17)/5 g | (I-13)/0.2 g | (z6)/0.1 g + (z22)/0.1 g | TPA/0.01 g | W-4 | A1 = 100 | — |
| Example 17 | (5)/10 g | (I-10)/0.1 g | — | TPI/0.03 g | W-4 | A1 = 100 | — |
| Example 18 | (7)/7 g + (13)/3 g | (I-16)/0.5 g | (z44)/0.4 g | DCMA/0.01 g | W-4 | A1 = 100 | — |
| Example 19 | (10)/10 g | (I-31)/0.3 g | (z38)/0.15 g + (z40)/0.2 g | TPI/0.02 g | W-4 | A1/B1 = 95/5 | — |
| Example 20 | (12)/5 g + (6)/5 g | (I-15)/0.3 g | (z40)/0.3 g + (z42)/0.1 g | TPI/0.03 g | W-4 | A1/B1 = 95/5 | — |
| Comp. Example 1 | (2)/10 g | (PAG-A)/0.5 g | — | DBN/0.02 g | W-1 | A1 = 100 | — |
| Comp. Example 2 | (2)/10 g | (PAG-B)/0.5 g | — | DBI/0.02 g | W-1 | A1 = 100 | — |

W-2: Megafac R08 (from Dainippon Ink &Chemicals Inc.; F- and Si-containing)
W-3: Polysiloxane polymer KP-341 (from Shin-Etsu Chemical Co., Ltd.; Si-containing)
W-4: Troy Sol S-366 (from Troy Chemical Industries, Inc.)
A1: propylene glycol methyl ether acetate
A2: 2-Heptanone
A3: ethyl ethoxypropionate
A4: γ-butyrolactone
A5: cyclohexanone
B1: propylene glycol methyl ether
B2: ethyl lactate
LCB: t-butyl lithocolate Evaluation:

DUV-42 (anti-reflective coating available from Brewer Science) was uniformly applied to a hexamethyldisilazane-treated silicon substrate with a spin coater to a thickness of 600 Å, dried on a hot plate at 100° C. for 90 seconds, and baked at 190° C. for 240 seconds. Each of the positive resist solution prepared in Examples and Comparative Examples was applied thereon with a spin coater and dried at 120° C. for 90 seconds to form a resist film having a thickness of 0.30 μm.

The resist film was exposed to an ArF excimer laser stepper (NA=0.6; available from ISI) through a mask having a line and space pattern and immediately thereafter baked on a hot plate at 120° C. for 90 seconds. The resist film was developed with a 2.38% aqueous solution of tetramethylammonium hydroxide at 23° C. for 60 seconds, rinsed with pure water for 30 seconds, and dried to form a line pattern on the silicon substrate.

(1) Sensitivity

The sensitivity of the resist was expressed in terms of minimum exposure dose required for reproducing a 0.15 μm width 1:1 line-and-space pattern.

(2) Profile

The resist profile of the 0.15 μm width 1:1 line-and-space pattern was observed under a scanning electron microscope. A rectangular profile was rated A. A slightly tapered or footing profile was rated B. A badly tapered or footing profile was rated C.

TABLE 4

| | Sensitivity (mJ/cm$^2$) | Profile |
|---|---|---|
| Example 1 | 21 | A |
| Example 2 | 23 | A |
| Example 3 | 16 | A |
| Example 4 | 19 | A |
| Example 5 | 25 | A |
| Example 6 | 19 | A |
| Example 7 | 20 | A |
| Example 8 | 22 | A |
| Example 9 | 17 | A |
| Example 10 | 19 | A |
| Example 11 | 23 | A |
| Example 12 | 15 | A |
| Example 13 | 17 | A |
| Example 14 | 25 | A |
| Example 15 | 20 | A |
| Example 16 | 23 | A |
| Example 17 | 15 | A |
| Example 18 | 24 | A |
| Example 19 | 21 | A |
| Example 20 | 19 | A |
| Camp. Example 1 | 27 | B |
| Camp. Example 2 | 15 | C |

The results in Table 4 clearly prove that the positive resist compositions of Examples 1 to 20 are capable of forming a resist pattern with an excellent profile at high sensitivity.

Examples 21 to 40 and Comparative Examples 3 and 4

Resist Preparation:

The components shown in Table 5 were dissolved in the solvent shown, and the solution was filtered through a polytetrafluoroethylene filter having a pore size of 0.1 μm to prepare a positive resist solution having a solids concentration of 10%.

Evaluation:

Each of the positive resist solutions of Examples 21 to 40 and Comparative Examples 3 and 4 was applied to a hexamethyldisilazane-treated silicon wafer with a spin coater, dried on a vacuum contact type hot plate at 120° C. for 90 seconds to form a resist film having a thickness of 0.1 μm.

The resist film was exposed, baked, and developed by using VUVES-4500 (an exposure system for evaluating $F_2$ excimer laser photoresist, supplied by Litho Tech Japan Corp.). The post-exposure bake was carried on a hot plate at 120° C. for 90 seconds. Development was conducted with a 2.38% aqueous solution of tetramethylammonium hydroxide for 60 seconds. After development, the wafer was rinsed with pure water. An exposure dose required for resolving a large pattern (1 cm×1 cm) (sensitivity) was obtained. The results are shown in Table 6.

TABLE 5

| | Resin (B) | Compound (A) | Additional Acid Generator | Basic Compound (F) | (G) (0.03 g) | Solvent (weight ratio) | (C) |
|---|---|---|---|---|---|---|---|
| Example 21 | FII-1/10 g | (I-2)/0.5 g | — | DBN/0.02 g | W-1 | A1 = 100 | — |
| Example 22 | FII-2/10 g | (I-3)/0.5 g | — | TMEK/0.02 g | W-1 | A1 = 100 | — |
| Example 23 | FII-8/8 g + FII-33/2 g | (I-1)/0.4 g | — | TPSA/0.02 g | W-2 | A1 = 100 | — |
| Example 24 | FII-11/4 g + FII-34/6 g | (I-13)/0.1 g | (z38)/0.15 g + (z50)/0.2 g | HEP/0.01 g | W-2 | A3/B1 = 80/20 | — |
| Example 25 | FII-12/3 g + FII-35/7 g | (I-5)/0.3 g | (z27)/0.2 g | TOA/0.03 g | W-3 | A2/B1 = 90/10 | — |
| Example 26 | FII-13/10 g | (I-17)/0.2 g | (z35)/0.2 g | TBAH/0.01 g | W-3 | A4/B1 = 90/10 | LCB/1 g |
| Example 27 | FII-14/9 g + FII-39/1 g | (I-20)/0.6 g | — | TPA/0.007 g | W-4 | A1/B1 = 50/50 | — |

TABLE 5-continued

| | Resin (B) | Compound (A) | Additional Acid Generator | Basic Compound (F) | (G) (0.03 g) | Solvent (weight ratio) | (C) |
|---|---|---|---|---|---|---|---|
| Example 28 | FII-16/10 g | (I-13)/0.8 g | (z18)/0.15 g + (z49)/0.2 g | DBN/0.02 g | W-4 | A1/B1 = 90/10 | — |
| Example 29 | FII-18/5 g + FII-1/5 g | (I-34)/0.5 g | (z34)/0.1 g + (z52)/0.2 g | TPI/0.03 g | W-1 | A5/B2 = 90/10 | — |
| Example 30 | FII-20/5 g + FII-5/5 g | (I-8)/0.4 g | (z3)/0.2 g | TPI/0.02 g | W-1 | A1/B1 = 95/5 | — |
| Example 31 | FII-27/5 g + FII-32/5 g | (I-1)/0.5 g | (z18)/0.1 g + (z32)/0.2 g | DIA/0.02 g | W-2 | A1/B1 = 90/10 | — |
| Example 32 | FII-28/5 g + FII-27/5 g | (I-13)/0.5 g | (z38)/0.15 g | DIA/0.01 g + HAP/0.01 g | W-2 | A1/B1 = 95/5 | — |
| Example 33 | FII-29/8 g + FII-3/2 g | (I-13)/0.1 g | (z14)/0.15 g + (z51)/0.2 g | TPI/0.03 g | W-3 | A1/B1 = 95/5 | — |
| Example 34 | FII-30/5 g + FII-31/5 g | (I-19)/0.2 g | (z38)/0.2 g + (z54)/0.1 g | DIA/0.02 g | W-3 | A1/B1 = 95/5 | — |
| Example 35 | FII-38/10 g | (I-35)/0.2 g | (z2)/0.1 g + (z31)/0.1 g | DIA/0.02 g | W-4 | A1/B1 = 80/20 | — |
| Example 36 | FII-40/5 g + FII-1/5 g | (I-13)/0.2 g | (z6)/0.1 g + (z22)/0.1 g | TPA/0.01 g | W-4 | A1 = 100 | — |
| Example 37 | FII-19/3 g + FII-28/7 g | (I-10)/0.1 g | — | TPI/0.03 g | W-4 | A1 = 100 | — |
| Example 38 | FII-11/5 g + FII-3/5 g | (I-16)/0.5 g | (z44)/0.4 g | DCMA/0.01 g | W-4 | A1 = 100 | — |
| Example 39 | FII-32/4 g + FII-30/6 g | (I-31)/0.3 g | (z38)/0.15 g + (z40)/0.2 g | TPI/0.02 g | W-4 | A1/B1 = 95/5 | — |
| Example 40 | FII-5/7 g + FII-28/3 g | (I-15)/0.3 g | (z40)/0.3 g + (z42)/0.1 g | TPI/0.03 g | W-4 | A1/B1 = 95/5 | — |
| Comp. Example 3 | FII-1/10 g | (PAG-A)/0.5 g | — | DBN/0.02 g | W-1 | A1 = 100 | — |
| Comp. Example 4 | FII-1/10 g | (PAG-B)/0.5 g | — | DBN/0.02 g | W-1 | A1 = 100 | — |

(G) F- and/or Si-containing surfactant
(C) Dissolution inhibitor

TABLE 6

| | Sensitivity (mJ/cm$^2$) |
|---|---|
| Example 21 | 4 |
| Example 22 | 6 |
| Example 23 | 8 |
| Example 24 | 5 |
| Example 25 | 7 |
| Example 26 | 3 |
| Example 27 | 5 |
| Example 28 | 2 |
| Example 29 | 6 |
| Example 30 | 8 |
| Example 31 | 3 |
| Example 32 | 5 |
| Example 33 | 8 |
| Example 34 | 7 |
| Example 35 | 4 |
| Example 36 | 8 |
| Example 37 | 4 |
| Example 38 | 3 |
| Example 39 | 6 |
| Example 40 | 7 |
| Comp. Ex. 3 | 11 |
| Comp. Ex. 4 | 10 |

It is clearly seen from Table 6 that the positive resist compositions of Examples 21 to 40 are excellent in sensitivity.

While in Examples ArF excimer laser light and F$_2$ excimer laser light were used as active light, similar results were obtained when in using XrF excimer laser light and electron beams. It is considered that the stimulus sensitive composition of the present invention exerts the same effect when exposed to extreme ultraviolet light.

The present invention provides a stimulus sensitive composition capable of forming an excellent profile at high sensitivity.

This application is based on Japanese Patent application JP 2003-68447, filed Mar. 13, 2003, the entire content of which is hereby incorporated by reference, the same as if set forth at length.

What is claimed is:

1. A stimulus sensitive composition containing a compound capable of generating an acid or a radical on receipt of an external stimulus, the compound being represented by formula (I):

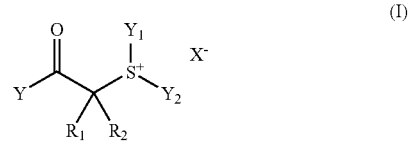

(I)

wherein $R_1$ and $R_2$ each independently represents a hydrogen atom, an alkyl group or an aryl group; $R_1$ and $R_2$ may be taken together to form a ring; $Y_1$ and $Y_2$ each independently represents an alkyl group or an aryl group; $Y_1$ and $Y_2$ may be taken together to form a ring; $X^-$ represents a non-nucleophilic anion; and Y represents an aliphatic group having a bridged cyclic structure selected from the group consisting of the following structures (1)–(22) and (24)–(46):

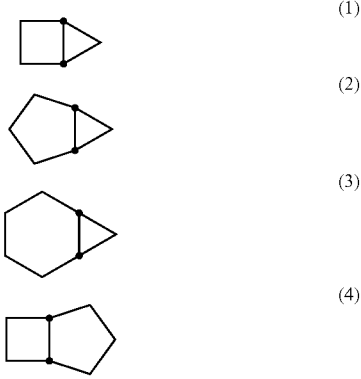

-continued
(5)
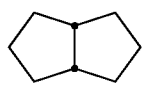
(6)
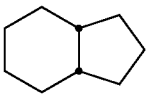
(7)
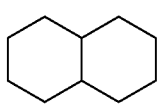
(8)
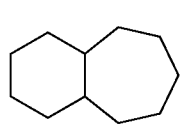
(9)
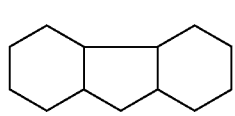
(10)
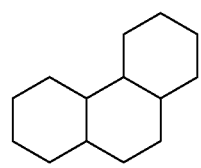
(11)
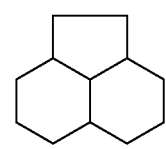
(12)
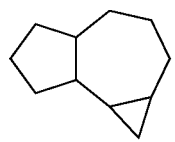
(13)
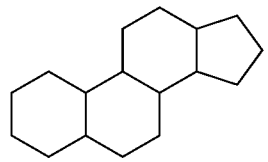
(14)
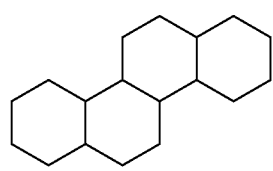
(15)
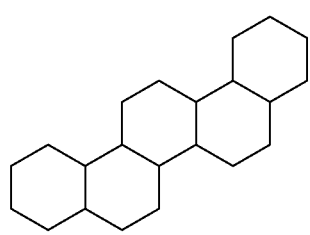
-continued
(16)
(17)
(18)
(19)
(20)
(21)
(22)
(24)
(25)
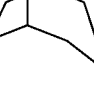
(26)
(27)
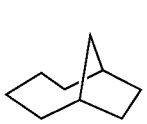
(28)
(29)

-continued

(30) 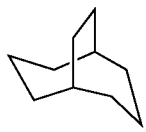

(31) 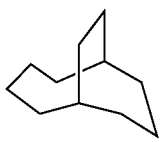

(33) 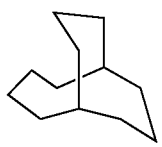

(34) 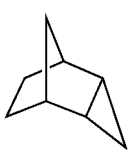

(35) 

(36) 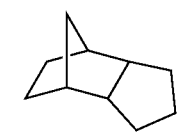

(37) 

(38) 

(39) 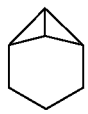

(40) 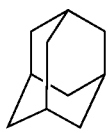

(41) 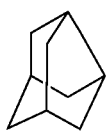

(42) 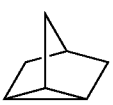

-continued

(43) 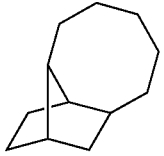

(44) 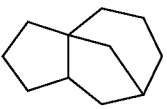

(45) 

(46) 

2. The stimulus sensitive composition according to claim 1, wherein Y is a group having an adamantane structure.

3. The stimulus sensitive composition according to claim 1, which is a positive stimulus sensitive composition containing:
(A) a compound represented by the formula (I) which is capable of generating an acid on being irradiated with active light rays or a radiation; and
(B) a resin decomposing by an action of an acid to increase its solubility in an alkaline developer.

4. The stimulus sensitive composition according to claim 3, wherein the resin (B) has a fluorine atom in a main chain or a side chain thereof.

5. The stimulus sensitive composition according to claim 3, wherein the resin (B) has a hexafluoro-2-propanol structure.

6. The stimulus sensitive composition according to claim 3, wherein the resin (B) has a hydroxystyrene structure.

7. The stimulus sensitive composition according to claim 3, wherein the resin (B) has a monocyclic or polycyclic alicyclic hydrocarbon structure.

8. The stimulus sensitive composition according to claim 7, wherein the resin (B) further has a repeating unit having a lactone structure.

9. The stimulus sensitive composition according to claim 3, further containing: (C) a dissolution inhibitor having a molecular weight of 3000 or less, the dissolution inhibitor decomposing by an action of an acid to increase its solubility in an alkaline developer.

10. The stimulus sensitive composition according to claim 1, which is a positive stimulus sensitive composition containing:
(A) a compound represented by the formula (I) which is capable of generating an acid on being irradiated with active light rays or a radiation;
(D) a resin soluble in an alkaline developer; and
(C) a dissolution inhibitor having a molecular weight of 3000 or less, the dissolution inhibitor decomposing by an action of an acid to increase its solubility in an alkaline developer.

11. The stimulus sensitive composition according to claim 1, further containing at least one of: (F) a basic compound; and (G) a surface active agent containing at least one of a fluorine atom and a silicon atom.

12. The stimulus sensitive composition according to claim 11, wherein the basic compound (F) is: a compound having a structure selected from an imidazole structure, a diazabicyclo structure, an onium hydroxide structure, an onium carboxylate structure, a trialkylamine structure, an aniline structure, and a pyridine structure; an alkylamine derivative having at least one of a hydroxyl group and an ether bond; or an aniline derivative having at least one of a hydroxyl group and an ether bond.

13. A negative stimulus sensitive composition containing:
(A) a compound represented by the following formula (I) which is capable of generating an acid on being irradiated with active light rays or a radiation:

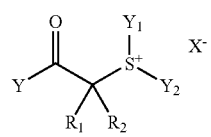

(I)

(D) a resin soluble in an alkaline developer; and
(E) a crosslinking agent capable of crosslinking with the resin (D) by an action of an acid;
wherein in formula (I), Y represents an aliphatic group having a bridged cyclic structure; $R_1$ and $R_2$ each independently represent a hydrogen atom, an alkyl group or an aryl group; $R_1$ and $R_2$ may be taken together to form a ring; $Y_1$ and $Y_2$ each independently represents an alkyl group or an aryl group; $Y_1$ and $Y_2$ may be taken together to form a ring; and $X^-$ represents a non-nucleophilic anion.

14. A compound represented by the following formula (I):

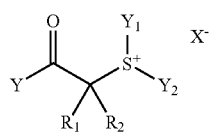

(I)

wherein $R_1$ and $R_2$ each independently represents a hydrogen atom, an alkyl group or an aryl group; $R_1$ and $R_2$ may be taken together to form a ring; $Y_1$ and $Y_2$ each independently represents an alkyl group or an aryl group; $Y_1$ and $Y_2$ may be taken together to form a ring; $X^-$ represents a non-nucleophilic anion; and Y represents an aliphatic group having a bridged cyclic structure selected from the group consisting of the following structures (1)–(22) and (24)–(46):

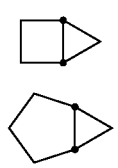

(1)

(2)

-continued

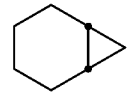 (3)

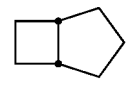 (4)

(5)

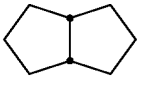 (6)

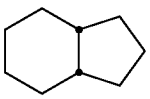 (7)

(8)

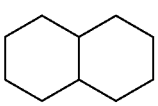 (9)

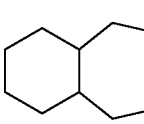 (10)

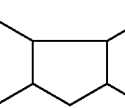 (11)

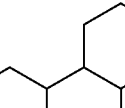 (12)

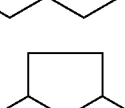 (13)

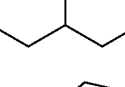 (14)

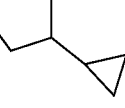

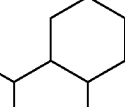

-continued
(15)
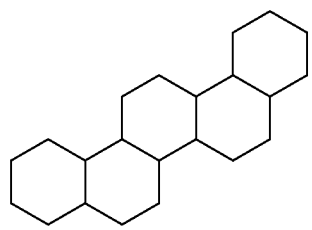
(16)
(17)
(18)
(19)
(20)
(21)
(22)
(24)
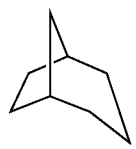
(25)
(26)
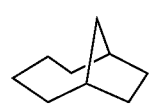
(27)
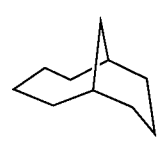
-continued
(28)
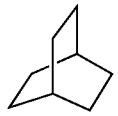
(29)
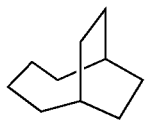
(30)
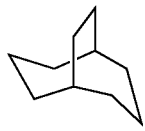
(31)
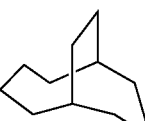
(33)
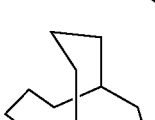
(34)
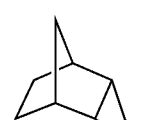
(35)
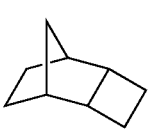
(36)
(37)
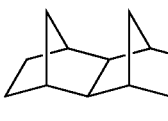
(38)
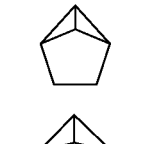
(39)
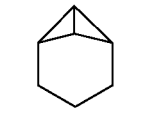
(40)
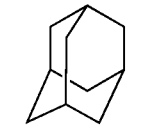

-continued
(41) 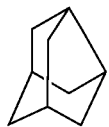
(42) 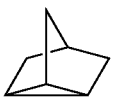
(43) 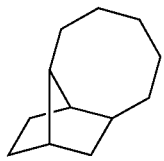
-continued
(44) 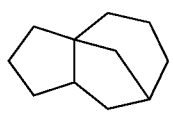
(45) 
(46) 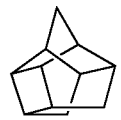
15. The compound according to claim 14, wherein Y is a group having an adamantane structure.
* * * * *